(12) United States Patent
Hsu et al.

(10) Patent No.: US 12,721,081 B2
(45) Date of Patent: Aug. 25, 2026

(54) SEMICONDUCTOR DEVICE AND METHOD

(71) Applicant: Taiwan Semiconductor Manufacturing Co., Ltd., Hsinchu (TW)

(72) Inventors: Yao-Wen Hsu, New Taipei (TW); Yun-Ting Chiang, Hsinchu (TW); Chun-Cheng Chou, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 377 days.

(21) Appl. No.: 18/463,510

(22) Filed: Sep. 8, 2023

(65) Prior Publication Data

US 2025/0089325 A1 Mar. 13, 2025

(51) Int. Cl.
*H10P 70/00* (2026.01)
*H10D 64/01* (2025.01)
(Continued)

(52) U.S. Cl.
CPC ............ *H10P 70/27* (2026.01); *H10D 64/01* (2025.01); *H10D 64/017* (2025.01);
(Continued)

(58) Field of Classification Search
CPC .... H10P 70/27; H10D 30/6729; H10D 64/01; H10D 64/017; H10D 64/251; H10D 64/62; H10D 84/0167; H10D 84/017; H10D 84/0179; H10D 84/038; H10D 84/852; H10D 30/797; H10D 64/0112; H10D 30/6735; H10D 30/6757; H10D 84/0188; H10D 62/151; H10D 62/822; B82Y 10/00; H01L 29/401; H01L 29/45; H01L 29/66439; H01L 29/66742; H01L 29/775;
(Continued)

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

FOREIGN PATENT DOCUMENTS

| | | | |
|---|---|---|---|
| TW | 202327093 | A | 7/2023 |
| TW | 202332063 | A | 8/2023 |
| TW | 202333301 | A | 8/2023 |

*Primary Examiner* — Earl N Taylor
(74) *Attorney, Agent, or Firm* — Slater Matsil, LLP

(57) ABSTRACT

A method includes forming a multi-layer stack over a semiconductor substrate, the multi-layer stack comprising a plurality of sacrificial layers that alternate with a plurality of channel layers, forming a dummy gate stack over a top surface and sidewalls of the multi-layer stack, forming first spacers on sidewalls of the dummy gate stack, growing an epitaxial source/drain region that extends through the plurality of sacrificial layers and the plurality of channel layers, forming a metal-semiconductor alloy region on first portions of the epitaxial source/drain region, forming a coating layer on the metal-semiconductor alloy region, wherein during the forming of the metal-semiconductor alloy region and the coating layer, a residual layer is formed on sidewalls of the first spacers, and performing a wet clean process to selectively etch the residual layer from the sidewalls of the first spacers.

20 Claims, 61 Drawing Sheets

(51) Int. Cl.

| | |
|---|---|
| ***H10D 64/23*** | (2025.01) |
| ***H10D 64/62*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ........... *H10D 64/251* (2025.01); *H10D 64/62* (2025.01); *H10D 84/0153* (2025.01); *H10D 84/0167* (2025.01); *H10D 84/017* (2025.01); *H10D 84/0179* (2025.01); *H10D 84/038* (2025.01); *H10D 84/852* (2025.01)

(58) Field of Classification Search

CPC ....... H01L 29/78696; H01L 21/823807; H01L 21/823814; H01L 21/82385; H01L 21/28518; H01L 21/02068; H01L 27/092

See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 11,233,134 | B2 | 1/2022 | Chu et al. | |
| 11,735,630 | B2 | 8/2023 | Bomberger et al. | |
| 2021/0272956 | A1 | 9/2021 | Wang et al. | |
| 2021/0320180 | A1* | 10/2021 | Chen | H10D 30/6219 |
| 2021/0376095 | A1* | 12/2021 | Chen | H10D 30/6219 |
| 2023/0207559 | A1 | 6/2023 | Cho et al. | |
| 2023/0231024 | A1 | 7/2023 | Shin et al. | |
| 2023/0260836 | A1 | 8/2023 | Chang et al. | |
| 2024/0332357 | A1* | 10/2024 | Yen | H10D 62/121 |

* cited by examiner

50N/50P
127
119
98
126
125
124
122
50
134
134
134
124
124
104
98
122
T2
T3
56B/88
106B
106A
106

50N/50P
106
97
50
T3
T4
78
54
78
54
78
T2
106
125
126
97
127

138
136
144
124
122
50P
50N
54
54
78
140
50
56B/88

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
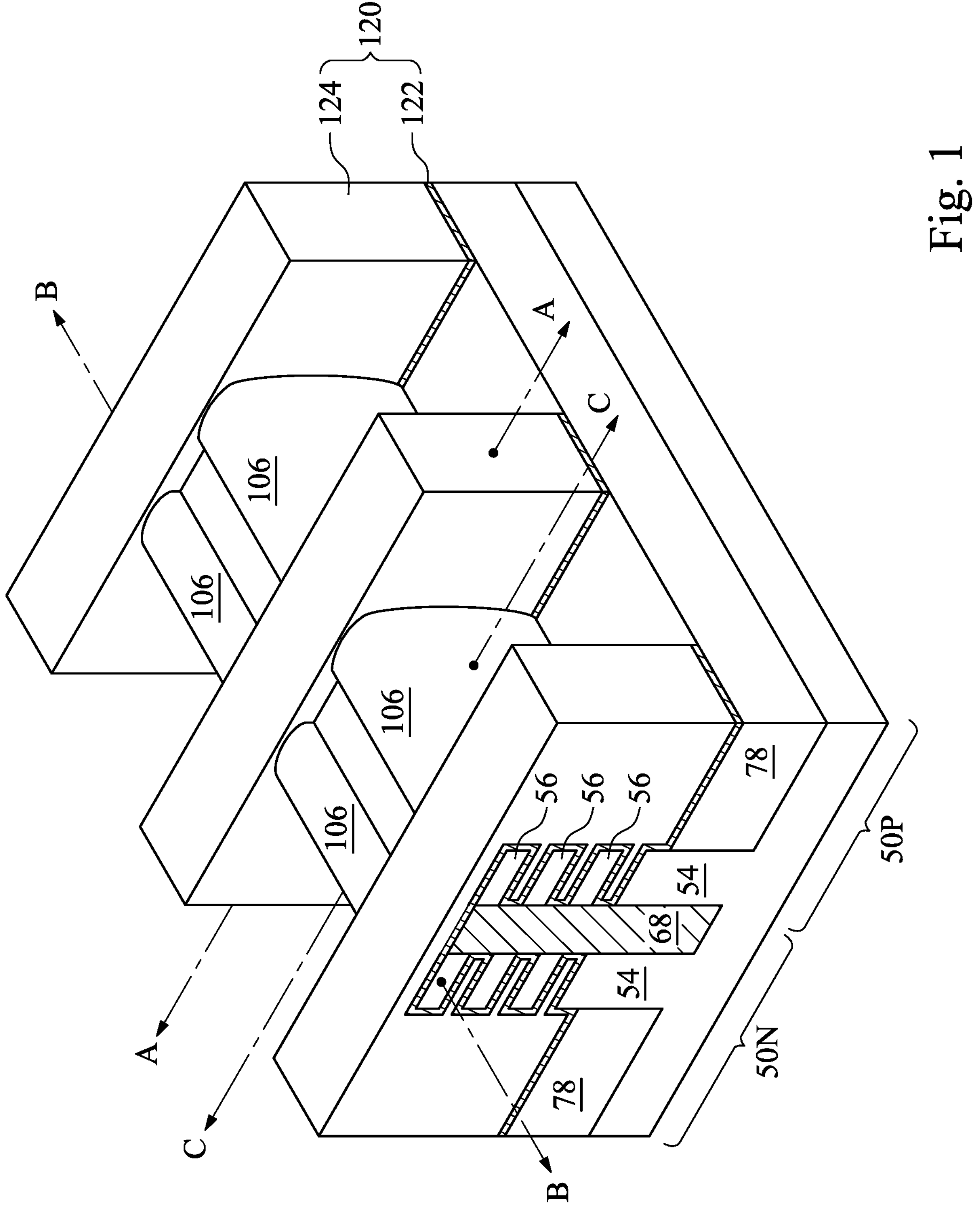
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having improved performance and methods of forming the same. The semiconductor devices may be nanostructure field-effect transistors (nano-FETs), which may be nanosheet field-effect transistors (NSFETs), nanowire field-effect transistors (NWFETs), gate-all-around field-effect transistors (GAAFETs), forksheet FETs, or the like. These embodiments provide methods applied to planarizing top surfaces of a gate stack and an adjacent inter-layer dielectric (ILD) layer, and removing the ILD to form first openings that expose top and side surfaces of underlying source/drain regions of a layer of nano-FETs. A plasma deposition process is then performed to form a titanium silicide (TiSi) layer and a titanium silicon nitride (TiSiN) layer sequentially over the exposed top and side surfaces of the source/drain regions. A wet etching process is then performed to selectively etch TiSiN and titanium nitride (TiN) formed during the plasma deposition process from surfaces of the gate stack and other structures, while leaving the TiSi layer and the TiSiN layer over the source/drain regions. The wet etching process is performed using sulfuric acid ($H_2SO_4$) as an etchant. Advantageous features of one or more embodiments disclosed herein may allow for an increase in the effective area of the TiSi/TiSiN double layer on the source/drain regions which is in contact with subsequently formed source/drain contacts. This results in decreased contact resistance between the source/drain contacts and the source/drain regions. As a result, there is more efficient current flow through the source/drain contacts, power dissipation at the source/drain contacts is minimized, and the output resistance (RO) is improved, allowing the semiconductor devices to drive or deliver power to a load without significant voltage or current loss. Further, the use of the wet etching process allows for the selective etching of the TiSiN and titanium nitride (TiN) formed during the plasma deposition process from surfaces of the gate stack and other structures (e.g., sidewalls of the first openings), while minimizing etch damage to the TiSi layer and the TiSiN layer over the source/drain regions. As a result, the source drain contacts can be subsequently formed with lower contact resistance, and having unhindered electrical contact with the source/drain regions, which further results in improved device performance and device yield.

FIG. 1 illustrates an example of simplified nano-FETs, in accordance with some embodiments. FIG. 1 is a cutaway three-dimensional view, where some features of the nano-FETs are omitted for illustration clarity. In the illustrated embodiment, the nano-FETs are forksheet FETs. However, the nano-FETs may also be nanosheet field-effect transistors (NSFETs), nanowire field-effect transistors (NWFETs), gate-all-around field-effect transistors (GAAFETs), or the like.

The nano-FETs include nanostructures 56 over a substrate 50, such as over semiconductor fins 54 extending from the substrate 50. The nanostructures 56 are semiconductor layers that act as channel regions for the nano-FETs. Isolation regions 78, such as shallow trench isolation (STI) regions, are disposed over the substrate 50 and adjacent to the semiconductor fins 54. Although the isolation regions 78 are described/illustrated as being separate from the substrate 50, as used herein, the term “substrate” may refer to the substrate 50 alone or a combination of the substrate 50 and the isolation regions 78. Additionally, although the semiconductor fins 54 are illustrated as single, continuous materials with the substrate 50, the semiconductor fins 54 and/or the substrate 50 may include a single material or multiple materials. In this context, the semiconductor fins 54 refer to the portion extending above and from between the neighboring isolation regions 78.

Gate structures 120 are wrapped around the nanostructures 56 and are disposed over the semiconductor fins 54. The gate structures 120 include gate dielectrics 122 and gate electrodes 124. The gate dielectrics 122 are along top surfaces, sidewalls, and bottom surfaces of the nanostructures 56 and may extend along sidewalls and/or over top surfaces of the semiconductor fins 54. The gate dielectric 122 may also extend along top surfaces of the isolation regions 78. The gate electrodes 124 are on the gate dielectrics 122. Epitaxial source/drain regions 106 are disposed on opposite sides of the gate structures 120. In embodiments where multiple transistors are formed, the epitaxial source/drain regions 106 may be shared between various transistors. One or more interlayer dielectric (ILD) layer(s) (discussed in greater detail below) are over the epitaxial source/drain regions 106 and/or the gate structures 120, through which contacts (discussed in greater detail below) to the epitaxial source/drain regions 106 and the gate electrodes 124 are formed.

The substrate 50 has a n-type region 50N and a p-type region 50P. The n-type region 50N includes n-type devices, such as NMOS transistors, e.g., n-type nano-FETs, and the p-type region 50P includes p-type devices, such as PMOS transistors, e.g., p-type nano-FETs. In the illustrated embodiment, the nano-FETs are forksheet FETs. In forksheet FETs, both n-type devices and p-type devices are integrated in a same forksheet structure. A dielectric wall 68 separates the semiconductor fin 54, the nanostructures 56 and the epitaxial source/drain regions 106 for a n-type device from the semiconductor fin 54, the nanostructures 56 and the epitaxial source/drain regions 106 for a p-type device. The gate structures 120 extend along three sides of each nanostructure 56. Forksheet FETs allow n-type devices and p-type devices to be formed close to one another, and allow the gate structures 120 for the devices to be physically and electrically coupled to one another, thereby reducing the amount of gate contacts used in a CMOS process.

FIG. 1 further illustrates reference cross-sections that are used in later figures. Cross-section A-A is along a longitudinal axis of a gate structure 120. Cross-section B-B is along a longitudinal axis of a nanostructure 56 and in a direction, for example, of current flow between the epitaxial source/drain regions 106. In addition, cross-section B-B is perpendicular to cross-section A-A. Cross-section C-C is parallel to cross-section A-A and extends through epitaxial source/drain regions 106. Subsequent figures refer to these reference cross-sections for clarity.

FIGS. 2 through 24C are cross-sectional views of intermediate stages in the manufacturing of semiconductor devices, in accordance with some embodiments. Specifically, the manufacturing of a device layer of nano-FETs is illustrated, the nano-FETs being described in the context of forksheet FETs. FIGS. 25A through 28D are cross-sectional views of intermediate stages in the manufacturing of semiconductor devices, in accordance with other embodiments. Specifically, the manufacturing of a device layer of nano-FETs is illustrated, the nano-FETs being described in the context of nanosheet field-effect transistors (NSFETs). FIGS. 2, 3, 4, 5, 6, 7, 8A, 9A, 10A, 11A, 12A, 13A, 14A, 15A, 16A, 17A, 18A, 19A, 20A, 21A, 22A, 23A, 24A, 25A, 26A, 27A and 28A are cross-sectional views illustrated along reference cross-section A-A in FIG. 1. FIGS. 8B, 9B, 10B, 11B, 12B, 13B, 14B, 15B, 16B, 17B, 18B, 19B, 20B, 21B, 22B, 23B, 24B, 25B, 26B, 27B and 28B are cross-sectional views illustrated along reference cross-section B-B in FIG. 1. FIGS. 9C, 10C, 16C, 17C, 18C, 19C, 21C, 22C, 23C, 24C, 25C, 25D, 26C, 26D, 27C, 27D, 28C and 28D are cross-sectional views illustrated along reference cross-section C-C in FIG. 1.

Figures 2, 3:
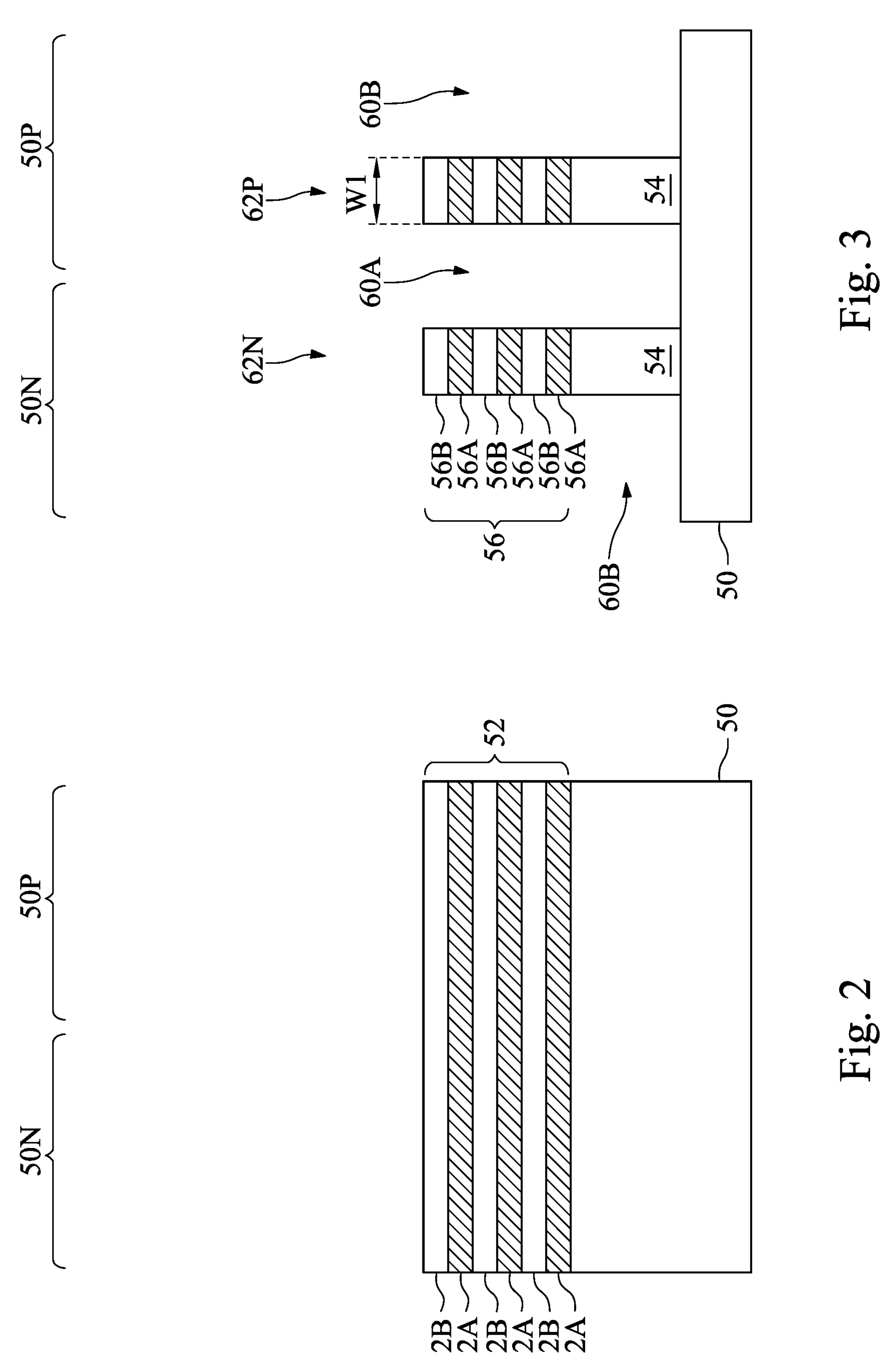
FIGS. 2 through 24C are cross-sectional views and a top-down view of intermediate stages in the manufacturing of semiconductor devices, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may (or may not) be physically separated (not separately illustrated) from the p-type region 50P, and any number of device features (e.g., other active devices, doped regions, isolation structures, etc.) may be disposed between the n-type region 50N and the p-type region 50P.

A multi-layer stack 52 is formed over the substrate 50. The multi-layer stack 52 includes alternating first semiconductor layers 52A and second semiconductor layers 52B. The first semiconductor layers 52A are formed of a first semiconductor material, and the second semiconductor layers 52B are formed of a second semiconductor material. The semiconductor materials may each be selected from the candidate semiconductor materials of the substrate 50.

In the illustrated embodiment, and as subsequently described in greater detail, the first semiconductor layers 52A (e.g., also referred to as sacrificial layers) will be removed and the second semiconductor layers 52B (e.g., also referred to as channel layers) will patterned to form channel regions for the nano-FETs in both the n-type region 50N and the p-type region 50P. In such embodiments, the channel regions in both the n-type region 50N and the p-type region 50P may have a same material composition (e.g., silicon or another semiconductor material) and be formed simultaneously. The first semiconductor layers 52A are dummy layers that will be removed in subsequent processing to expose the top surfaces and the bottom surfaces of the second semiconductor layers 52B. The first semiconductor material of the first semiconductor layers 52A is a material that has a high etching selectivity from the etching of the second semiconductor layers 52B, such as silicon germanium. The second semiconductor material of the second semiconductor layers 52B is a material suitable for both n-type and p-type devices, such as silicon.

In another embodiment (not separately illustrated), the first semiconductor layers 52A will be patterned to form channel regions for nano-FETs in one type of region (e.g., the p-type region 50P), and the second semiconductor layers 52B will be patterned to form channel regions for nano-FETs in another type of region (e.g., the n-type region 50N). The first semiconductor material of the first semiconductor layers 52A may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 52B may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 52A may be removed without significantly removing the second semiconductor layers 52B in the n-type region 50N, and the second semiconductor layers 52B may be removed without significantly removing the first semiconductor layers 52A in the p-type region 50P.

In the illustrated example, the multi-layer stack 52 includes three of the first semiconductor layers 52A and three of the second semiconductor layers 52B. It should be appreciated that the multi-layer stack 52 may include any number of the first semiconductor layers 52A and the second semiconductor layers 52B. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. In some embodiments, some layers of the multi-layer stack 52 are formed to be thinner than other layers of the multi-layer stack 52.

In FIG. 3, trenches 60A and 60B are etched in the substrate 50 and the multi-layer stack 52 to form fin structures 62 (e.g., fin structure 62N in the n-type region 50N and fin structure 62P in the p-type region 50P). The fin structures 62 each include a semiconductor fin 54 and nanostructures 56. The semiconductor fins 54 are semiconductor strips patterned in the substrate 50. The nanostructures 56 include the remaining portions of the multi-layer stack 52 on the semiconductor fins 54. Specifically, the nanostructures 56 include alternating first nanostructures 56A and second nanostructures 56B. The first nanostructures 56A and the second nanostructures 56B are formed of remaining portions of the first semiconductor layers 52A and the second semiconductor layers 52B, respectively. In the illustrated embodiment, the second nanostructures 56B are each disposed between two of the first nanostructures 56A. The etching may be any acceptable etch process, such as a reactive ion etch (RIE), neutral beam etch (NBE), the like, or a combination thereof, and may be performed using an etching mask having a pattern of the fin structures 62. The etching may be anisotropic.

The fin structures 62 may be patterned by any suitable method. For example, the fin structures 62 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 62.

Each of the fin structures 62 may have a width W1 that is in a range from 8 nm to 20 nm. The fin structures 62 in the n-type region 50N and the p-type region 50P are illustrated as having substantially equal widths for illustrative purposes. In some embodiments, the fin structures 62 in one region (e.g., the n-type region 50N) may be wider or narrower than the fin structures 62 in the other region (e.g., the p-type region 50P).

The fin structures 62 are formed in adjacent pairs. Each pair of the fin structures 62 will be used to form forksheet FETs. One fin structure 62N of each pair will be used to form a n-type device, and the other fin structure 62P of each pair will be used to form a p-type device. The fin structures 62N, 62P of each pair may be separated by a corresponding trench 60A. A dielectric wall (discussed in greater detail below) will be formed in the trench 60A between the fin structures 62N, 62P of each pair, thus providing electrical isolation between the nano-FETs of different types that will be formed in the fin structures 62N, 62P. Adjacent pairs (not shown in the figures) of the fin structures 62 are separated by corresponding trenches 60B. Each of the trenches 60B may have a width that is greater than a width of the trench 60A, such that adjacent pairs of fin structures 62 are spaced apart further than the fin structures 62N, 62P of each pair.

Figure 4:
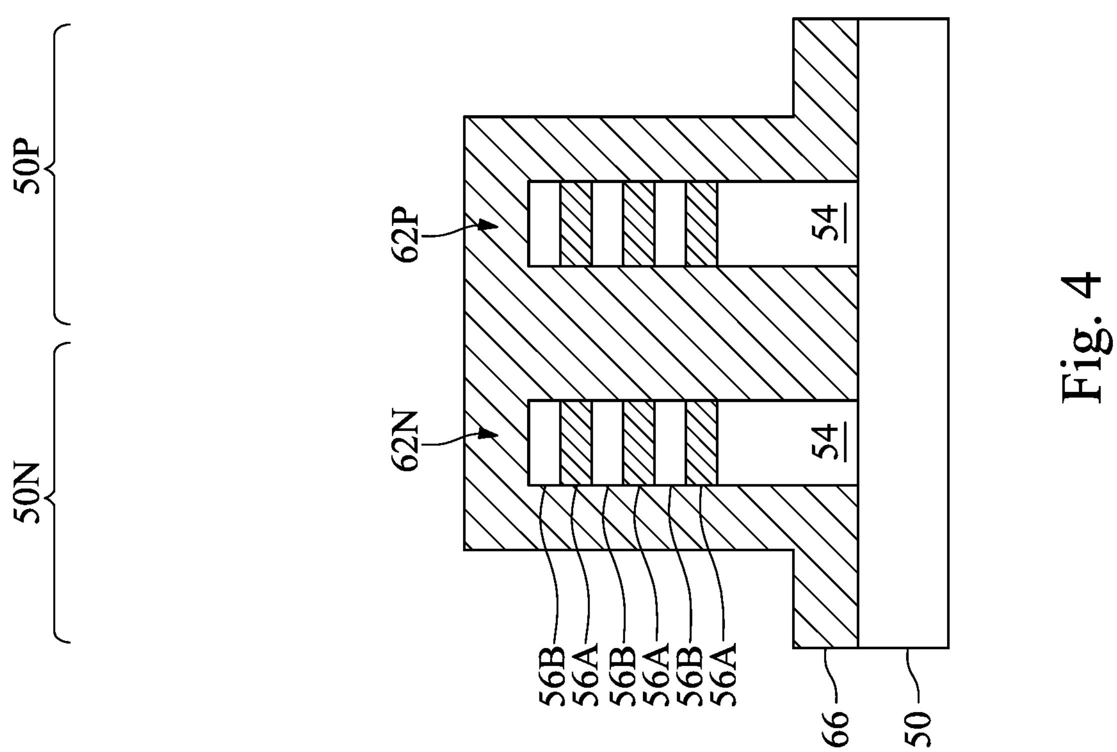

In FIG. 4, a dielectric layer 66 is then formed over the substrate 50 and the fin structures 62, and in the trenches 60A and 60B. For example, the dielectric layer 66 may be formed on sidewalls of each of the fin structures 62, and on bottom surfaces of the trenches 60A and 60B. The dielectric layer 66 may be formed of a low-k dielectric material such as silicon nitride, silicon carbonitride, or the like, which may be deposited by a conformal deposition process, such as atomic layer deposition (ALD), chemical vapor deposition (CVD), physical vapor deposition (PVD), or the like.

Because the trenches 60A, 60B have different widths, they are filled with different amount of dielectric material. Because the trenches 60A have a narrower width, they are completely filled (or overfilled) by the dielectric layer 66. However, because the trenches 60B have a larger width, they are not completely filled by the dielectric layer 66. In other words, after the dielectric layer 66 is deposited, the trenches 60A are filled (or overfilled) but some portions of the trenches 60B remain unfilled.

Figure 5:
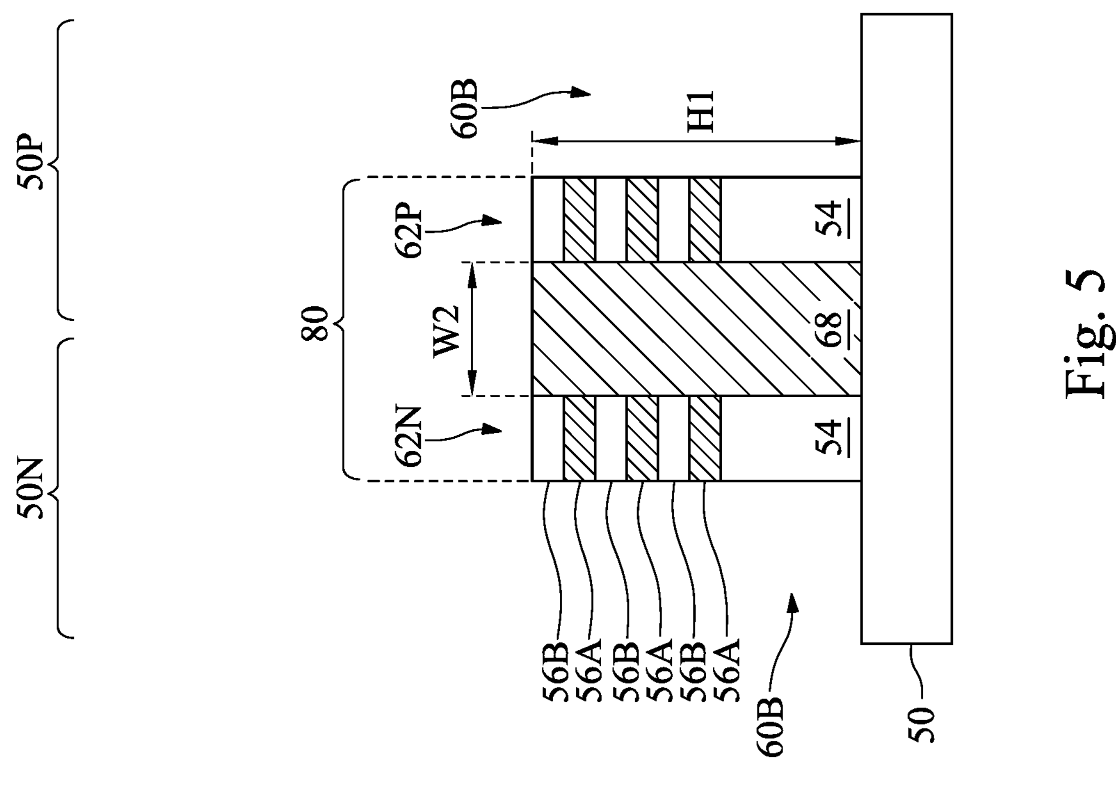

In FIG. 5, the dielectric layer 66 is etched back to remove some portions of the dielectric layer 66. Specifically, the portions of the dielectric layer 66 in the trenches 60B and over the fin structures 62 are removed by the etch back, thus reforming the trenches 60B. The dielectric layer 66 is etched back using acceptable etching techniques, such as with an etching process that is selective to the dielectric layer 66 (e.g., etches the material(s) of the dielectric layer 66 at a faster rate than the material(s) of the fin structures 62 and the substrate 50). After etch back is complete, the remaining portions of the dielectric layer 66 are in the trenches 60A. The remaining portions of the dielectric layer 66 form dielectric walls 68 separating the fin structures 62N, 62P of each pair of the fin structures 62. The dielectric walls 68 may partially or fully fill the trenches 60A. Each of the dielectric walls 68 may have a width W2 that is in a range from 5 nm to 20 nm. In an embodiment, each of the dielectric walls 68 may have a height H1 that is in a range from 50 nm to 200 nm. In an embodiment, each of the dielectric walls 68 may have a length L1 that is in a range from 10 nm to 80 nm, wherein the length L1 is along a longitudinal axis of the dielectric wall 68, and the longitudinal axis is perpendicular to an axis in which the width W2 is measured. After the dielectric layers 66 are formed and the etch back completed, forksheet structures 80 extend from the substrate 50. The forksheet structures 80 each include a dielectric wall 68 and a pair of fin structures 62, with the dielectric wall 68 disposed between the fin structures 62.

As noted above, although one n-type region 50N and one p-type region 50P are illustrated, the substrate 50 can include any desired quantity of such regions. Each forksheet structure 80 is disposed at the boundaries of a n-type region 50N and a p-type region 50P. Further, the fin structures 62N, 62P of each forksheet structure 80 may alternate. In other words, each n-type region 50N may include a first fin structure 62N from a first forksheet structure 80, and includes a second fin structure 62N from a second forksheet structure 80.

Figures 6, 7:
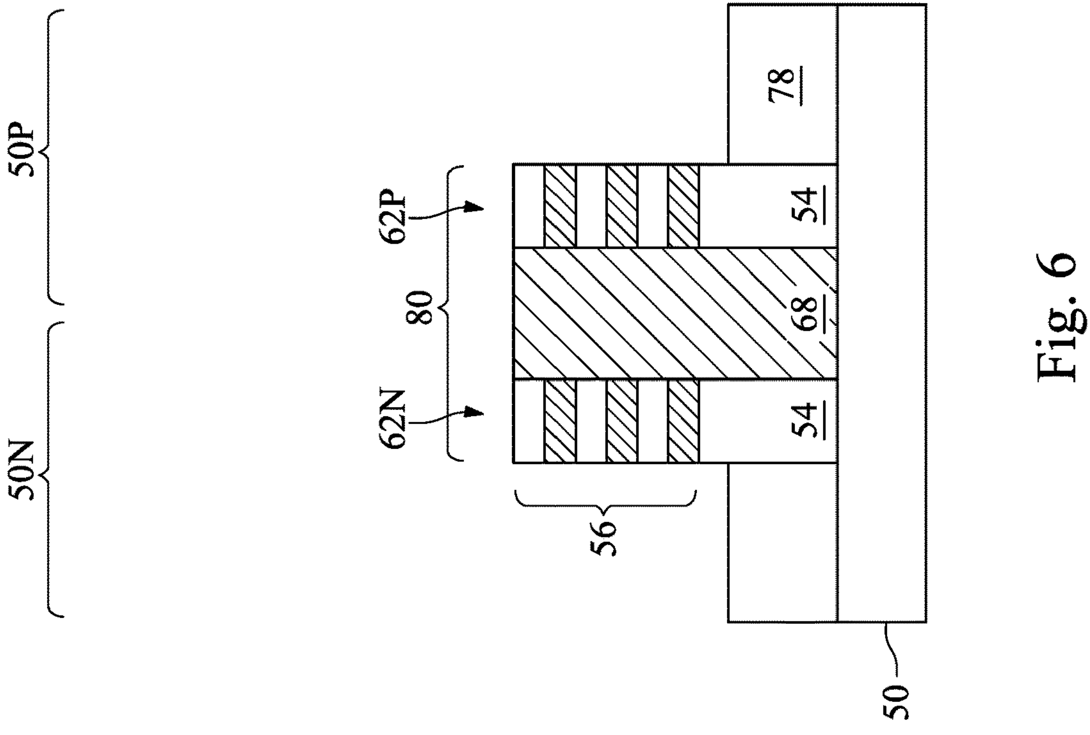

In FIG. 6, an insulation material is formed over the substrate 50, the fin structures 62, and the dielectric wall 68. The insulation material also fills the trenches 60B. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In some embodiments, the insulation material includes silicon oxide formed by an FCVD process. An annealing process may be performed once the insulation material is formed. Although the insulation material is illustrated as a single layer, some embodiments may utilize multiple layers. For example, in some embodiments a liner (not separately illustrated) may first be formed along top surfaces of the substrate 50, sidewalls and top surfaces of the fin structures 62, and a top surface of the dielectric wall 68. Thereafter, a fill material, such as one of the previously described insulation materials may be formed over the liner. The insulation material may be deposited over the fin structures 62 and the dielectric wall 68 such that excess insulation material covers the fin structures 62 and the dielectric wall 68.

The insulation material is then recessed to form isolation regions 78. The isolation regions 78 are adjacent to each forksheet structure 80. The insulation material is recessed such that upper portions of fin structures 62 and the dielectric wall 68 protrude from between neighboring isolation regions 78. For example, a portion of a semiconductor fin 54 and corresponding nanostructures 56 of each fin structure 62 are above the isolation regions 78. Further, the top surfaces of the isolation regions 78 may have a flat surface as illustrated, a convex surface, a concave surface (such as dishing), or a combination thereof. The top surfaces of the isolation regions 78 may be formed flat, convex, and/or concave by an appropriate etch. The isolation regions 78 may be recessed using an acceptable etching process, such as one that is selective to the material of the insulation material (e.g., etches the material of the insulation material at a faster rate than the materials of the fin structures 62 and the dielectric wall 68). The isolation regions 78 may also be referred to as shallow trench isolation (STI) regions subsequently.

The previously described process is just one example of how the semiconductor fins 54 and the nanostructures 56 may be formed. In some embodiments, the semiconductor fins 54 and the nanostructures 56 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 54 and the nanostructures 56. The epitaxial structures may include the previously described alternating semiconductor materials, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together. A removal process may be performed to remove some of the epitaxially grown materials from desired regions.

In FIG. 7, a dummy dielectric layer 72 is formed over the isolation regions 78, the fin structures 62, and the dielectric wall 68. For example, the dummy dielectric layer 72 may be formed on sidewalls of the semiconductor fins 54 and the nanostructures 56. The dummy dielectric layer 72 is also formed on a top surface of a topmost nanostructure 56 of each fin structure 62, as well as on top surfaces of the isolation regions 78, and a top surface of the dielectric wall 68. The dummy dielectric layer 72 may be formed of silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a chemical mechanical polish (CMP). The dummy gate layer 74 may be formed of a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The material of the dummy gate layer 74 may be deposited by CVD, physical vapor deposition (PVD), sputter deposition, or other techniques for depositing the selected material. The dummy gate layer 74 may be formed of other materials that have a high etching selectivity from the etching of insulation materials, e.g., the isolation regions 78 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the isolation regions 78, such that the dummy dielectric layer 72 extends between the dummy gate layer 74 and the isolation regions 78. In another embodiment, the dummy dielectric layer 72 covers only the fin structures 62.

Figure 8A:
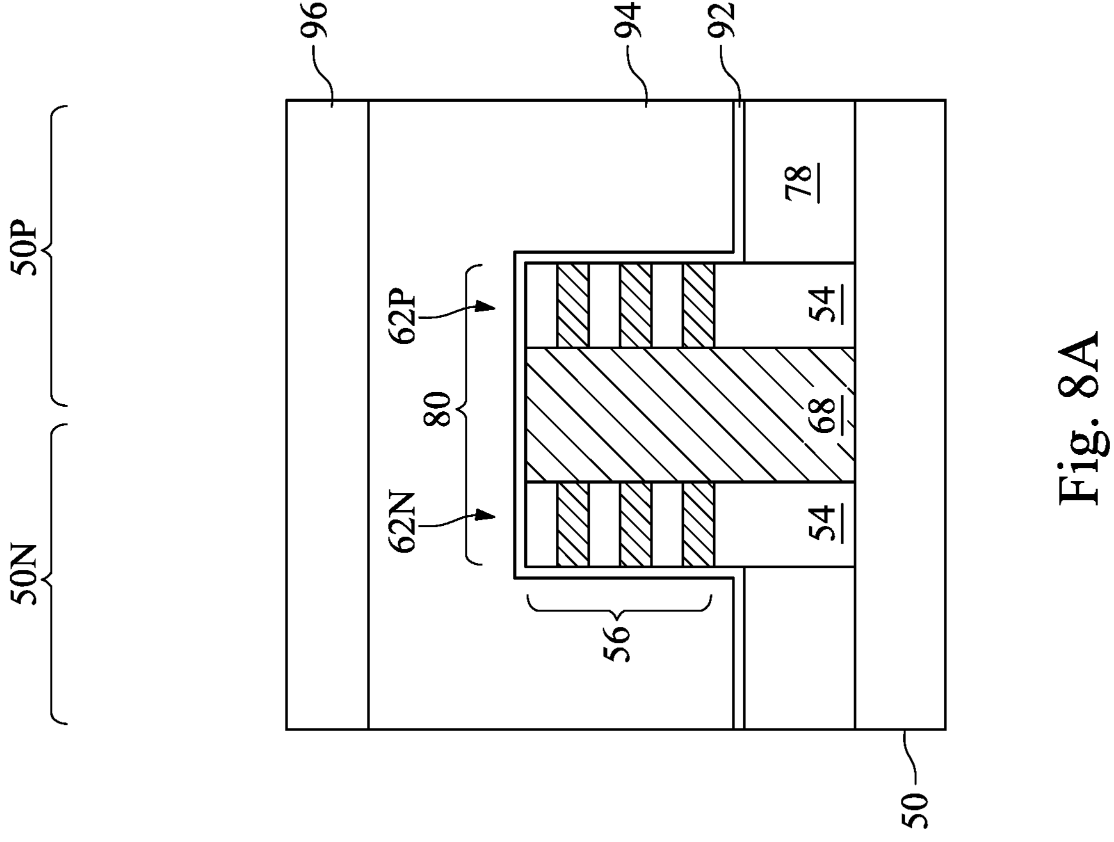
Figure 8B:
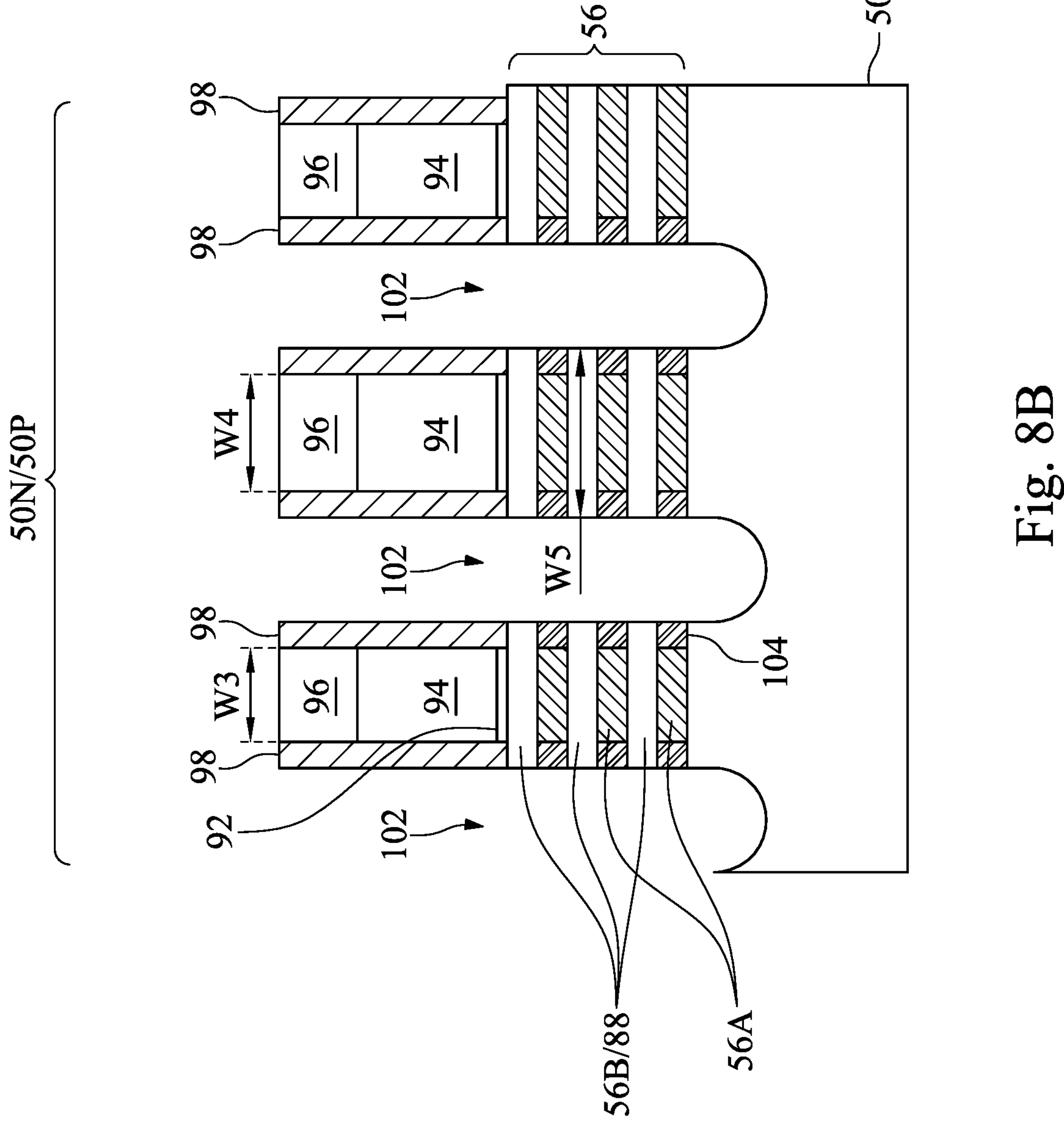

In FIGS. 8A-8B, the mask layer 76 is patterned using acceptable photolithography and etching techniques to form masks 96. FIG. 8A shows the n-type region 50N and the adjacent p-type region 50P, while FIG. 8B may show either the n-type region 50N or the p-type region 50P, unless specified. The pattern of the masks 96 is then transferred to the dummy gate layer 74 and to the dummy dielectric layer 72 to form dummy gates 94 and dummy dielectrics 92, respectively. The dummy gates 94 cover portions of the nanostructures 56 that will be exposed in subsequent processing to form channel regions. Specifically, the dummy gates 94 extend along the portions of the nanostructures 56 that will be used to form channel regions 88. The pattern of the masks 96 may be used to physically separate adjacent dummy gates 94. The dummy gates 94 may also have lengthwise directions substantially perpendicular (within process variations) to the lengthwise directions of the fin structures 62. The masks 96 can optionally be removed after patterning, such as by an acceptable etching technique. Each dummy gate 94 and its corresponding dummy dielectrics 92 form a dummy gate stack. Adjacent dummy gate stacks may have different widths. For example, as shown in FIG. 8B, a first dummy gate stack may have a width W3, and a second dummy gate stack that is adjacent to the first dummy gate stack may have a width W4, wherein the width W4 is larger than the width W3.

Gate spacers 98 are then formed over the fin structures 62, e.g., on exposed sidewalls of the masks 96, the dummy gates 94, and the dummy dielectrics 92. The gate spacers 98 may be formed by conformally forming an insulating material and subsequently etching the insulating material. The insulating material may be a low-k dielectric material such as silicon carbonitride, silicon nitride, silicon oxide, silicon oxycarbide, silicon oxycarbonitride, or the like. Acceptable deposition processes used to form the insulating material include atomic layer deposition (ALD), chemical vapor deposition (CVD), physical vapor deposition (PVD), or the like. The gate spacers 98 can be formed from a singled-layered insulating material or multiple layers of insulating materials. In some embodiments, the gate spacers 98 each include multiple layers of silicon oxycarbonitride, where each layer may have a different composition of silicon oxycarbonitride. In some embodiments, the gate spacers 98 each include a layer of silicon oxide disposed between two layers of silicon nitride. Other spacer structures may be formed. The etching of the insulating material may be anisotropic. For example, the etching process may be a dry etch such as RIE, NBE, or the like. After etching, the gate spacers 98 can have straight sidewalls or curved sidewalls.

Before the formation of the gate spacers 98, implants for lightly doped source/drain (LDD) regions may be performed. In the embodiments with different device types, a mask, such as a photoresist, may be formed over the n-type region 50N, while exposing the p-type region 50P, and appropriate type (e.g., p-type) impurities may be implanted into the fin structures 62 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the fin structures 62 exposed in the n-type region 50N. The mask may then be removed. The n-type impurities may be any of phosphorus, arsenic, antimony, or the like, and the p-type impurities may be any of boron, boron fluoride, indium, or the like. The lightly doped source/drain regions may have a concentration of impurities in the range of about $10^{15}$ $cm^{-3}$ to about $10^{19}$ $cm^{-3}$. An anneal may be used to repair implant damage and to activate the implanted impurities. During the implanting, the channel regions 88 remain covered by the dummy gates 94, so that the channel regions 88 remain substantially free from the impurity implanted in the LDD regions.

It is noted that the above disclosure generally describes a process of forming spacers and LDD regions. Other processes and sequences may be used. For example, fewer or additional spacers may be utilized, different sequence of steps may be utilized (e.g., additional spacers may be formed and removed, etc.), and/or the like. Furthermore, the n-type and p-type devices may be formed using a different structures and steps.

After the gate spacers 98 are formed, source/drain recesses 102 are then formed in the fin structures 62. In the illustrated embodiment, the source/drain recesses 102 extend through the nanostructures 56 to expose the semiconductor fins 54 and the isolation regions 78. The source/drain recesses 102 may also extend into the semiconductor fins 54. In other words, the source/drain recesses 102 can be formed only in the nanostructures 56 or can also be formed to extend into the semiconductor fins 54. In various embodiments, the source/drain recesses 102 in the fin structures 62 may extend to top surfaces of the semiconductor fins 54 without etching the semiconductor fins 54; the semiconductor fins 54 may be etched such that bottom surfaces of the source/drain recesses 102 in the fin structures 62 are disposed below the top surfaces of the isolation regions 78; or the like. The source/drain recesses 102 may be formed using an acceptable etching process, such as one that is selective to the fin structures 62 (e.g., selectively etches the material(s) of the semiconductor fins 54 and the nanostructures 56 at a faster rate than the material(s) of the dielectric wall 68). The dielectric wall 68 thus remains after the source/drain recesses 102 are formed. The gate spacers 98 and the masks 96 collectively mask portions of the fin structures 62 during the etching processes used to form the source/drain recesses 102. Timed etch processes may be used to stop the etching of the source/drain recesses 102 after the source/drain recesses 102 reach a desired depth. In an embodiment, after forming the source/drain recesses 102, channel regions 88 disposed between adjacent source/drain recesses 102 may have a width W5 that is in a range from 10 to 80 nm.

Inner spacers 104 are optionally formed on the sidewalls of the remaining portions of the first nanostructures 56A, e.g., those sidewalls expose by the source/drain recesses 102. As will be discussed in greater detail below, source/drain regions will be subsequently formed in the source/drain recesses 102, and the first nanostructures 56A will be subsequently replaced with corresponding gate structures. The inner spacers 104 act as isolation features between the subsequently formed source/drain regions and the subsequently formed gate structures. Further, the inner spacers 104 may be used to prevent damage to the subsequently formed source/drain regions by subsequent etching processes, such as etching processes used to subsequently form the gate structures.

As an example to form the inner spacers 104, the source/drain recesses 102 can be expanded. Specifically, portions of the sidewalls of the first nanostructures 56A exposed by the source/drain recesses 102 may be recessed. Although sidewalls of the first nanostructures 56A are illustrated as being straight, the sidewalls may be concave or convex. The sidewalls may be recessed by an acceptable etching process, such as one that is selective to the material of the first nanostructures 56A (e.g., selectively etches the material of the first nanostructures 56A at a faster rate than the material(s) of the second nanostructures 56B and the semiconductor fins 54). The etching may be isotropic. For example, when the semiconductor fins 54 and the second nanostructures 56B are formed of silicon and the first nanostructures 56A are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 102 and recess the sidewalls of the first nanostructures 56A. In some embodiments, the etching process used to recess the sidewalls can also trim (e.g., reduce the thicknesses of) the etched portions of the second nanostructures 56B. The inner spacers 104 can then be formed by conformally forming an insulating material and subsequently etching the insulating material. The insulating material may be a low-k dielectric material such as silicon carbonitride, silicon oxide, silicon oxycarbide, silicon oxycarbonitride, or the like. Acceptable deposition processes used to form the insulating material include atomic layer deposition (ALD), chemical vapor deposition (CVD), physical vapor deposition (PVD), or the like. The etching of the insulating material may be anisotropic. For example, the etching process may be a dry etch such as RIE, NBE, or the like. Although outer sidewalls of the inner spacers 104 are illustrated as being flush with the sidewalls of the gate spacers 98, the outer sidewalls of the inner spacers 104 may extend beyond or be recessed with respect to the sidewalls of the gate spacers 98. In other words, the inner spacers 104 may partially fill, completely fill, or overfill the sidewall recesses. Moreover, although the sidewalls of the inner spacers 104 are illustrated as being straight, the sidewalls of the inner spacers 104 may be concave or convex.

Figure 9A:
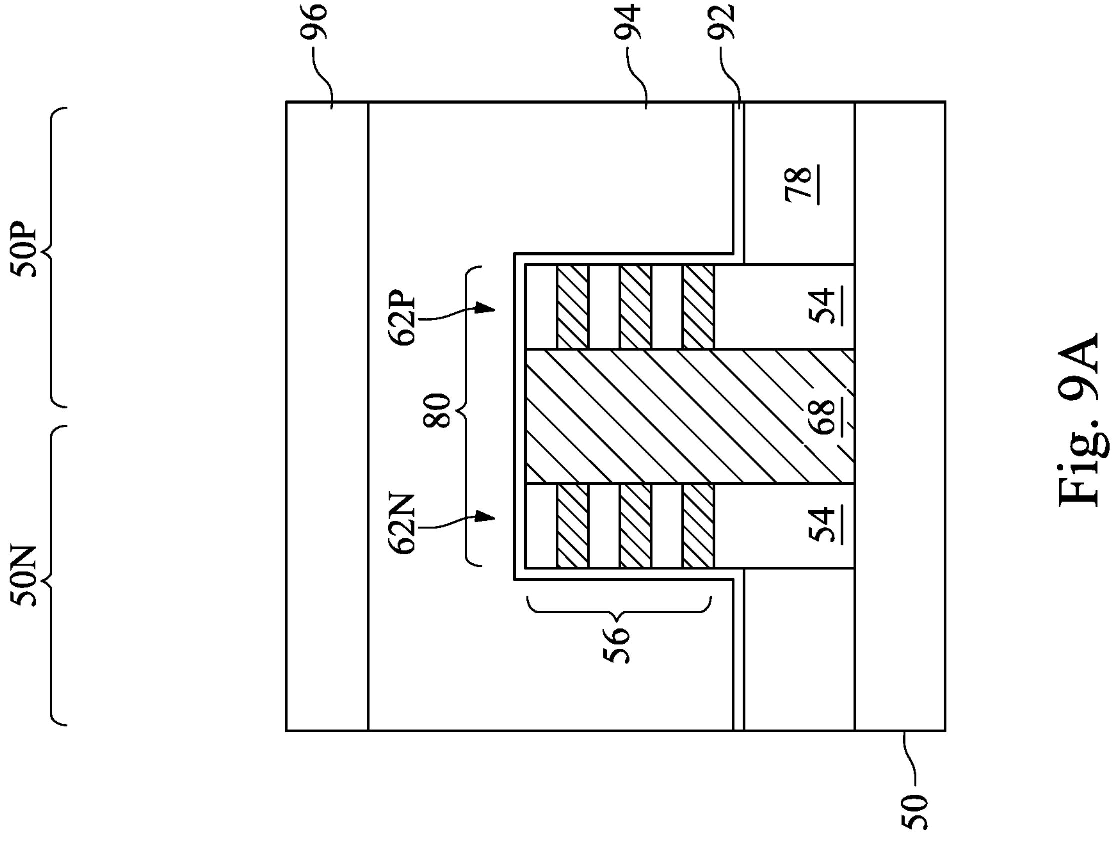
Figure 9B:
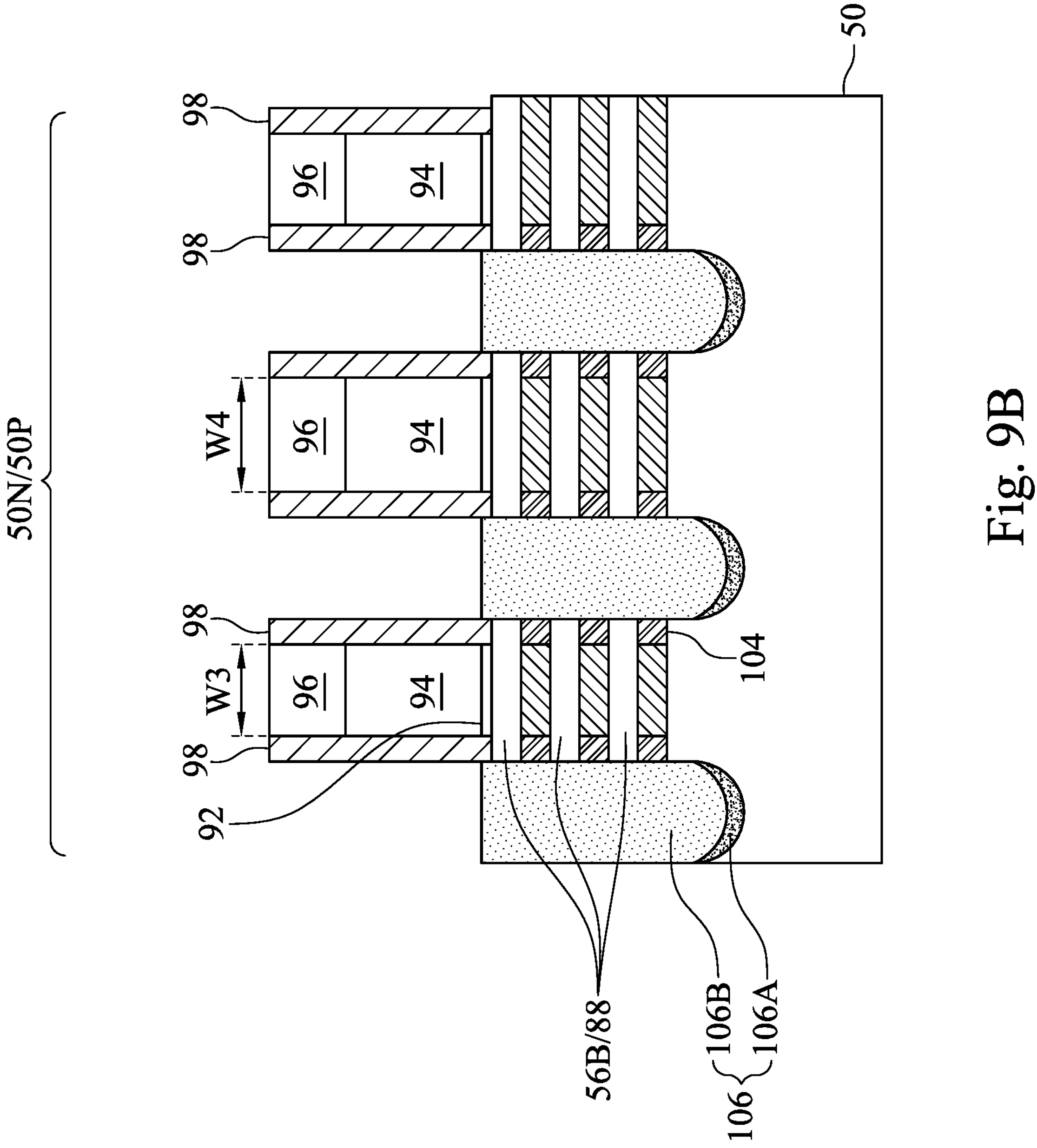
Figure 9C:
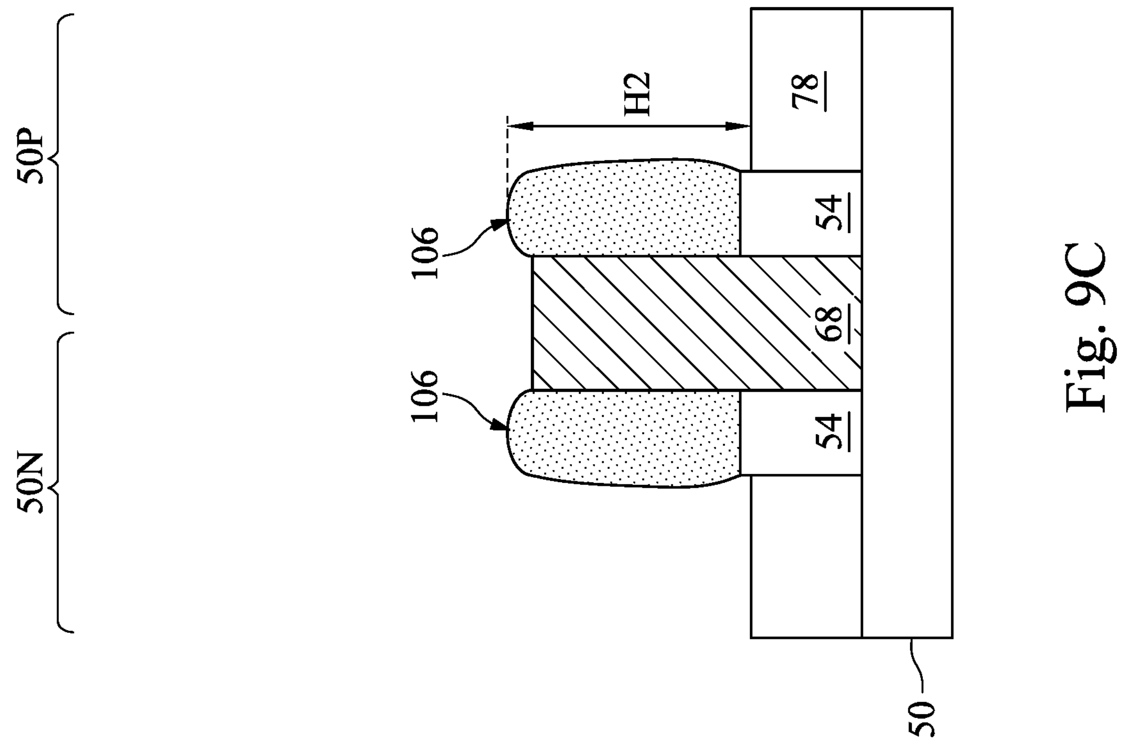

In FIGS. 9A-9C, epitaxial source/drain regions 106 are formed in the source/drain recesses 102. The epitaxial source/drain regions 106 are formed in the source/drain recesses 102 such that each of the dummy gates 94 are disposed between respective neighboring pairs of the epitaxial source/drain regions 106. In some embodiments, the gate spacers 98 and the inner spacers 104 are used to separate the dummy gates 94 and the first nanostructures 56A, respectively, from the epitaxial source/drain regions 106 by an appropriate lateral distance so that the epitaxial source/drain regions 106 do not short out subsequently formed gates of the nano-FETs. The epitaxial source/drain regions 106 may be formed in contact with the inner spacers 104 (if present), and may extend past sidewalls of the second nanostructures 56B. The epitaxial source/drain regions 106 can exert stress on the second nanostructures 56B, thereby improving performance.

The epitaxial source/drain regions 106 in the n-type region 50N may be formed by masking the p-type region 50P. Then, the epitaxial source/drain regions 106 are epitaxially grown in the source/drain recesses 102 in the n-type region 50N. The epitaxial source/drain regions 106 may include any acceptable material appropriate for n-type nano-FETs. For example, the epitaxial source/drain regions 106 in the n-type region 50N may include materials exerting a tensile strain on the channel regions 88, such as silicon, silicon carbide, phosphorous doped silicon carbide, silicon phosphide, or the like. The epitaxial source/drain regions 106 in the n-type region 50N may have surfaces raised from respective surfaces of the fin structures 62, and may have facets.

The epitaxial source/drain regions 106 in the p-type region 50P may be formed by masking the n-type region 50N. Then, the epitaxial source/drain regions 106 are epitaxially grown in the source/drain recesses 102 in the p-type region 50P. The epitaxial source/drain regions 106 may include any acceptable material appropriate for p-type nano-FETs. For example, the epitaxial source/drain regions 106 in the p-type region 50P may include materials exerting a compressive strain on the channel regions 88, such as silicon germanium, boron doped silicon germanium, germanium, germanium tin, or the like. The epitaxial source/drain regions 106 in the p-type region 50P may have surfaces raised from respective surfaces of the fin structures 62, and may have facets.

The epitaxial source/drain regions 106, the second nanostructures 56B, and/or the semiconductor fins 54 may be implanted with dopants to form source/drain regions, similar to the process previously discussed for forming lightly-doped source/drain regions, followed by an anneal. The source/drain regions may have an impurity concentration in the range of about $10^{19}$ $cm^{-3}$ to about $10^{21}$ $cm^{-3}$. The n-type and/or p-type impurities for source/drain regions may be any of the impurities previously discussed. In some embodiments, the epitaxial source/drain regions 106 may be in situ doped during growth.

As a result of the epitaxy processes used to form the epitaxial source/drain regions 106, upper surfaces of the epitaxial source/drain regions 106 have facets which expand laterally outward beyond surfaces of the fin structures 62 (as seen in FIG. 9C). Adjacent epitaxial source/drain regions 106 of adjacent fin structures 62 (e.g., of the forksheet structure 80) remain separated by the dielectric wall 68 after the epitaxy process is completed, so that merging of the epitaxial source/drain regions 106 is avoided. Thus, the epitaxial source/drain regions 106 each have a straight bottom surface (contacting a semiconductor fin 54), a straight sidewall (contacting the dielectric wall 68), a faceted side surface (facing away from the dielectric wall 68), and a faceted top surface (facing away from the substrate 50).

The epitaxial source/drain regions 106 may include one or more semiconductor material layers. For example, the epitaxial source/drain regions 106 may include first semiconductor material layers 106A and second semiconductor material layers 106B. Any number of semiconductor material layers may be used for the epitaxial source/drain regions 106. Each of the first semiconductor material layers 106A and the second semiconductor material layers 106B may be formed of different semiconductor materials and/or may be doped to different dopant concentrations. In some embodiments, the first semiconductor material layers 106A may have a dopant concentration less than the second semiconductor material layers 106B. In embodiments in which the epitaxial source/drain regions 106 include two semiconductor material layers, the first semiconductor material layers 106A may be grown from the fin structures 62, and the second semiconductor material layers 106B may be grown from the first semiconductor material layers 106A. In an embodiment, a height H2 of each of the epitaxial source/drain regions 106, from a topmost point of the epitaxial source/drain region 106 to a bottom surface of the epitaxial source/drain region 106, is in a range from 40 nm to 80 nm.

Figure 10A:
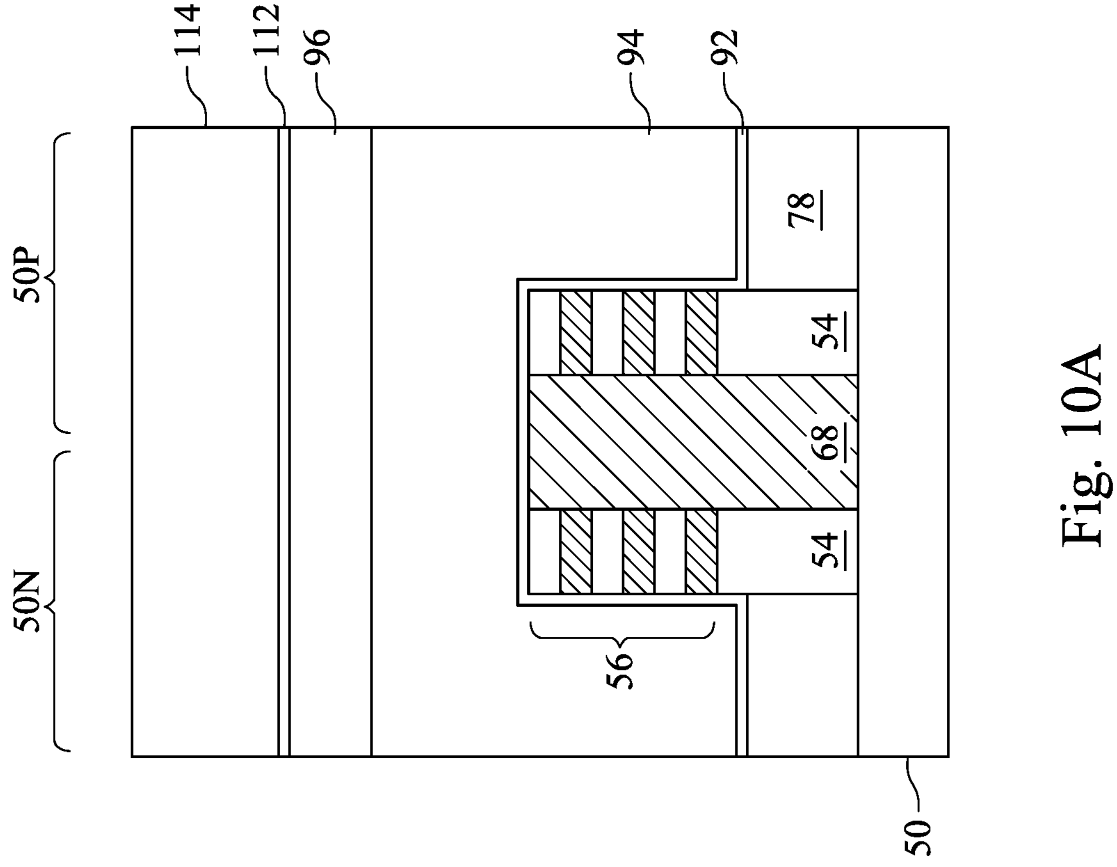
Figure 10B:
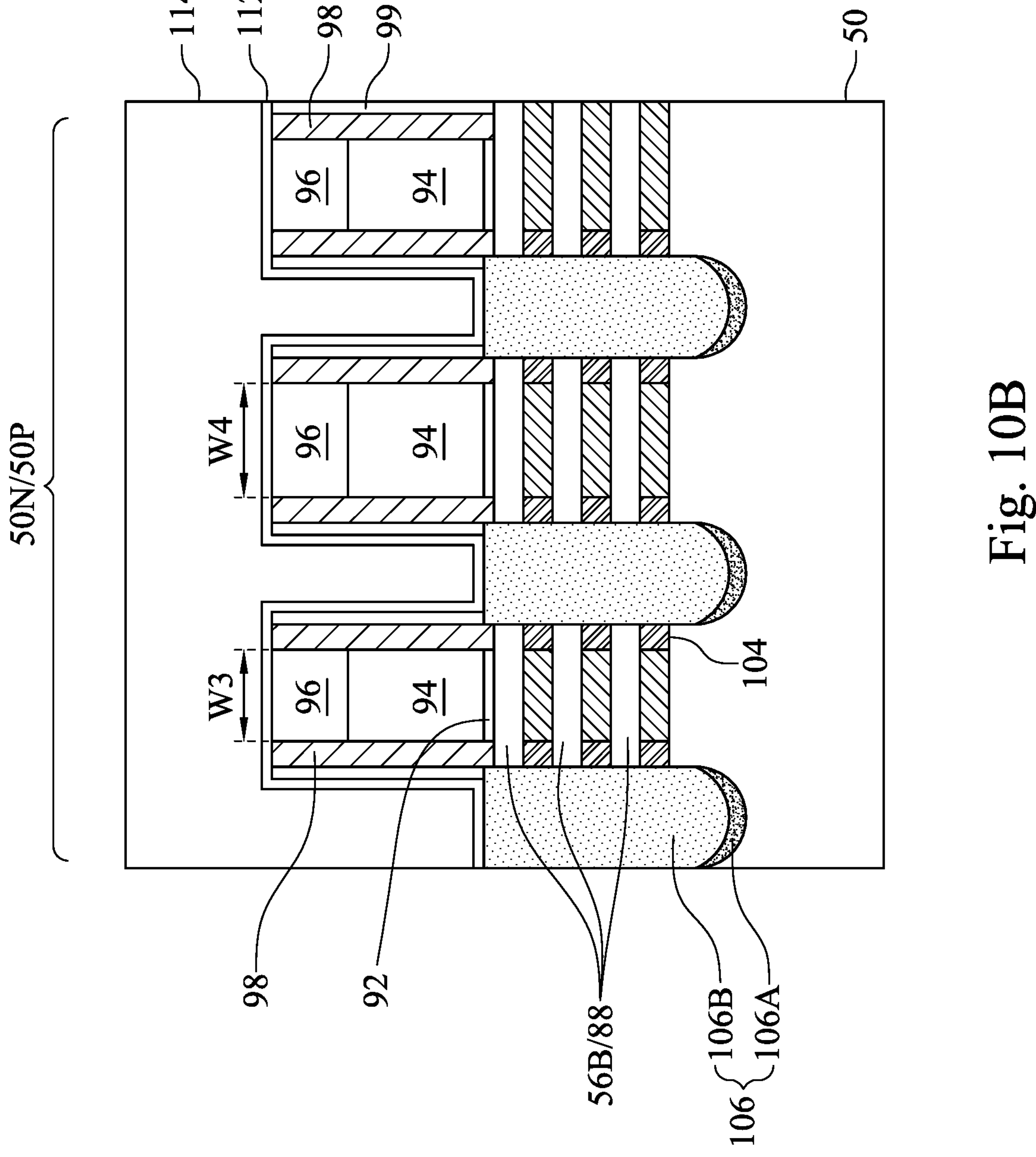
Figure 10C:
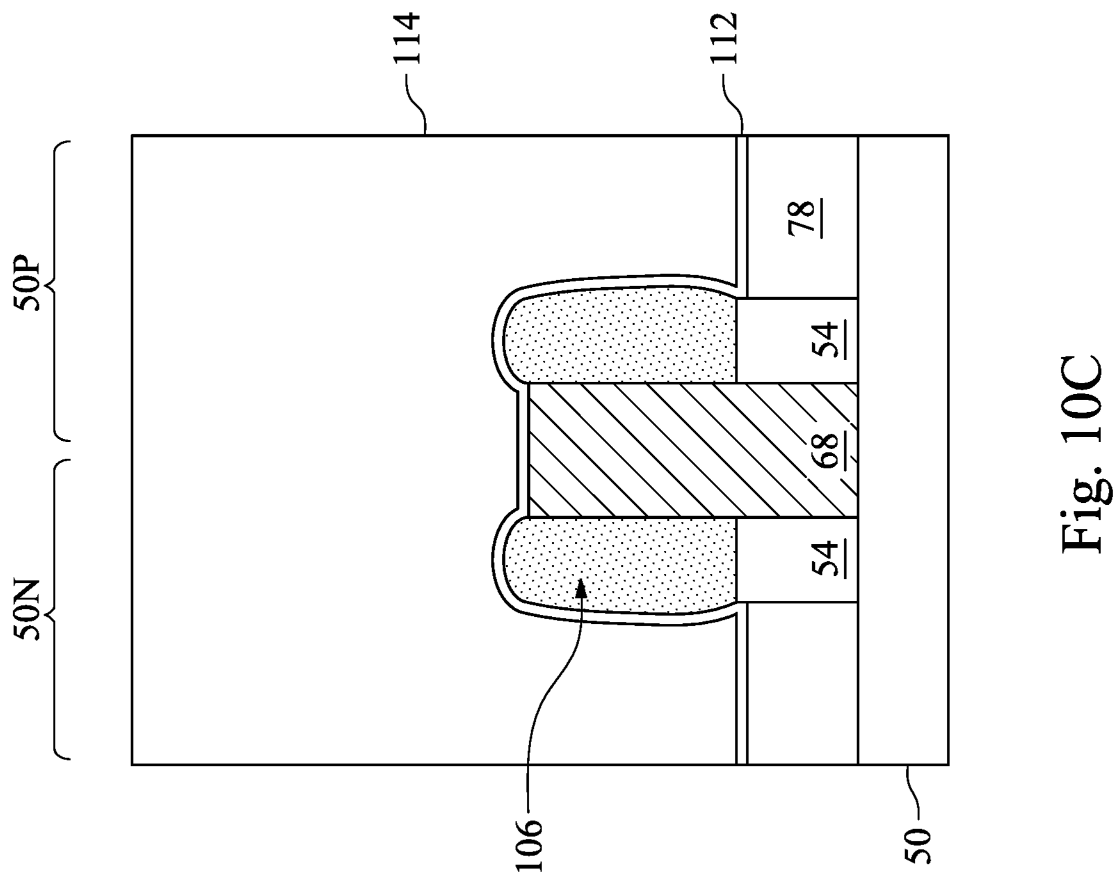

In FIGS. 10A-10C, gate spacers 99 may be formed on exposed sidewalls of the gate spacers 98, and on top surfaces of the epitaxial source/drain regions 106. The gate spacers 99 may be formed by conformally forming an insulating material and subsequently etching the insulating material. The insulating material may be formed on top surfaces and sidewalls of the epitaxial source/drain regions 106, top surfaces and sidewalls of the gate spacers 98, and top surfaces of the masks 96 (if present) or the dummy gates 94. The insulating material may be a low-k dielectric material such as silicon carbonitride, silicon nitride, silicon oxide, silicon oxycarbide, silicon oxycarbonitride, or the like. Acceptable deposition processes used to form the insulating material include atomic layer deposition (ALD), chemical vapor deposition (CVD), physical vapor deposition (PVD), or the like. The etching of the insulating material may be anisotropic. For example, the etching process may be a dry etch such as RIE, NBE, or the like, that removes portions of the insulating material from the top surfaces and the sidewalls of the epitaxial source/drain regions 106, the top surfaces of the gate spacers 98, and the top surfaces of the masks 96. After the etching process is performed, the gate spacers 99 remain on the sidewalls of the gate spacers 98 and portions of the top surfaces of the epitaxial source/drain regions 106.

Referring further to FIGS. 10A-10C, a first inter layer dielectric (ILD) 114 is then formed over the epitaxial source/drain regions 106, the dielectric wall 68, the isolation regions 78, the gate spacers 98, the gate spacers 99, the masks 96 (if present) or the dummy gates 94. The first ILD 114 may be formed by depositing a dielectric material over the epitaxial source/drain regions 106, the dielectric wall 68, the isolation regions 78, the gate spacers 98, the gate spacers 99, the masks 96 (if present) or the dummy gates 94. Acceptable dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials may be used. The deposition may be by any suitable method, such as CVD, plasma-enhanced CVD (PECVD), or FCVD. Other acceptable processes may be used to form the dielectric material.

In some embodiments, a contact etch stop layer (CESL) 112 is disposed between the first ILD 114 and the epitaxial source/drain regions 106, the dielectric wall 68, the masks 96 (if present) or the dummy gates 94, the gate spacers 98, the gate spacers 99, and the isolation regions 78. The CESL 112 may include a dielectric material, such as, silicon nitride, silicon oxide, silicon oxynitride, or the like, having a high etching selectivity from the etching of the first ILD 114.

Figure 11A:
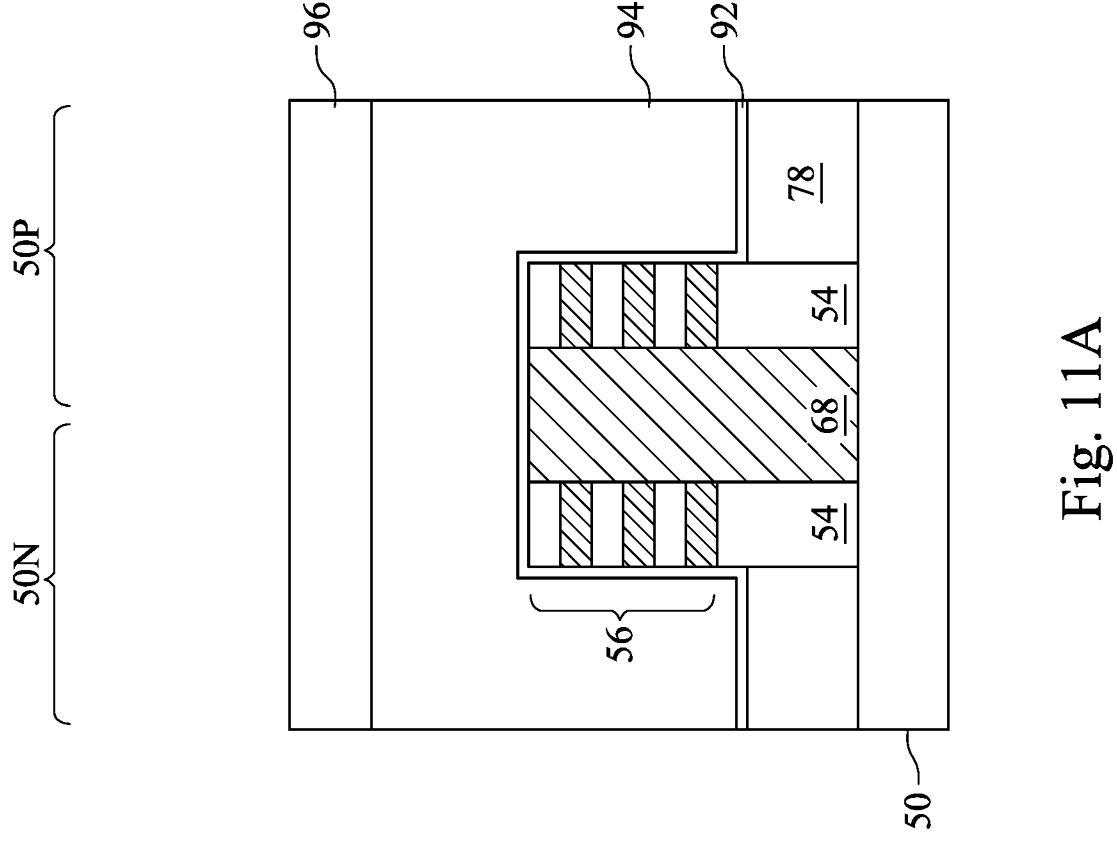
Figure 11B:
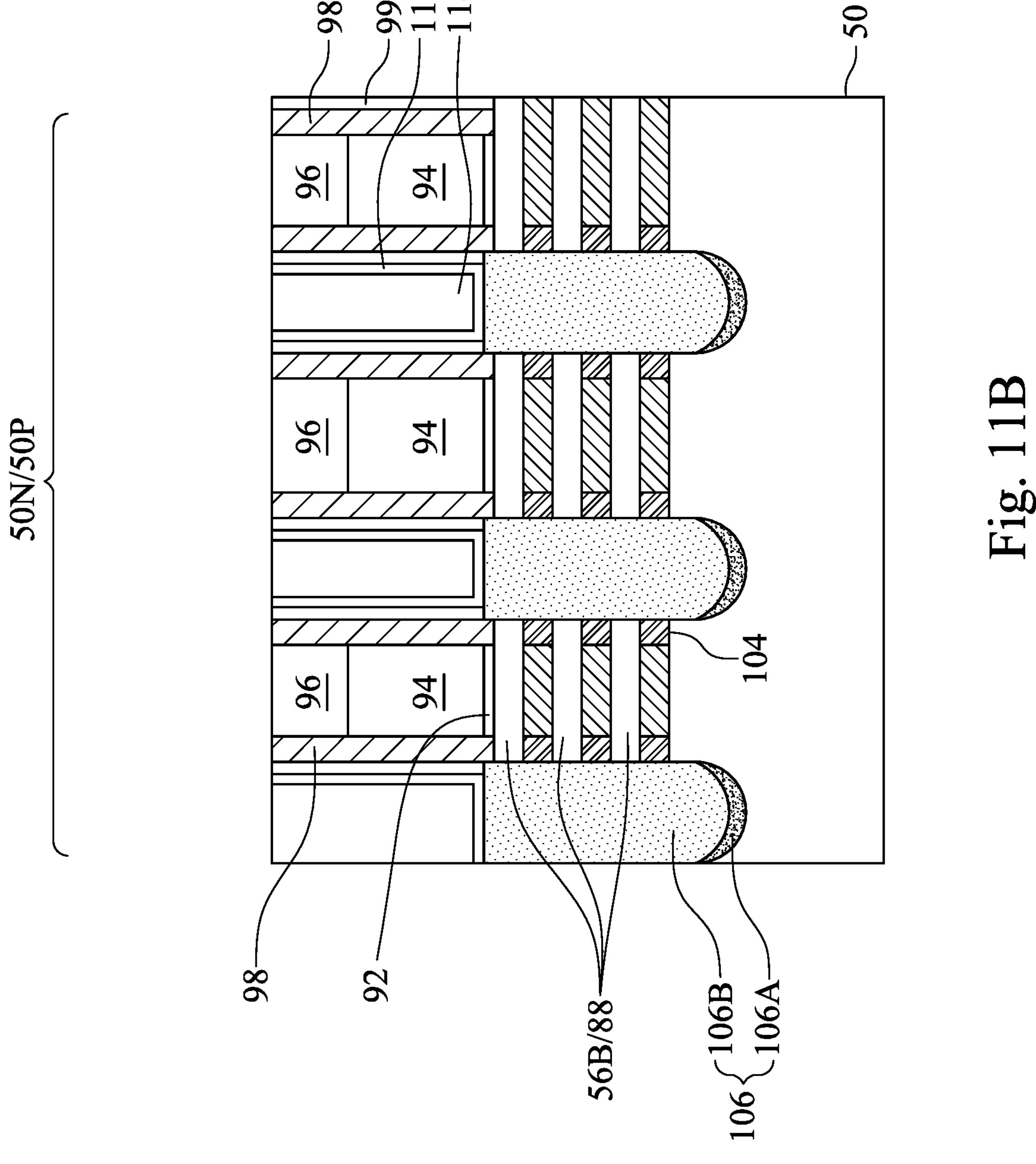

In FIGS. 11A-11B, a planarization of the first ILD 114 is performed. The planarization may be by any suitable method, such as a CMP, an etch-back process, combinations thereof, or the like. The planarization process levels the top surface of the first ILD 114 with the top surfaces of the masks 96 (if present) or the dummy gates 94. The planarization process may also remove the masks 96 and portions of the gate spacers 98 and the gate spacers 99 along sidewalls of the masks 96. After the planarization process, the top surfaces of the first ILD 114, the CESL 112, the gate spacers 98, the gate spacers 99, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surface of the first ILD 114 with the top surfaces of the masks 96.

FIGS. 12A through 13B illustrate a process for dividing each of the fin structures 62N, 62P of a pair of the fin structures 62 and their corresponding overlying dummy gates 94 into multiple segments that are electrically isolated from each other. This is done by forming the dielectric layer 119 (also referred to as a dielectric fin or insulating fin), between adjacent ones of the multiple segments.

Figure 12A:
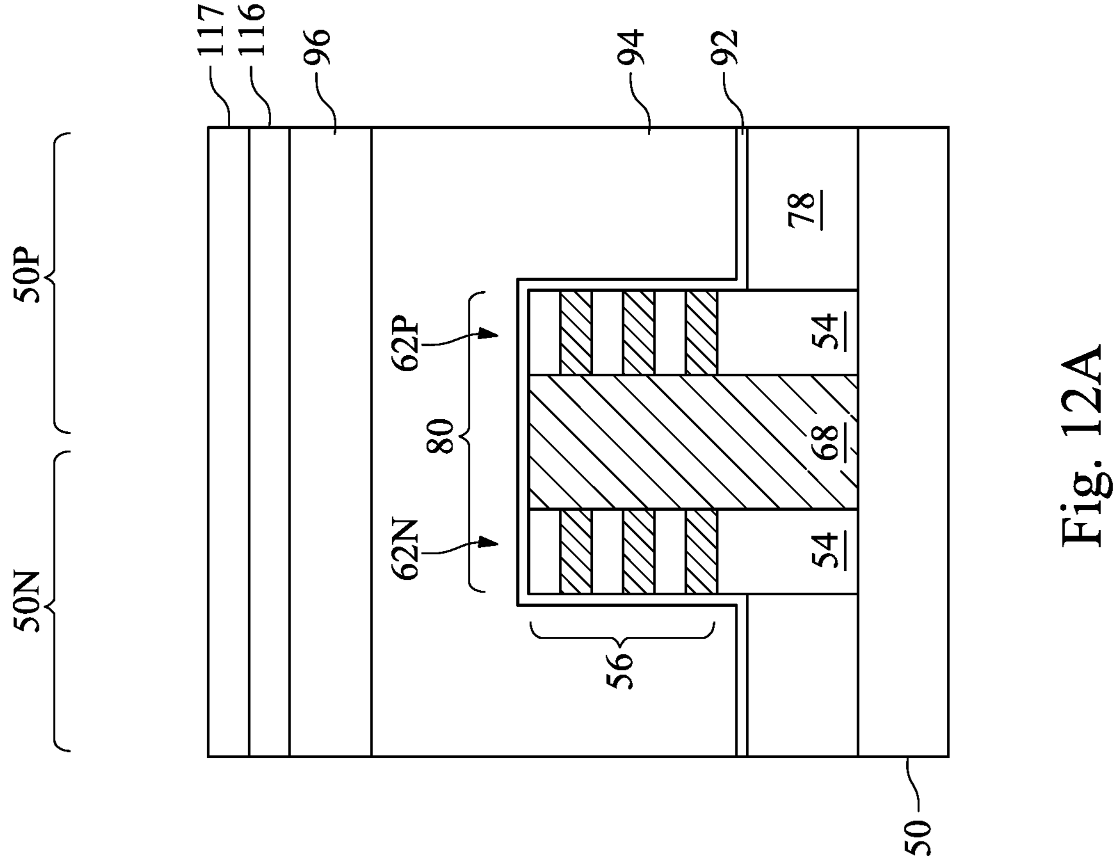
Figure 12B:
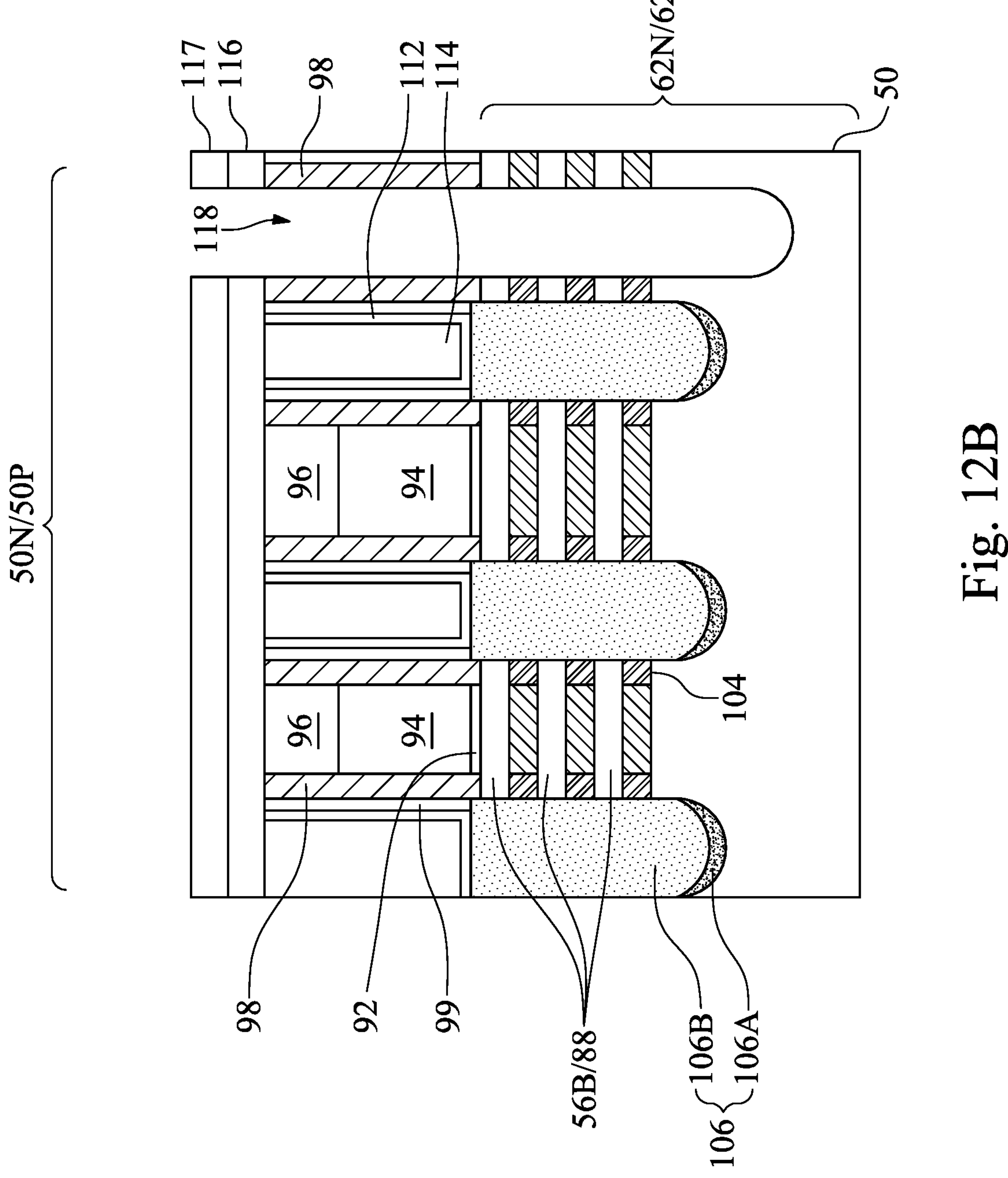

In FIGS. 12A-12B, a first hard mask layer 116 and a second hard mask layer 117 are formed successively over the first ILD 114, the masks 96 (if present) or the dummy gates 94, the CESL 112, the gate spacers 98, and the gate spacers 99. In some embodiments, the first hard mask layer 116 is a metal hard mask layer and the second hard mask layer 117 is a dielectric hard mask layer. In subsequent processing, a pattern is transferred onto the first hard mask layer 116 using various photolithography and etching techniques. The first hard mask layer 116 may then be used as an etching mask for etching the underlying structure (e.g., a mask 96 (if present), a dummy gate 94, dummy dielectrics 92, nanostructures 56, and semiconductor fin 54). The first hard mask layer 116 may be a masking material such as titanium nitride, titanium oxide, the like, or a combination thereof. The first hard mask layer 116 may be formed using a process such as ALD, CVD, PVD, the like, or a combination thereof.

The second hard mask layer 117 is deposited over the first hard mask layer 116. The second hard mask layer 117 may be used as a masking pattern for the first hard mask layer 116. In subsequent processing steps, the second hard mask layer 117 is patterned to form patterns which may then be transferred to the first hard mask layer 116. The second hard mask layer 117 may be a masking material such as silicon nitride, silicon oxide, tetraethyl orthosilicate (TEOS), $SiO_xC_y$, the like, or a combination thereof. The second hard mask layer 117 may be formed using a process such as CVD, ALD, the like, or a combination thereof. In an example embodiment, the first hard mask layer 116 comprises titanium nitride, and the second hard mask layer 117 comprises silicon nitride.

Next, a patterned photoresist layer is formed over the first hard mask layer 116 and the second hard mask layer 117. The pattern of the patterned photoresist layer may comprise an opening in the photoresist layer. The pattern in the photoresist layer is transferred to the first hard mask layer 116 and the second hard mask layer 117 using suitable methods, such as one or more anisotropic etching processes. As a result, a pattern (e.g., including an opening) is formed in the first hard mask layer 116 and the second hard mask layer 117, which pattern exposes a portion of a mask 96 (if present) or a dummy gate 94.

Referring further to FIGS. 12A-12B, an etching process is performed using the first hard mask layer 116 and the second hard mask layer 117 as etching masks in order to form a trench 118. During the etching process, portions of a mask 96 (if present), a dummy gate 94, dummy dielectrics 92, nanostructures 56, semiconductor fin 54, and the dielectric wall 68 are removed. This means the trench 118 extends through the dielectric wall 68 and the pair of fin structures 62 of a forksheet structure 80. The trench 118 may extend through and be disposed between adjacent gate spacers 98, and may also extend through nanostructures 56. The trench 118 may also extend through the semiconductor fin 54. The etching process may be an anisotropic etching process. The trench 118 separates first portions of each of the fin structures 62N, 62P of a pair of the fin structures 62 and their corresponding overlying dummy gates 94 from a second portion of each of the fin structures 62N, 62P of the pair of the fin structures 62 and their corresponding overlying dummy gates 94. Though not explicitly shown in FIG. 12B, the first portions of each of the fin structures 62N, 62P of the pair of the fin structures 62 are on an opposite side of the trench 118 as the second portion of each of the fin structures 62N, 62P of the pair of the fin structures 62. In an embodiment, the trench 118 extends into the isolation regions 78, and a bottom of the trench 118 further extends into the substrate 50.

The shape and the depth of the trench 118 illustrated in FIG. 12B is a non-limiting example, other shapes and depths for the trench 118 are also possible, and are fully intended to be included within the scope of the present disclosure. For example, the trench 118 may extend into the isolation regions 78 but not into the substrate 50. As another example, the trench 118 may be wider than illustrated in the FIG. 12B, such that portions of the gate spacers 98 are also removed by the anisotropic etching process (e.g., a plasma process). As yet another example, the cross-section of the trench 118 is illustrated as having a U-shaped bottom in FIG. 12B, although other shapes for the bottom portion of the trench 118, such as a V-shape or a rectangular shape, are also possible.

Figure 13A:
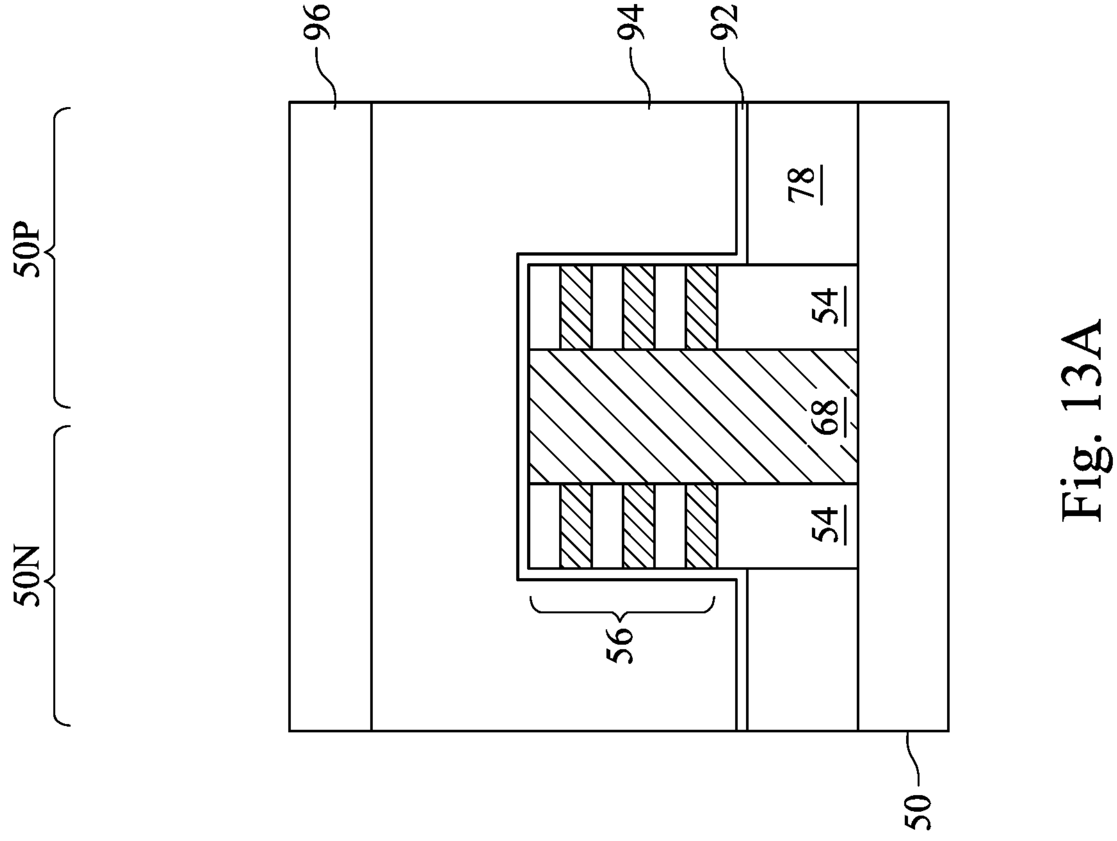
Figure 13B:
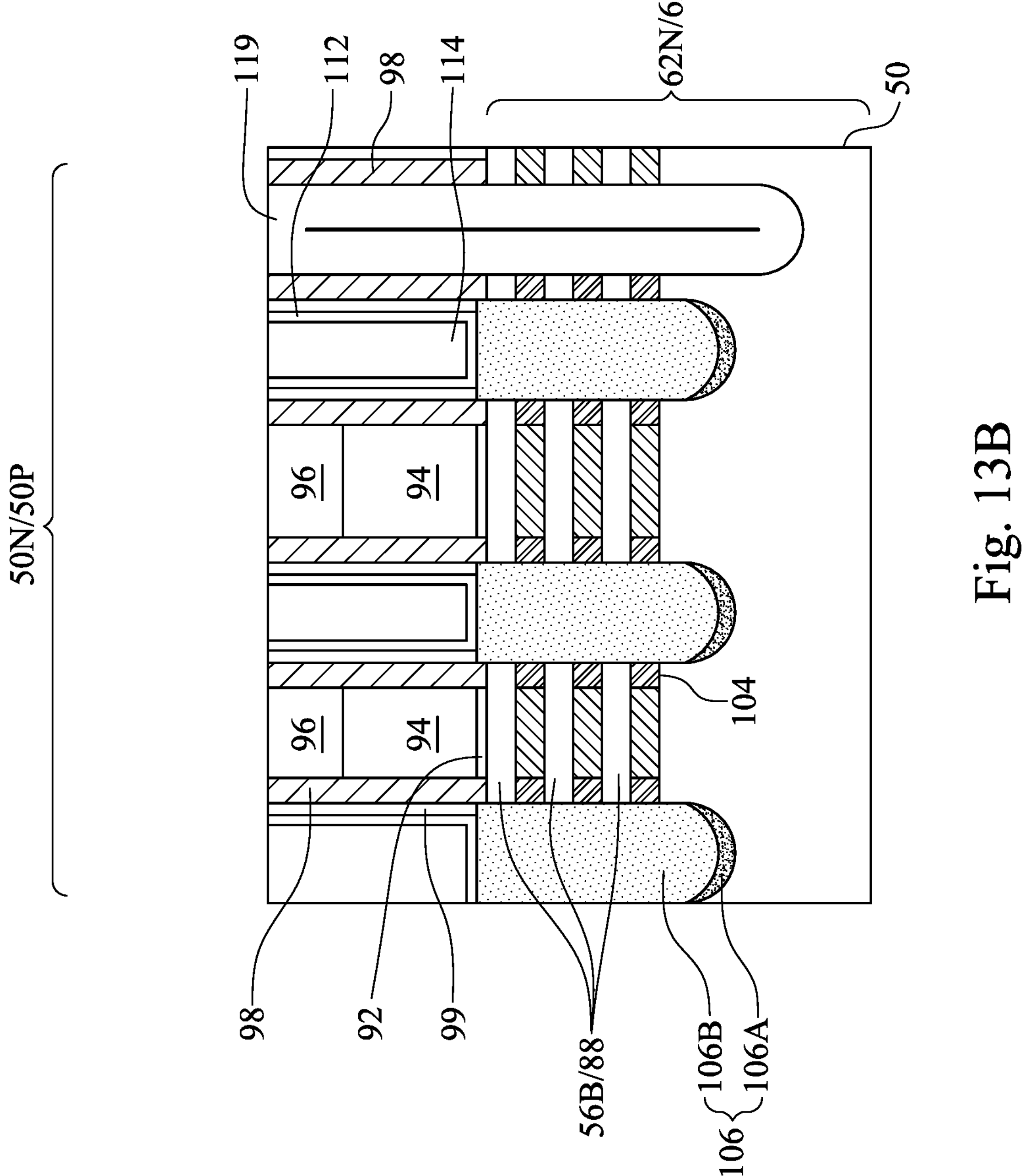

Next, in FIGS. 13A-13B, a dielectric layer 119 (also referred to subsequently as an insulating layer) is formed over the gate spacers 98, the gate spacers 99, the masks 96 (if present) or the dummy gates 94, the first ILD 114, the CESL 112, and in the trench 118, in order to fill the trench 118. In some embodiments, the dielectric layer 119 is formed to be a conformal layer, that is deposited on sidewalls and a bottom surface of the trench 118, till the trench 118 is filled.

In the illustrated embodiments, the dielectric layer 119 may comprise silicon nitride, silicon oxide, or the like, and may be formed using a plasma-enhanced atomic layer deposition (PEALD) process, an ALD process, a CVD process, or the like. In this way, the portions of the mask 96 (if present), the dummy gate 94, the dummy dielectrics 92, the nanostructures 56, the semiconductor fin 54, and the dielectric wall 68 that were removed during the formation of the trench 118, are replaced with the dielectric layer 119. The dielectric layer 119 isolates the first portions of each of the fin structures 62N, 62P of the pair of the fin structures 62 and their corresponding overlying dummy gates 94 from the second portion of each of the fin structures 62N, 62P of the pair of the fin structures 62 and their corresponding overlying dummy gates 94.

After the formation of the dielectric layer 119, a removal process is then applied to the dielectric layer 119 to remove excess material of the dielectric layer 119 over the masks 96 (if present) or the dummy gates 94. In some embodiments, a planarization process such as a chemical mechanical polish (CMP), an etch-back process, combinations thereof, or the like may be utilized. The planarization process exposes the masks 96 (if present) or the dummy gates 94 such that top surfaces of, respectively, the masks 96 (if present) or the dummy gates 94, the gate spacers 98, the gate spacers 99, the CESL 112, the remaining portions of the dielectric layer 119 in the trench 118, and the first ILD 114 are coplanar (within process variations) after the planarization process is complete. After the planarization process, the remaining portions of the dielectric layer 119 in the trench 118 may also be referred to subsequently as a dielectric fin, an insulating fin, or a fin isolation structure.

In FIGS. 14A through 15B, the masks 96 (if present), the dummy gates 94, the dummy dielectrics 92, and the first nanostructures 56A are removed and replaced with gate structures 120. The gate structures 120 include gate dielectrics 122 and gate electrodes 124 on the gate dielectrics 122. The gate structures 120 may also be referred to as "gate stacks."

Figure 14A:
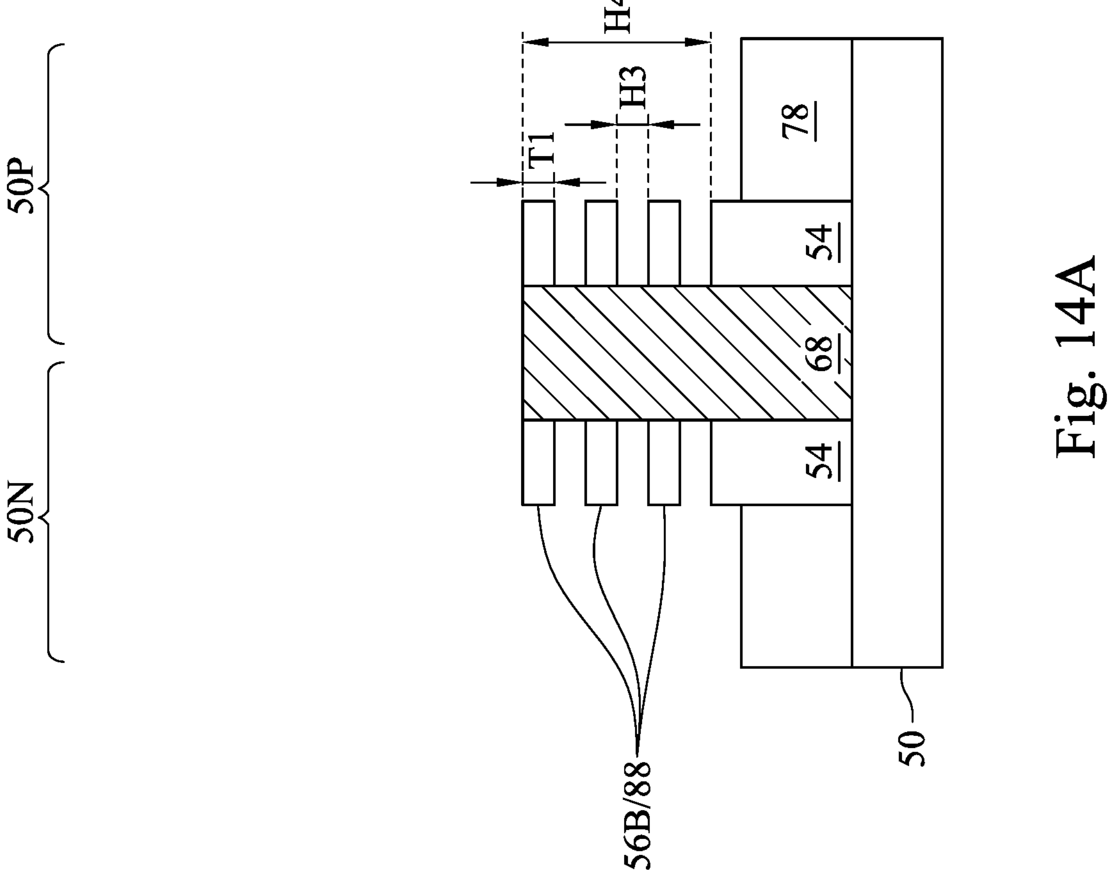
Figure 14B:
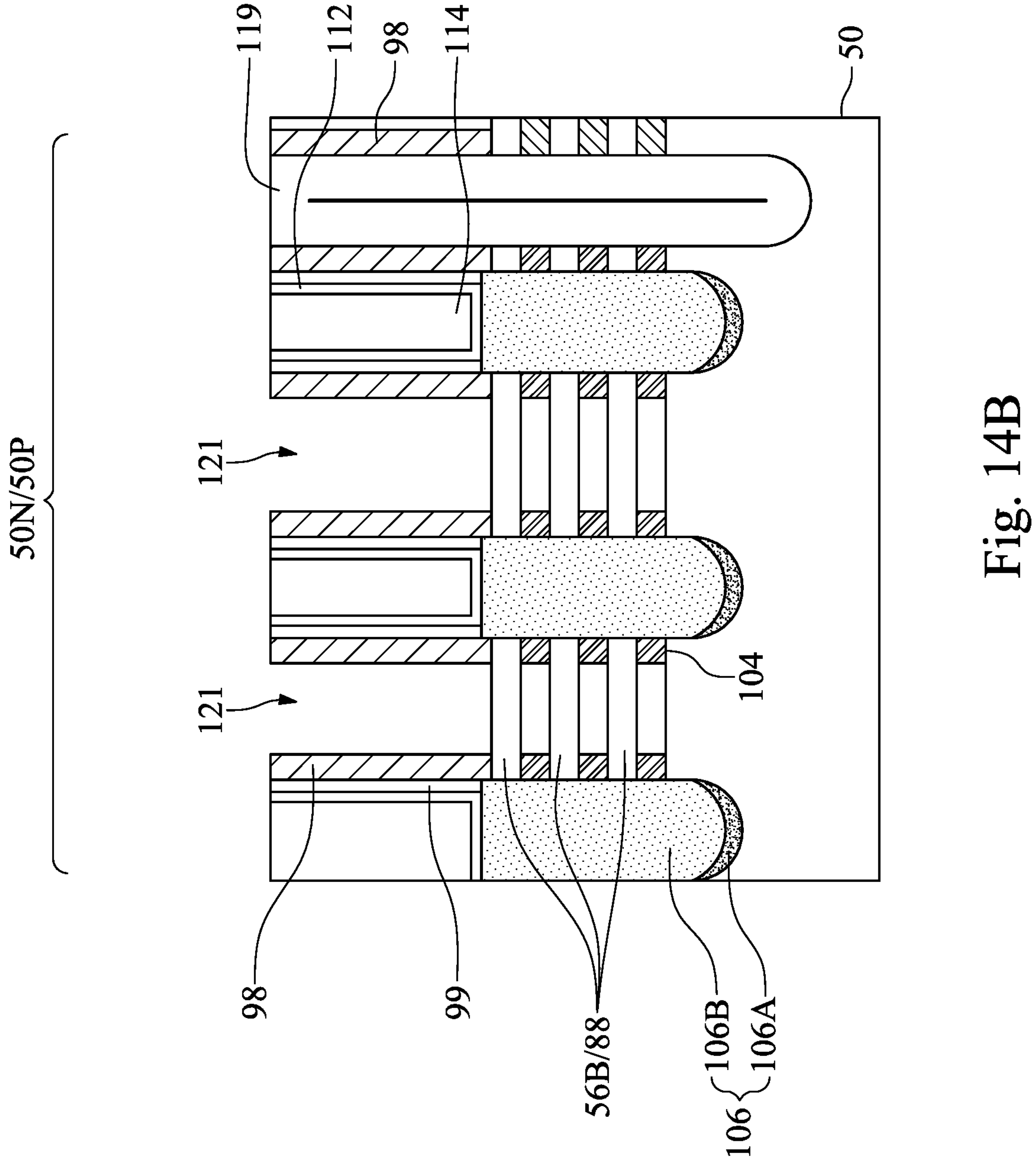

In FIGS. 14A-14B, the masks 96 (if present) and the dummy gates 94 are removed in an etching process, so that recesses 121 are formed. Portions of the dummy dielectrics 92 in the recesses 121 may also be removed. In some embodiments, the dummy gates 94 are removed by an anisotropic dry etch process. For example, the etching process may include a dry etch process using reaction gas(es) that selectively etch the dummy gates 94 at a faster rate than the first ILD 114, the dielectric layer 119, the gate spacers 98, and the gate spacers 99. During the removal, the dummy dielectrics 92 may be used as etch stop layers when the dummy gates 94 are etched. The dummy dielectric 92 may then be removed after the removal of the dummy gates 94. Each recess 121 exposes and/or overlies portions of the second nanostructures 56B which act as the channel regions 88. The portions of the second nanostructures 56B which will act as the channel regions 88 are disposed between neighboring pairs of the epitaxial source/drain regions 106.

The remaining portions of the first nanostructures 56A are then removed to expand the recesses 121. The remaining portions of the first nanostructures 56A can be removed by an acceptable etching process that selectively etches the material(s) of the first nanostructures 56A at a faster rate than the material(s) of the second nanostructures 56B, the semiconductor fins 54, the isolation regions 78, and the dielectric wall 68. The etching may be isotropic. For example, when the semiconductor fins 54 and the second nanostructures 56B are formed of silicon and the first nanostructures 56A are formed of silicon germanium, the etching process may be a wet etch using tetramethylammonium hydroxide (TMAH), ammonium hydroxide ($NH_4OH$), or the like. After the removal of the first nanostructures 56A, and the expansion of the recesses 121, each second nanostructure 56B may have a thickness T1 that is in a range from 4 nm to 15 nm. In an embodiment, a height H3 between a bottom surface of a first one of the second nanostructures 56B and a top surface of a second one of the second nanostructures 56B is in a range from 5 nm to 15 nm, where the second one of the second nanostructures 56B is adjacent to and vertically below the first one of the second nanostructures 56B. In an embodiment, a height H4 between a top surface of a topmost one of the second nanostructures 56B and a top surface of a semiconductor fin 54 is in a range from 40 nm to 80 nm, where the semiconductor fin 54 is vertically below the topmost one of the second nanostructures 56B.

Figure 15A:
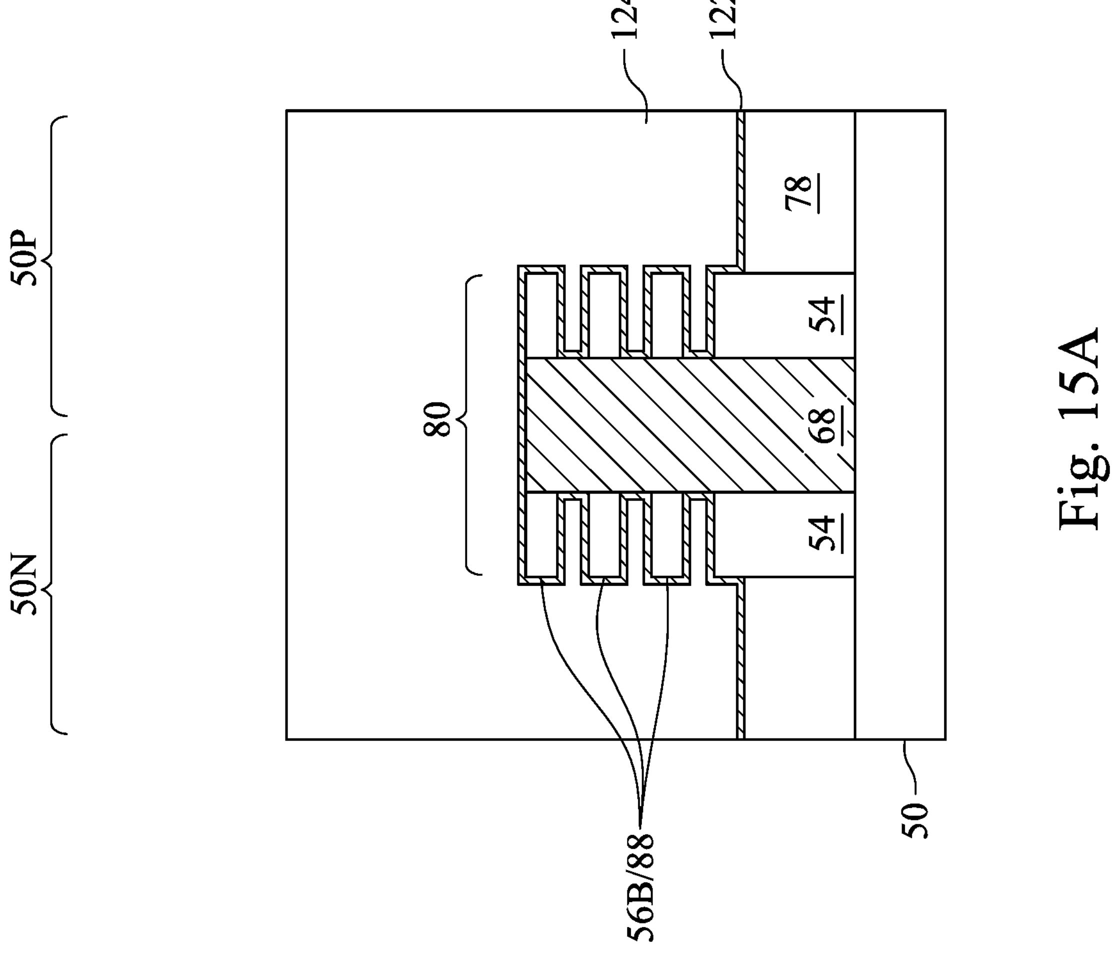
Figure 15B:
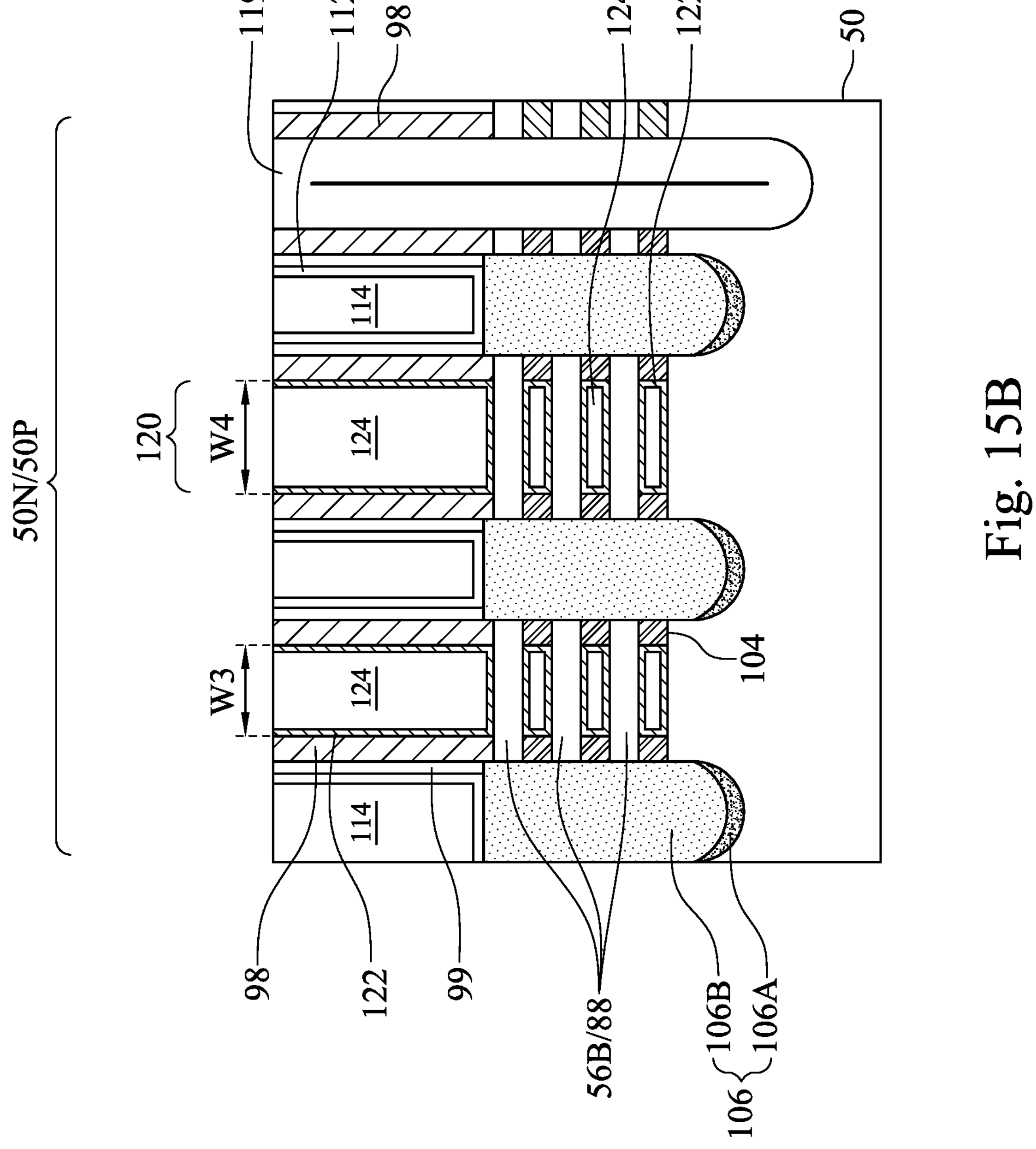

In FIGS. 15A-15B, gate dielectrics 122 and gate electrodes 124 are formed for replacement gates. The gate dielectrics 122 are deposited conformally in the recesses 121, such as on top surfaces and sidewalls of the semiconductor fins 54 and on top surfaces, sidewalls, and bottom surfaces of the second nanostructures 56B. The gate dielectrics 122 may also be deposited on top surfaces of the isolation regions 78 and on sidewalls and a top surface of the dielectric wall 68.

The gate dielectrics 122 include one or more dielectric layers, such as an oxide, a metal oxide, a metal silicate, the like, or combinations thereof. In some embodiments, the gate dielectrics 122 include silicon oxide, silicon nitride, or multilayers there of. In some embodiments, the gate dielectrics 122 include a high-k dielectric material, and in these embodiments, the gate dielectrics 122 may have a k value greater than about 7.0, and may include a metal oxide or a silicate of hafnium, aluminum, zirconium, lanthanum, manganese, barium, titanium, lead, and combinations thereof. The gate dielectrics 122 can be multilayered. For example, in some embodiments, the gate dielectrics 122 may each include an interfacial layer of silicon oxide formed by thermal or chemical oxidation and a metal oxide layer over the interfacial layer. The formation methods of the gate dielectrics 122 may include molecular-beam deposition (MBD), ALD, PECVD, and the like.

The gate electrodes 124 are deposited over the gate dielectrics 122, respectively, and fill the remaining portions of the recesses 121. The gate electrodes 124 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 124 are illustrated, the gate electrodes 124 may comprise any number of liner layers, any number of work function tuning layers, and a fill material. Any combination of the layers which make up the gate electrodes 124 may be deposited in the areas between each of the second nanostructures 56B and between the semiconductor fins 54 and the second nanostructures 56B. Further, different recesses 121 may be filled with a different number of liner layers, work function tuning layers, and fill material to allow for the formation of gate stacks having different widths. For example, as shown in FIGS. 15A and 15B, a first recess 121 having the width W3 is filled with gate dielectrics 122 and gate electrodes 124, and a second recess 121 having the width W4 is filled with gate dielectrics 122 and gate electrodes 124, wherein the width W4 is larger than the width W3. The second recess 121 may be filled with one or more additional liner layers, work function tuning layers, and fill materials as compared to the first recess 121, such as tungsten, or the like. The formation methods of the gate electrodes 124 may include ALD, PECVD, and the like.

After the filling of the recesses, a planarization process, such as a CMP, may be performed to remove the excess portions of the materials of the gate dielectrics 122 and the gate electrodes 124, which excess portions are over the top surfaces of the first ILD 114, the gate spacers 98, the gate spacers 99, the CESL 112, and the dielectric layer 119. The remaining portions of the materials of the gate dielectrics 122 and the gate electrodes 124 thus form the replacement gate structures 120 of the resulting nano-FETs.

The formation of the gate dielectrics 122 in the n-type region 50N and the p-type region 50P may occur simultaneously such that the gate dielectrics 122 in each region are formed from the same materials, and the formation of the gate electrodes 124 may occur simultaneously such that the gate electrodes 124 in each region are formed from the same materials. For example, in the illustrated embodiment, gate electrodes 124 comprising the same materials are formed in the n-type region 50N and the p-type region 50P. In some embodiments, the gate dielectrics 122 in each region may be formed by distinct processes, such that the gate dielectrics 122 may be different materials, and/or the gate electrodes 124 in each region may be formed by distinct processes, such that the gate electrodes 124 may be different materials. Various masking steps may be used to mask and expose appropriate regions when using distinct processes.

Referring further to FIGS. 15A and 15B, the gate electrodes 124 around the channel regions 88 of a same forksheet structure 80 can be physically and electrically coupled. Such coupling may be advantageous in some CMOS processes. For example, when the nano-FETs are used to form inverters, gates, memories, and the like, directly connecting the gate electrodes 124 may allow for a reduction in the quantity of gate contacts.

Figure 16A:
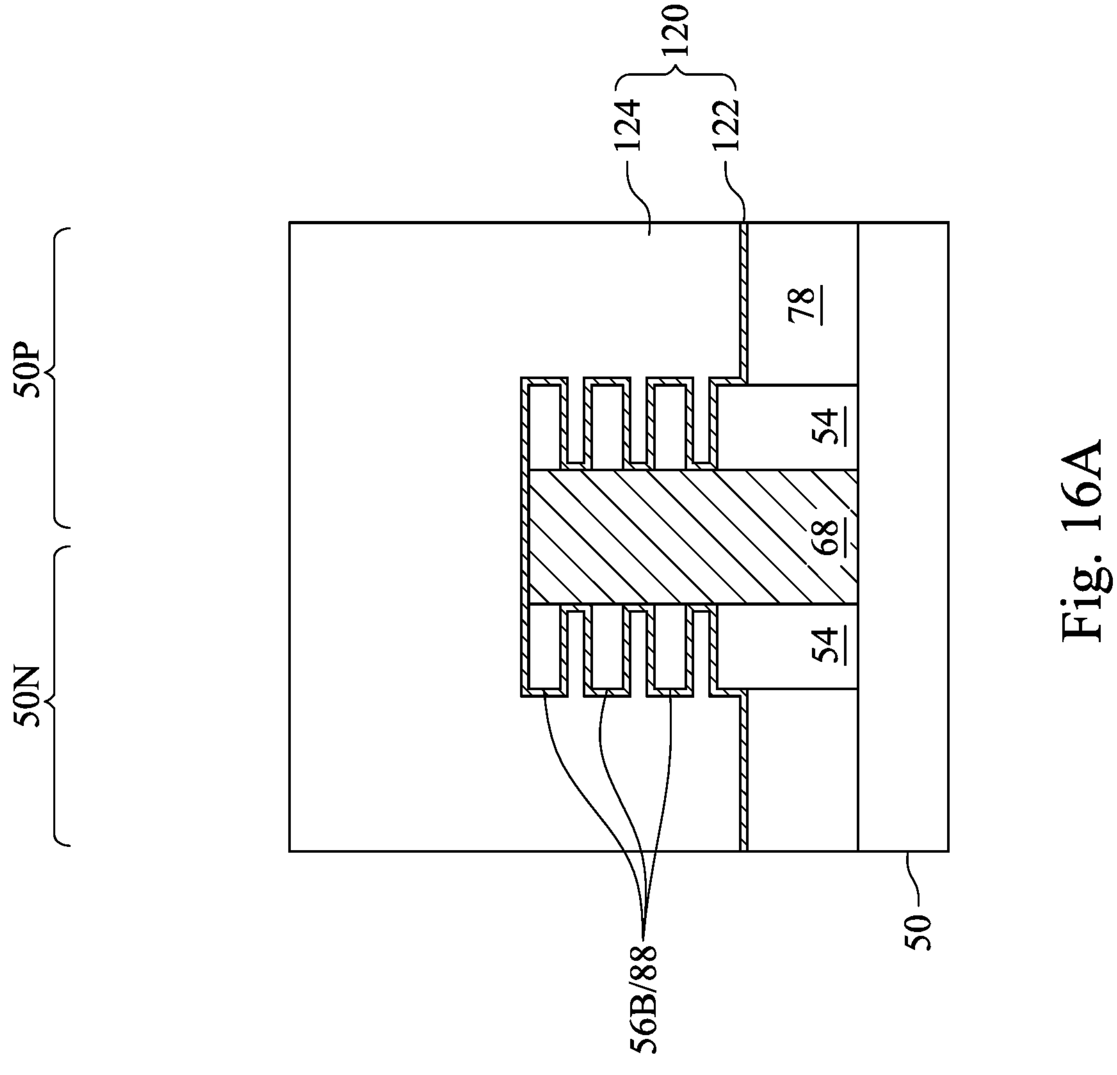
Figure 16B:
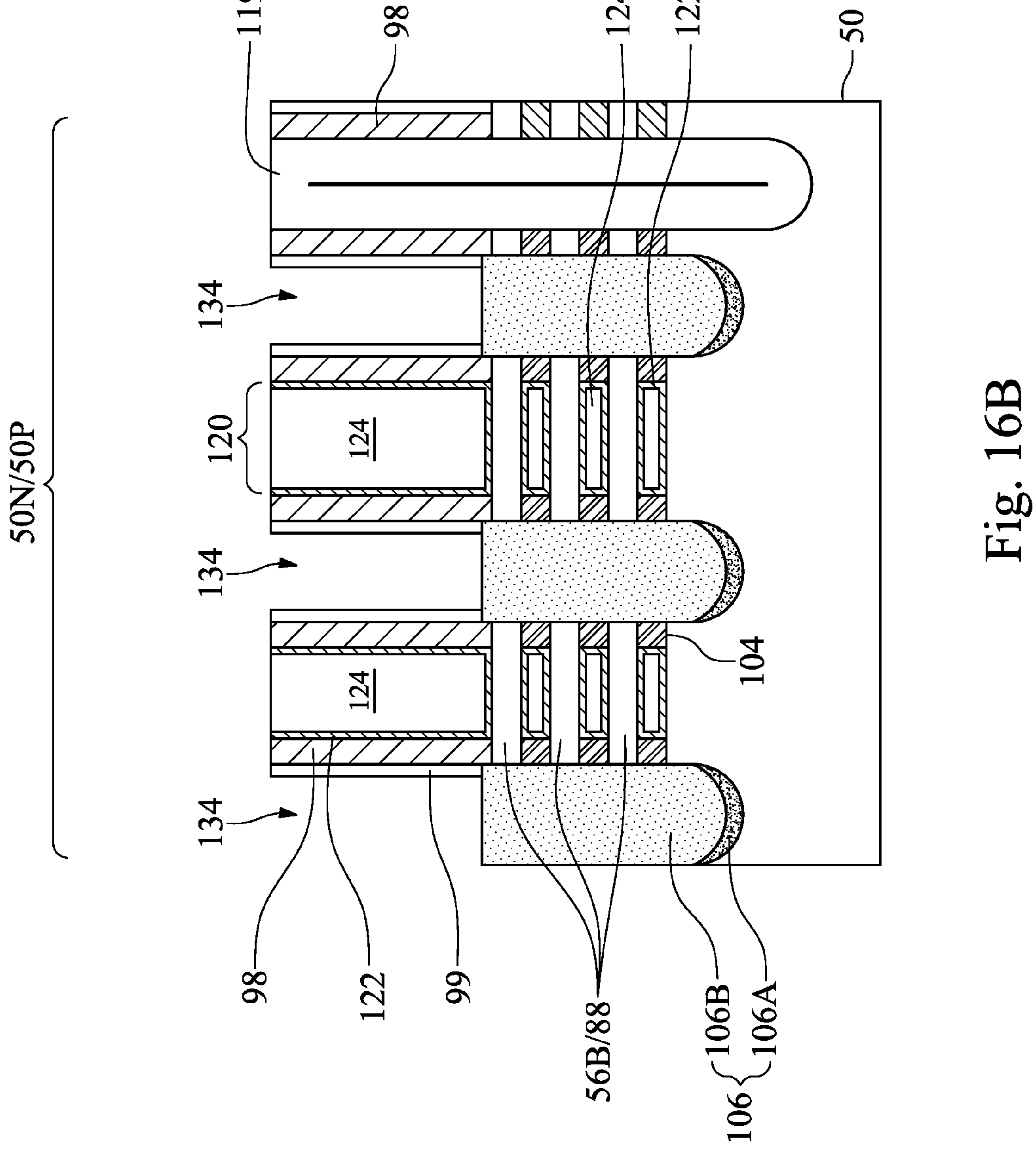
Figure 16C:
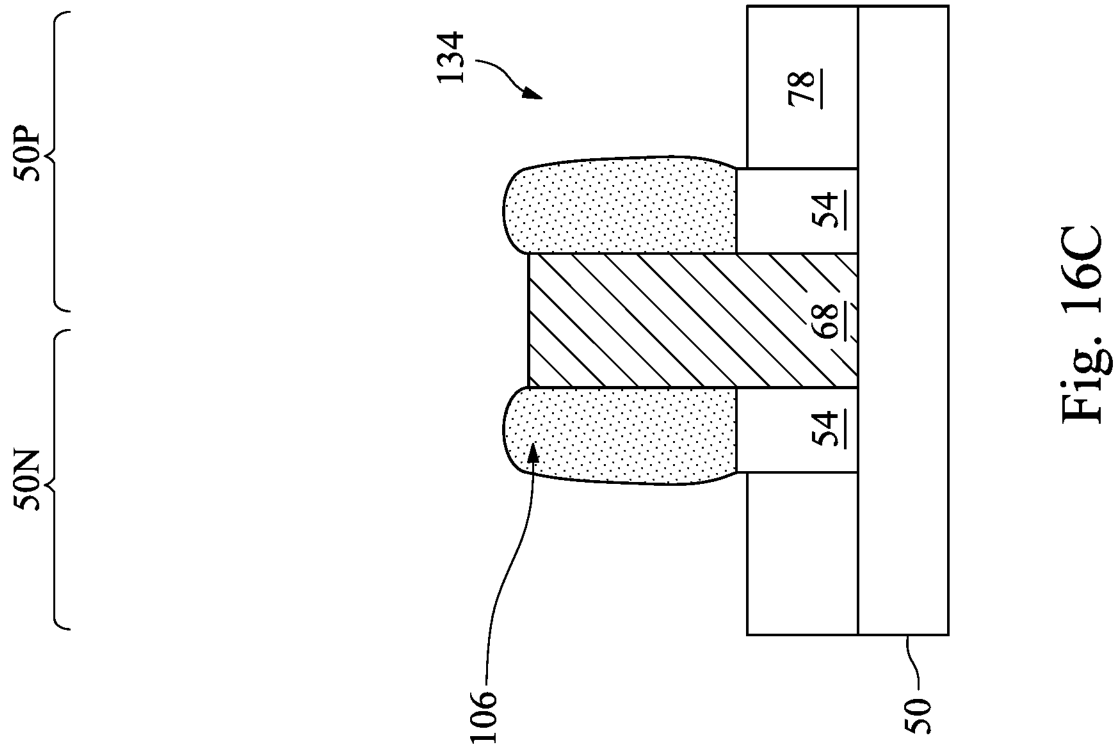

In FIGS. 16A-16C, the first ILD 114 and the CESL 112 are removed to form openings 134 that expose the faceted top and side surfaces of the epitaxial source/drain regions 106. In an embodiment, the openings 134 may also expose portions of the sidewalls of the semiconductor fins 54. The openings 134 may be formed using acceptable photolithography and etching techniques. Multiple etching steps may be used to form the openings 134. In an embodiment, an etching process (e.g., a dry etch process) may be performed using HF gas, $NH_3$ gas, $CH_3F$, $C_4F_6$, or the like, as etchants to selectively remove the first ILD 114 and the CESL 112. The etching process may be selective to the first ILD 114 and the CESL 112 (e.g., etches the material(s) of the first ILD 114 and the CESL 112 at a faster rate than the material(s) of the gate spacers 98, the gate spacers 99, isolation regions 78, the gate dielectrics 122, the gate electrodes 124, and the epitaxial source/drain regions 106). Removing the first ILD 114 and the CESL 112 in the manner described above allows for the exposing of a larger surface area (e.g., an increase in the exposed surface area that is in a range from 20 percent to 30 percent larger) of the epitaxial source/drain regions 106.

Advantages can be achieved by performing the planarization process described above to remove the excess portions of the materials of the gate dielectrics 122 and the gate electrodes 124, which excess portions are over the top surfaces of the first ILD 114, the gate spacers 98, the gate spacers 99, the CESL 112, and the dielectric layer 119, and forming the replacement gate structures 120. The etching process is then performed after the planarization process, wherein the etching process is performed using HF gas, $NH_3$ gas, $CH_3F$, $C_4F_6$, or the like as etchants to remove the planarized first ILD 114 and the CESL 112, in order to form the openings 134 and expose the faceted top and side surfaces of the epitaxial source/drain regions 106. These advantages include allowing a larger surface area of the epitaxial source/drain regions 106 to be exposed through the opening 134, such that subsequently formed metal-semiconductor alloy regions 125 and coating layer 126 (shown in FIGS. 17A-17C) can be formed over a larger surface area (e.g., an increase in surface area that is in a range from 20 percent to 30 percent) of the epitaxial source/drain regions 106. These advantages include decreased contact resistance between subsequently formed source/drain contacts 142 (shown in FIGS. 24A-24C) and the epitaxial source/drain regions 106. As a result, there is more efficient current flow through the source/drain contacts 142, power dissipation at the source/drain contacts 142 is minimized, and the output resistance (RO) is improved, allowing the delivery of power to a load without significant voltage or current loss. This therefore results in improved device performance.

Figure 17A:
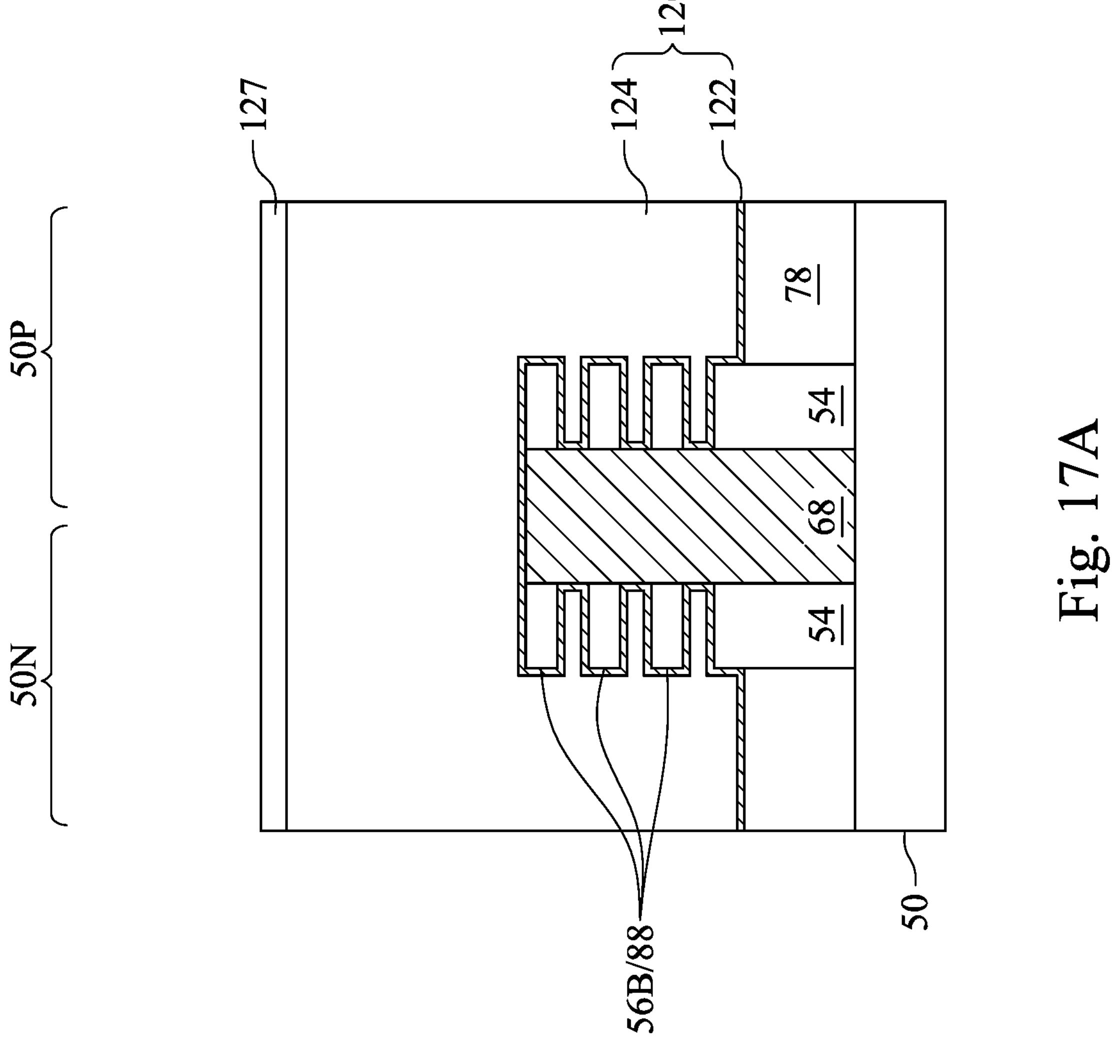
Figure 17B:
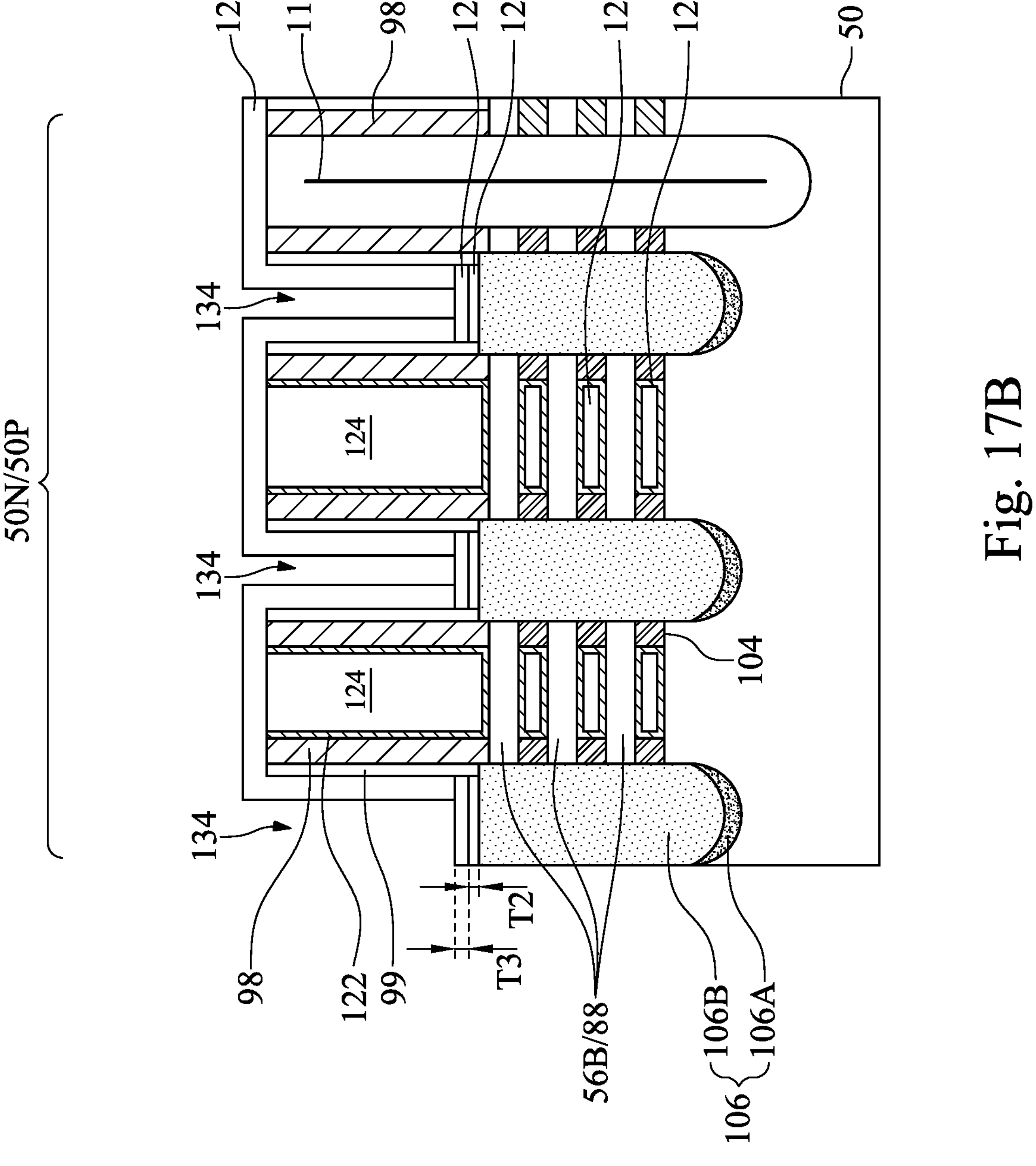
Figure 17C:
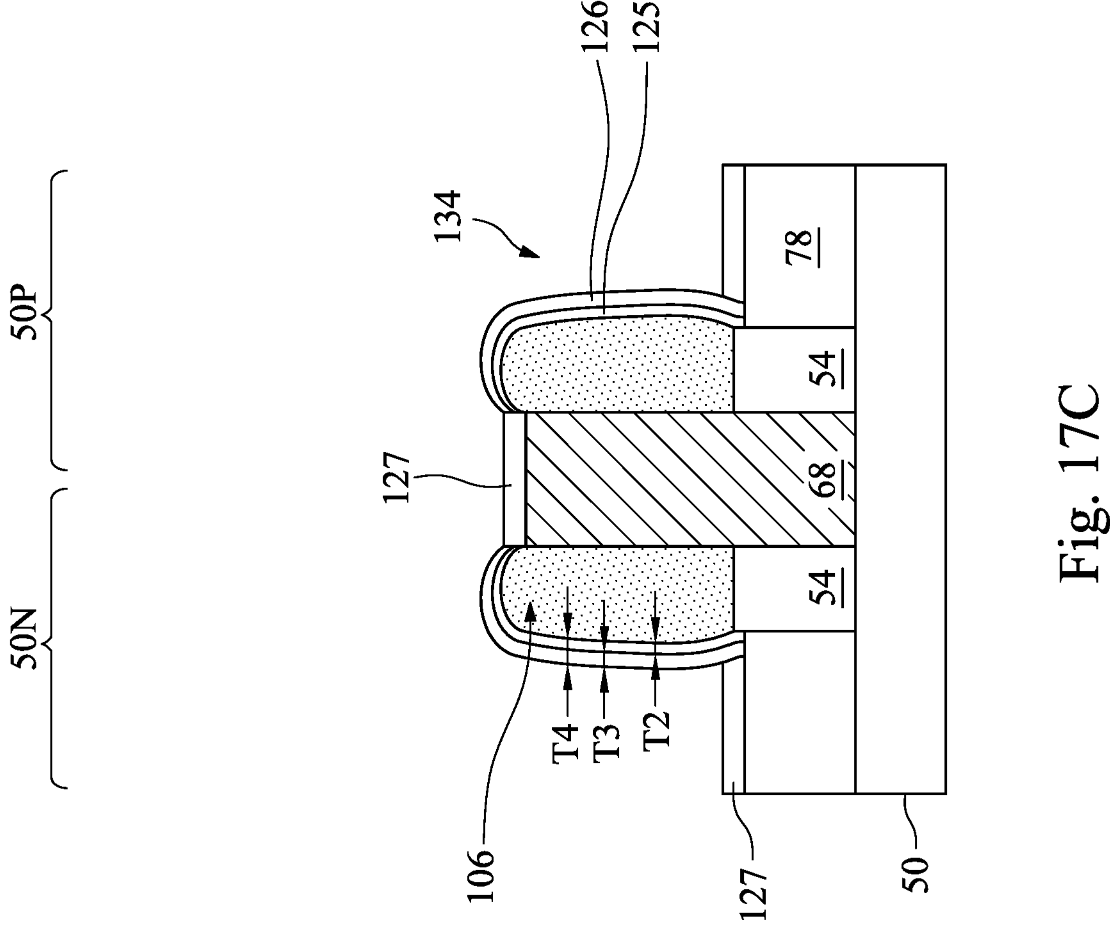

In FIGS. 17A-17C, metal-semiconductor alloy regions 125 are formed in the openings 134 on portions of the epitaxial source/drain regions 106 exposed by the openings 134. The metal-semiconductor alloy regions 125 can be silicide regions formed of a metal silicide (e.g., titanium silicide (TiSi), or the like). The metal-semiconductor alloy regions 125 may be formed on the exposed faceted top and side surfaces of the epitaxial source/drain regions 106, such that the metal-semiconductor alloy regions 125 are disposed on an entirety of a sidewall of each of the epitaxial source/drain regions 106, wherein the sidewall extends from a bottommost surface of the epitaxial source/drain region 106 to a topmost point of the epitaxial source/drain region 106. The metal-semiconductor alloy regions 125 are also disposed on a sidewall of each of the epitaxial source/drain regions 106 that extends from the topmost point of the epitaxial source/drain region 106 to a topmost point of an interface between the epitaxial source/drain region 106 and the dielectric wall 68. In an embodiment, the metal-semiconductor alloy regions 125 may have a thickness T2 that is in a range from 2 nm to 4 nm.

To form the metal-semiconductor alloy regions 125, a deposition process is performed to deposit a thin layer of titanium over the structure shown previously in FIGS. 16A-16C. The deposition process may be performed using a PVD process, a CVD process, or the like. During the deposition process, titanium tetrachloride ($TiCl_4$), or the like, can be used as a precursor gas for depositing the titanium layer. The titanium layer is deposited on portions of the epitaxial source/drain regions 106 exposed by the openings 134, as well as on top surfaces of the dielectric wall 68, the gate dielectrics 122, the gate electrodes 124, the dielectric layer 119, the isolation regions 78, the gate spacers 98, and top surfaces and sidewalls of the gate spacers 99. During the deposition process, a first plasma treatment is concurrently performed to provide a more energetic and controlled environment for a reaction between the titanium atoms in the titanium layer and silicon from the epitaxial source/drain regions 106. The first plasma treatment facilitates the silicidation process and the formation of the metal-semiconductor alloy regions 125. In an embodiment, the metal-semiconductor alloy regions 125 comprise titanium silicide (TiSi), or the like. The first plasma treatment may comprise exposing the titanium layer to a nitrogen ($N_2$) or an ammonia ($NH_3$) plasma.

After the deposition process and the first plasma treatment are performed, and after the metal-semiconductor alloy regions 125 have been formed on the portions of the epitaxial source/drain regions 106, a second plasma treatment may be performed that comprises exposing the metal-semiconductor alloy regions 125 to a nitrogen ($N_2$) or an ammonia ($NH_3$) plasma. In an embodiment, the first plasma treatment and the second plasma treatment may be the same. During the second plasma treatment, the metal-semiconductor alloy regions 125 can react with nitrogen species in the nitrogen ($N_2$) or ammonia ($NH_3$) plasma to form a coating layer 126 over the metal-semiconductor alloy regions 125. The coating layer 126 may comprise titanium silicon nitride (TiSiN), or the like. In an embodiment, the coating layer 126 may have a thickness T3 that is in a range from 1 nm to 4 nm.

Advantages can be achieved by forming the metal-semiconductor alloy regions 125 (comprising TiSi) and the coating layer 126 (comprising TiSiN) on portions of the epitaxial source/drain regions 106 exposed by the openings 134, wherein the thickness T2 of the metal-semiconductor alloy regions 125 is in a range from 2 nm to 4 nm, and the thickness T3 of the coating layer 126 is in a range from 1 nm to 4 nm. These include a lowering of the contact resistance between subsequently formed source/drain contacts 142 (shown in FIGS. 24A-24C) and the epitaxial source/drain regions 106. As a result, there is more efficient current flow through the source/drain contacts 142, power dissipation at the source/drain contacts 142 is minimized, and the output resistance (RO) is improved, allowing the nano-FETs to drive or deliver power to a load without significant voltage or current loss. For example, forming the metal-semiconductor alloy regions 125 having a thickness that is smaller than 2 nm will lead to an insufficient reduction in contact resistance between subsequently formed source/drain contacts 142 (shown in FIGS. 24A-24C) and the epitaxial source/drain regions 106, resulting in less efficient current flow through the source/drain contacts 142 and an insufficient improvement in device performance. Conversely, forming the metal-semiconductor alloy regions 125 having a thickness that is greater than 4 nm will not lead to any further significant reduction in contact resistance between subsequently formed source/drain contacts 142 (shown in FIGS. 24A-24C) and the epitaxial source/drain regions 106, resulting in increased manufacturing costs for no improvements in device performance.

Furthermore, forming the metal-semiconductor alloy regions 125 and the coating layer 126 over the larger exposed surface area (e.g., an increase in the exposed surface area that is in a range from 20 percent to 30 percent larger) of the epitaxial source/drain regions 106 has additional advantages. These include an increase in the effective area (e.g., an increase in area that is in a range from 20 to 30 percent) of the metal-semiconductor alloy regions 125 and the coating layer 126 on the epitaxial source/drain regions 106, which allows for an even greater reduction in contact resistance between the subsequently formed source/drain contacts 142 (shown in FIGS. 24A-24C) and the epitaxial source/drain regions 106. As a result, there is even more efficient current flow through the source/drain contacts 142, power dissipation at the source/drain contacts 142 is further minimized, and the output resistance (RO) is further improved, allowing the nano-FETs to drive or deliver power to a load with even lower voltage or current losses.

Further advantages can be achieved by forming the coating layer 126 over the metal-semiconductor alloy regions 125. These include the coating layer 126 preventing the oxidation of surfaces of the underlying metal-semiconductor alloy regions 125, which could result in degraded electrical performance and increase the contact resistance between subsequently formed source/drain contacts 142 (shown in FIGS. 24A-24C) and the epitaxial source/drain regions 106. As a result, device performance is enhanced and device yield is improved. For example, forming the coating layer 126 having a thickness that is smaller than 1 nm will lead to an insufficient protection to prevent the oxidation of the underlying metal-semiconductor alloy regions 125, and this will result in degraded electrical performance and an increase in the contact resistance between subsequently formed source/drain contacts 142 (shown in FIGS. 24A-24C) and the epitaxial source/drain regions 106. Conversely, forming the coating layer 126 having a thickness that is greater than 4 nm will not lead to any further improvement in preventing the oxidation of the underlying metal-semiconductor alloy regions 125, resulting in added manufacturing costs.

In an embodiment, a combined thickness T4 of the metal-semiconductor alloy regions 125 and the coating layer 126 may be in a range from 3 nm to 8 nm. The thicknesses T2, T3, and T4, can be varied by adjusting specific process parameters of the deposition process, the first plasma treatment, and the second plasma treatment, such as power, gas composition, pressure, and treatment time.

As a result of the deposition process described above, the titanium layer is also deposited on top surfaces of the dielectric wall 68, the gate dielectrics 122, the gate electrodes 124, the dielectric layer 119, the isolation regions 78, the gate spacers 98, and top surfaces and sidewalls of the gate spacers 99. As a result of the first plasma treatment and the second plasma treatment, the titanium layer on the top surfaces of the dielectric wall 68, the gate dielectrics 122, the gate electrodes 124, the dielectric layer 119, the isolation regions 78, the gate spacers 98, and the top surfaces and the sidewalls of the gate spacers 99 reacts with nitrogen species in the nitrogen ($N_2$) or ammonia ($NH_3$) plasma to form a residual layer 127. This residual layer 127 is unintentionally formed on the top surfaces of the dielectric wall 68, the gate dielectrics 122, the gate electrodes 124, the dielectric layer 119, the isolation regions 78, the gate spacers 98, and top surfaces and sidewalls of the gate spacers 99. For example, this residual layer 127 is also formed along sidewalls in the openings 134. A material composition of the residual layer 127 may differ based on the specific structure it is formed on, because the material composition of the residual layer 127 is influenced by the underlying materials it interacts with during the first plasma treatment and the second plasma treatment. The residual layer 127 may comprise titanium silicon nitride (TiSiN), titanium nitride (TiN), a combination thereof, or the like. For example, in an embodiment, first portions of the residual layer 127 on top surfaces of the gate electrodes 124 may comprise TiN. In an embodiment, second portions of the residual layer 127 on top surfaces of the dielectric wall 68, the gate dielectrics 122, the dielectric layer 119, the isolation regions 78, the gate spacers 98, and top surfaces and sidewalls (e.g., sidewalls in the openings 134) of the gate spacers 99 may comprise TiSiN.

Figure 18A:
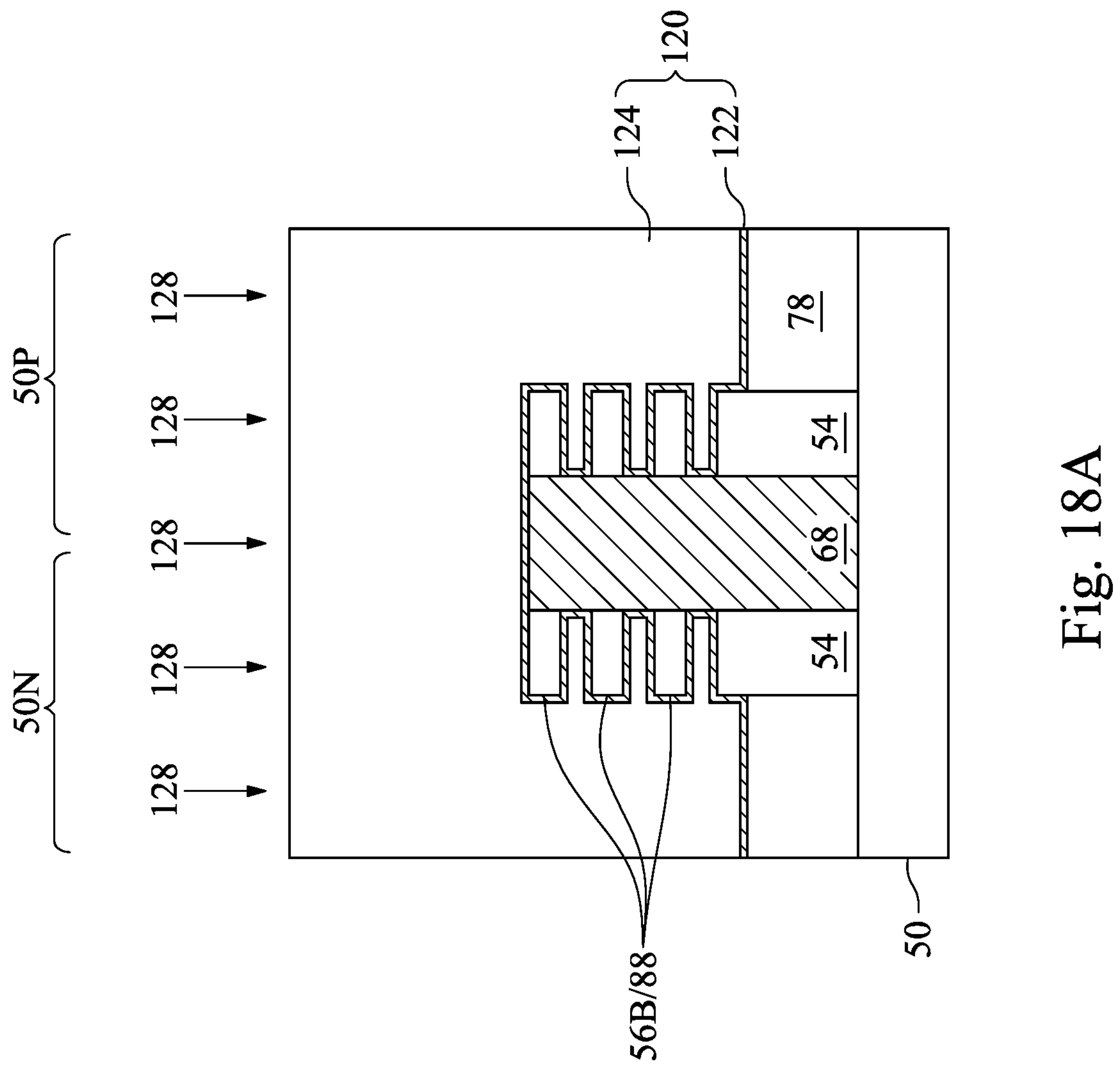
Figure 18B:
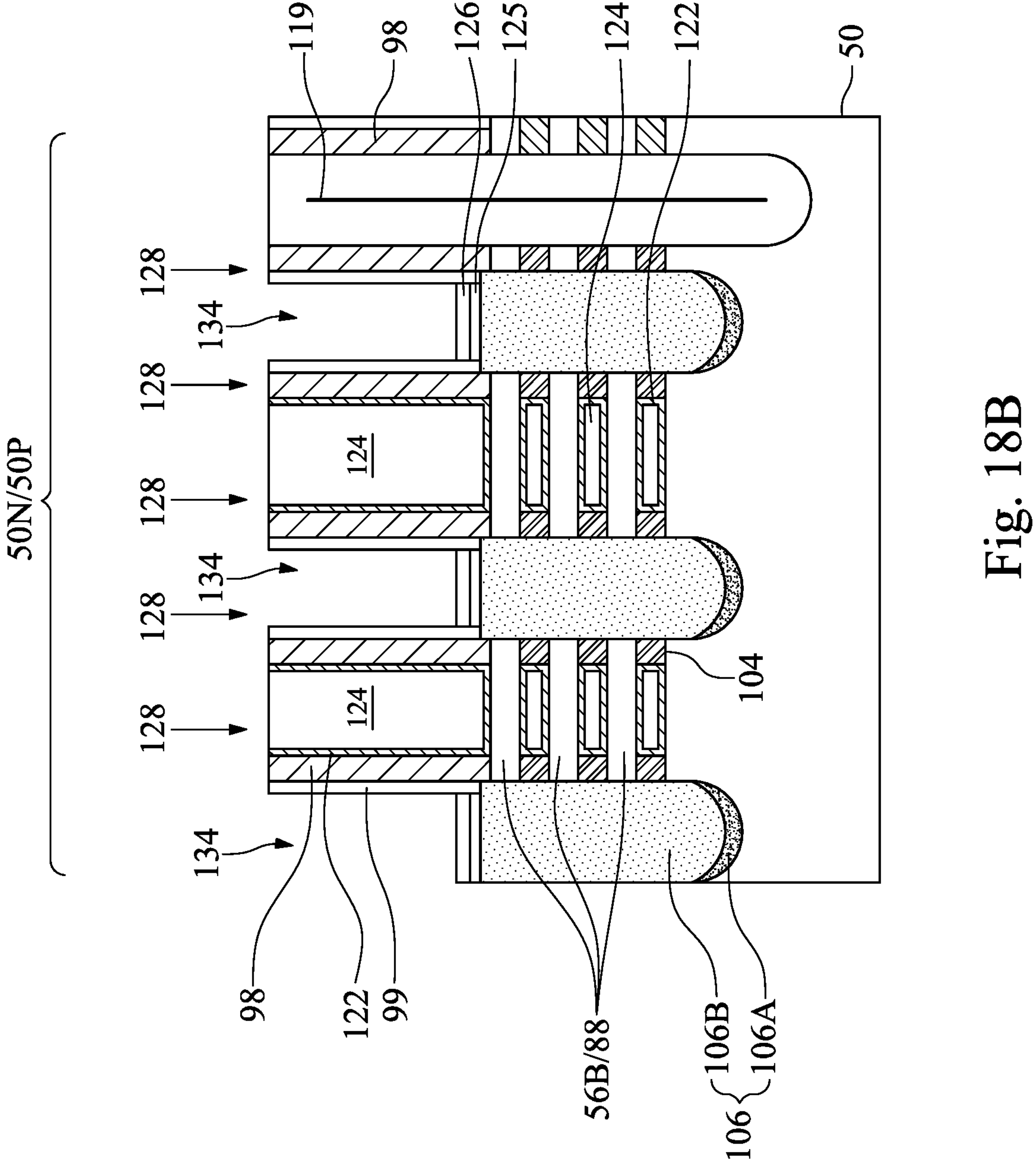
Figure 18C:
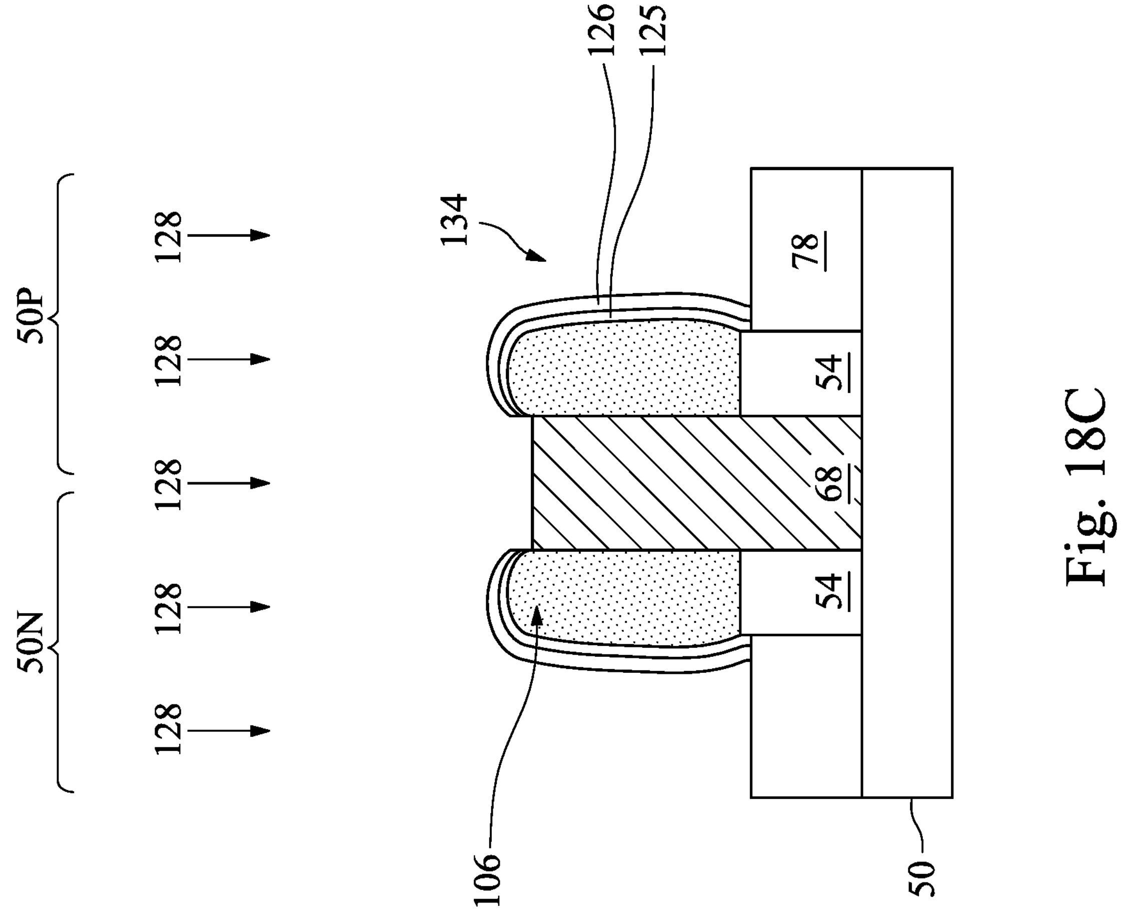

In FIGS. 18A-18C, a wet clean process 128 is performed to selectively remove (e.g., by etching) the residual layer 127 from the top surfaces of the dielectric wall 68, the gate dielectrics 122, the gate electrodes 124, the dielectric layer 119, the isolation regions 78, the gate spacers 98, and the top surfaces and the sidewalls (e.g., sidewalls within the openings 134) of the gate spacers 99, while leaving the metal-semiconductor alloy regions 125 and the coating layer 126 on the epitaxial source/drain regions 106. The metal-semiconductor alloy regions 125 and the coating layer 126 disposed over the epitaxial source/drain regions 106 are not removed (e.g., have much lower etch rates as compared to the residual layer 127) during the wet clean process 128. For example, a ratio of an etch rate of the residual layer 127 to an etch rate of the metal-semiconductor alloy regions 125 and the coating layer 126 is in a range from 4 to 8.7. In this way, the TiN and TiSiN of the residual layer 127 is preferentially removed using the wet clean process 128, while the metal-semiconductor alloy regions 125 (e.g., comprising TiSi) and the coating layer 126 (e.g., comprising TiSiN) that are disposed over the epitaxial source/drain regions 106 are left substantially intact on the epitaxial source/drain regions 106, as a result of the wet clean process 128.

The wet clean process 128 may be a wet etch process that comprises exposing the structure shown previously in FIGS. 17A-17C (e.g., including the residual layer 127) to sulfuric acid ($H_2SO_4$) that is at a temperature that is in a range from 130° C. to 230° C. In an embodiment, the sulfuric acid may have a concentration that is in a range from 85 percent to 90 percent by weight. In other embodiments, the wet etch process comprises exposing the structure shown previously in FIGS. 17A-17C (e.g., including the residual layer 127) to sulfuric acid ($H_2SO_4$) that is at a temperature that is above 130° C., wherein the sulfuric acid has a concentration that is higher than 90 percent by weight. The wet clean process 128 may be performed for a duration of time that is in a range from 5 seconds to 60 seconds.

In alternate embodiments, the wet clean process 128 may comprise a wet etch process that comprises exposing the structure shown previously in FIGS. 17A-17C (e.g., including the residual layer 127) to a sulfonic acid (e.g., methanesulfonic acid ($CH_3SO_3H$), N-sulfonic acid (N—$SO_3H$), benzenesulfonic acid ($C_6H_5SO_3H$), chlorosulfonic acid ($HSO_3Cl$), or the like) or its derivatives (e.g., benzenesulfonyl chloride ($C_6H_5SO_2Cl$), a sulfonamide, or the like).

Advantages can be achieved by performing the wet clean process 128 to selectively remove the residual layer 127 from the top surfaces of the dielectric wall 68, the gate dielectrics 122, the gate electrodes 124, the dielectric layer 119, the isolation regions 78, the gate spacers 98, and the top surfaces and the sidewalls (e.g., sidewalls within the openings 134) of the gate spacers 99, while leaving the metal-semiconductor alloy regions 125 and the coating layer 126 on the epitaxial source/drain regions 106. The wet clean process 128 is performed using sulfuric acid ($H_2SO_4$) as an etchant, and is performed while the sulfuric acid ($H_2SO_4$) is at a temperature that is in a range from 130° C. to 230° C. The sulfuric acid ($H_2SO_4$) may have a concentration that is in a range from 85 percent to 90 percent by weight. These advantages include the wet clean process 128 allowing for the selective etching of the titanium silicon nitride (TiSiN) and titanium nitride (TiN) of the residual layer 127 (e.g., on sidewalls in the openings 134) formed during the formation of the metal-semiconductor alloy regions 125 and the coating layer 126 on the epitaxial source/drain regions 106, while minimizing etch damage to the metal-semiconductor alloy regions 125 (comprising TiSi) and the coating layer 126 (comprising TiSiN). As a result, subsequently formed source/drain contact openings 141 (shown in FIGS. 23A-23C) for source/drain contacts 142 (shown in FIGS. 24A-24C) can be formed having larger widths to ensure lower contact resistance, better electrical contact, and a larger contact surface area between the epitaxial source/drain regions 106 and the source/drain contacts 142. This is because there is no residual layer 127 present on the sidewalls of the opening 134 that could hinder the subsequent formation of the source/drain contact openings 141 and the source/drain contacts 142, and which would impede electrical contact between the epitaxial source/drain regions 106 and the source/drain contacts 142. This therefore results in enhanced device performance and improved device yield. Furthermore, the removal of the residual layer 127 on the top surfaces of the gate dielectrics 122 and the gate electrodes 124 ensures better electrical contact between the gate electrodes 124 and subsequently formed gate contacts 140 (shown in FIGS. 24A-24C).

Figure 19A:
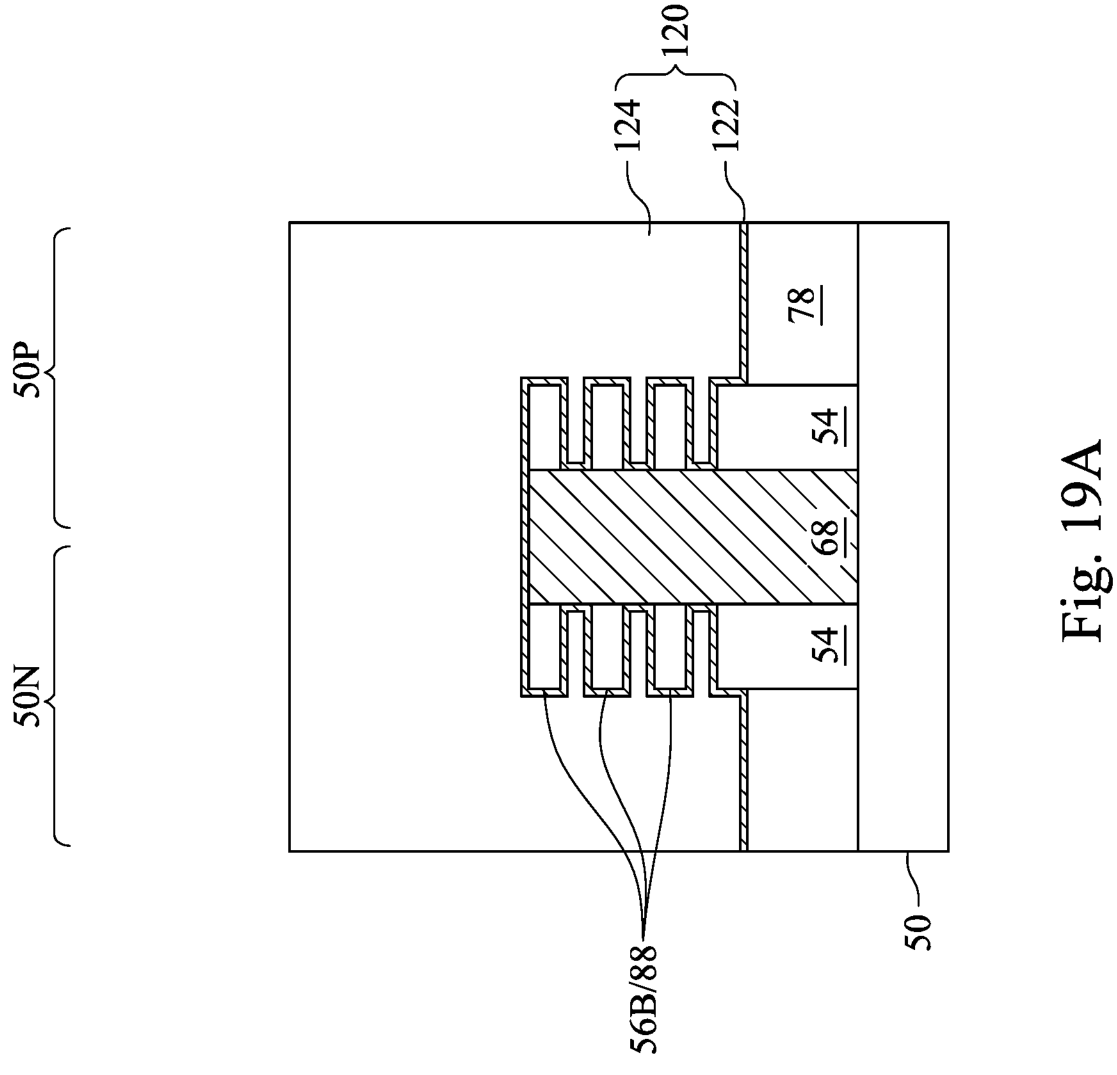
Figure 19B:
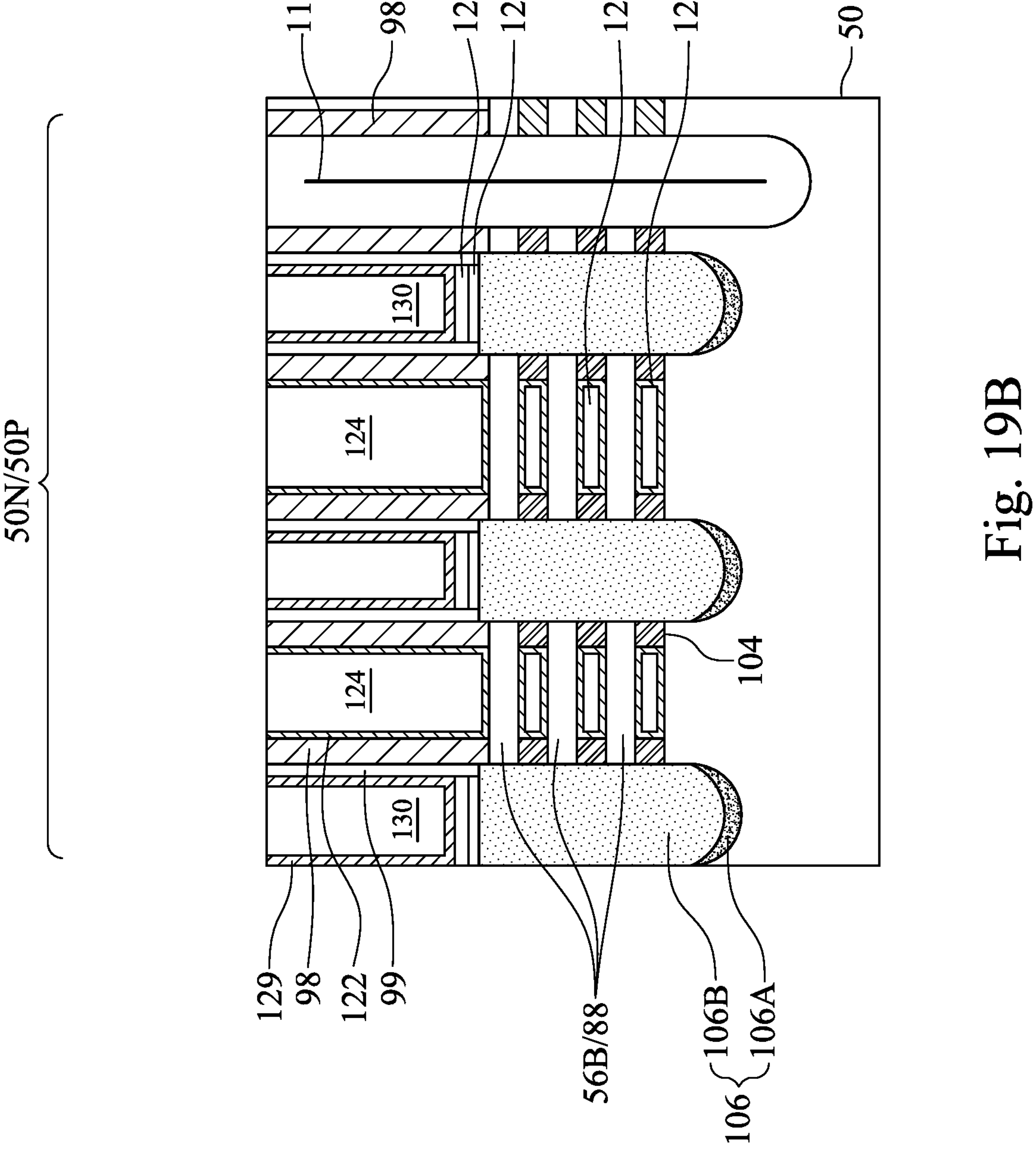
Figure 19C:
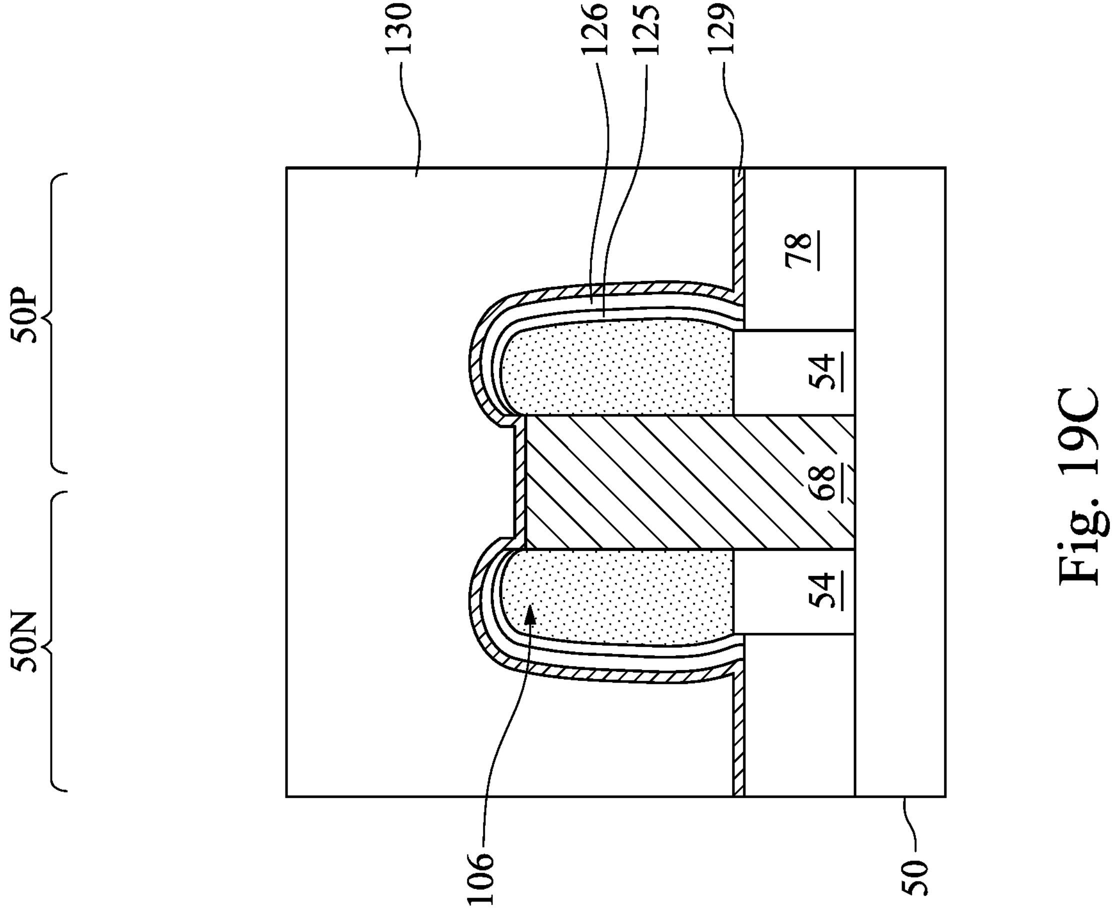

In FIGS. 19A-19C, a dielectric layer 130 is deposited over the structure shown previously in FIGS. 18A-18C, such as over the dielectric wall 68, the gate dielectrics 122, the gate electrodes 124, the dielectric layer 119, the isolation regions 78, the gate spacers 98, and the gate spacers 99. The dielectric layer 130 is also deposited over the metal-semiconductor alloy regions 125 and the coating layer 126 in the openings 134, and on sidewalls within the opening 134 in order to fill the openings 134. The dielectric layer 130 may comprise silicon oxide, silicon nitride, or the like. The dielectric layer 130 may be deposited using any suitable method, such as CVD, plasma-enhanced CVD (PECVD), FCVD, or the like.

After the deposition of the dielectric layer 130, a planarization process is performed to level top surfaces of the dielectric layer 130 with top surfaces of the gate dielectrics 122, the gate electrodes 124, the dielectric layer 119, the gate spacers 98, and the gate spacers 99. The planarization process may be a CMP process, or the like.

In some embodiments, a contact etch stop layer (CESL) 129 is disposed between the dielectric layer 130 and the coating layer 126. In addition, the CESL 129 may be disposed between the dielectric layer 130 and the sidewalls of the gate spacers 99. The CESL 129 may include a dielectric material, such as, silicon oxynitride, or the like, having a high etching selectivity from the etching of the dielectric layer 130.

FIGS. 20A through 21D illustrate a process for dividing the gate structures 120 (including the gate dielectrics 122 and the gate electrodes 124) into multiple gate structures 120 (or gate structure segments). The gate structures 120 of adjacent nano-FETs may thus be separately controlled. Dividing a gate structure 120 includes forming a gate isolation structure extending through the gate structure 120, such that the gate isolation structure cuts the gate structure 120 into at least two gate structures 120. The gate isolation structure is formed by patterning a trench in the gate structure 120, and forming a dielectric material in the trench. In this way the gate isolation structure may be disposed between a first gate structure 120 and a second gate structure 120 on either side of the gate isolation structure.

Figure 20A:
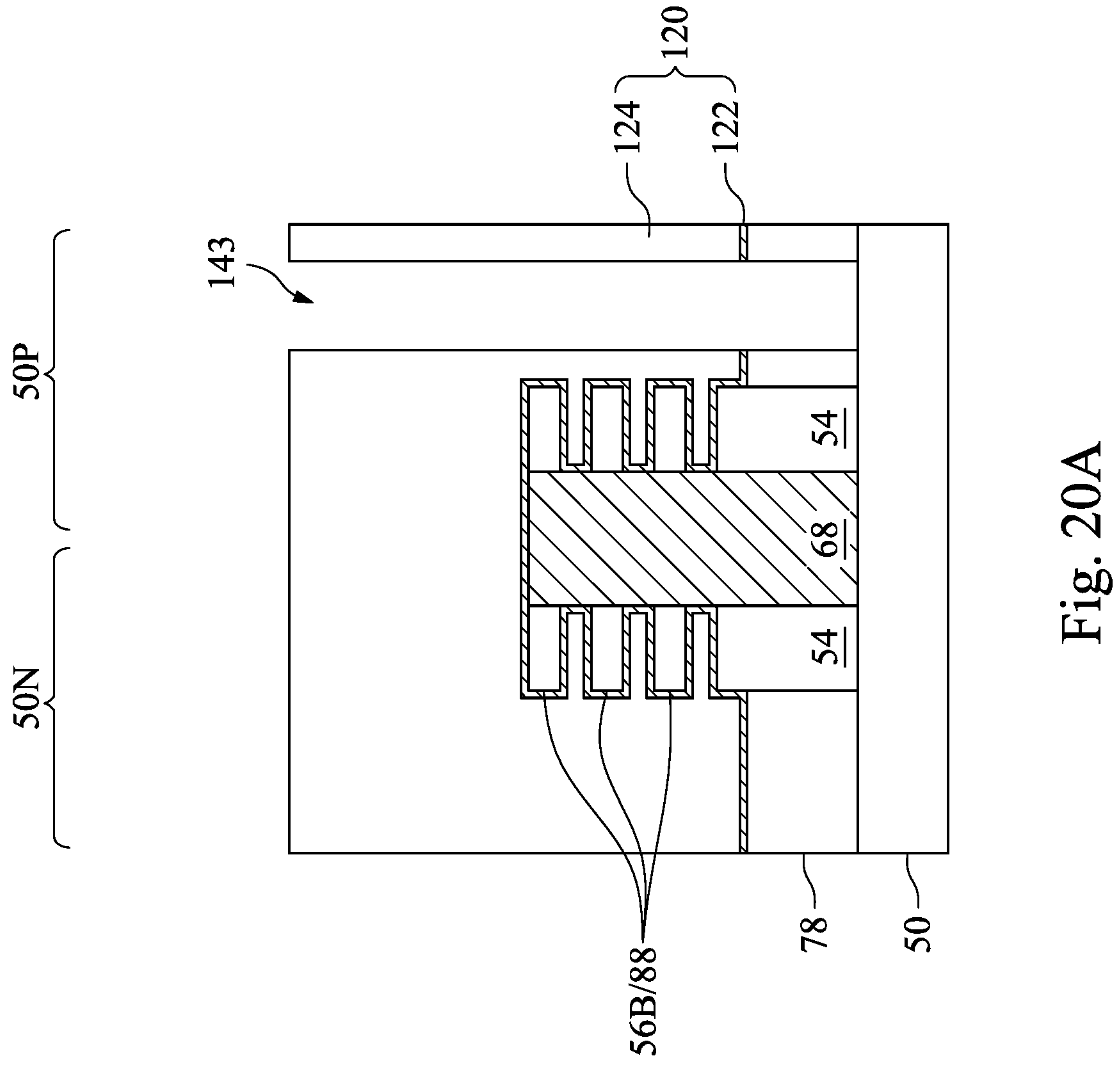
Figure 20B:
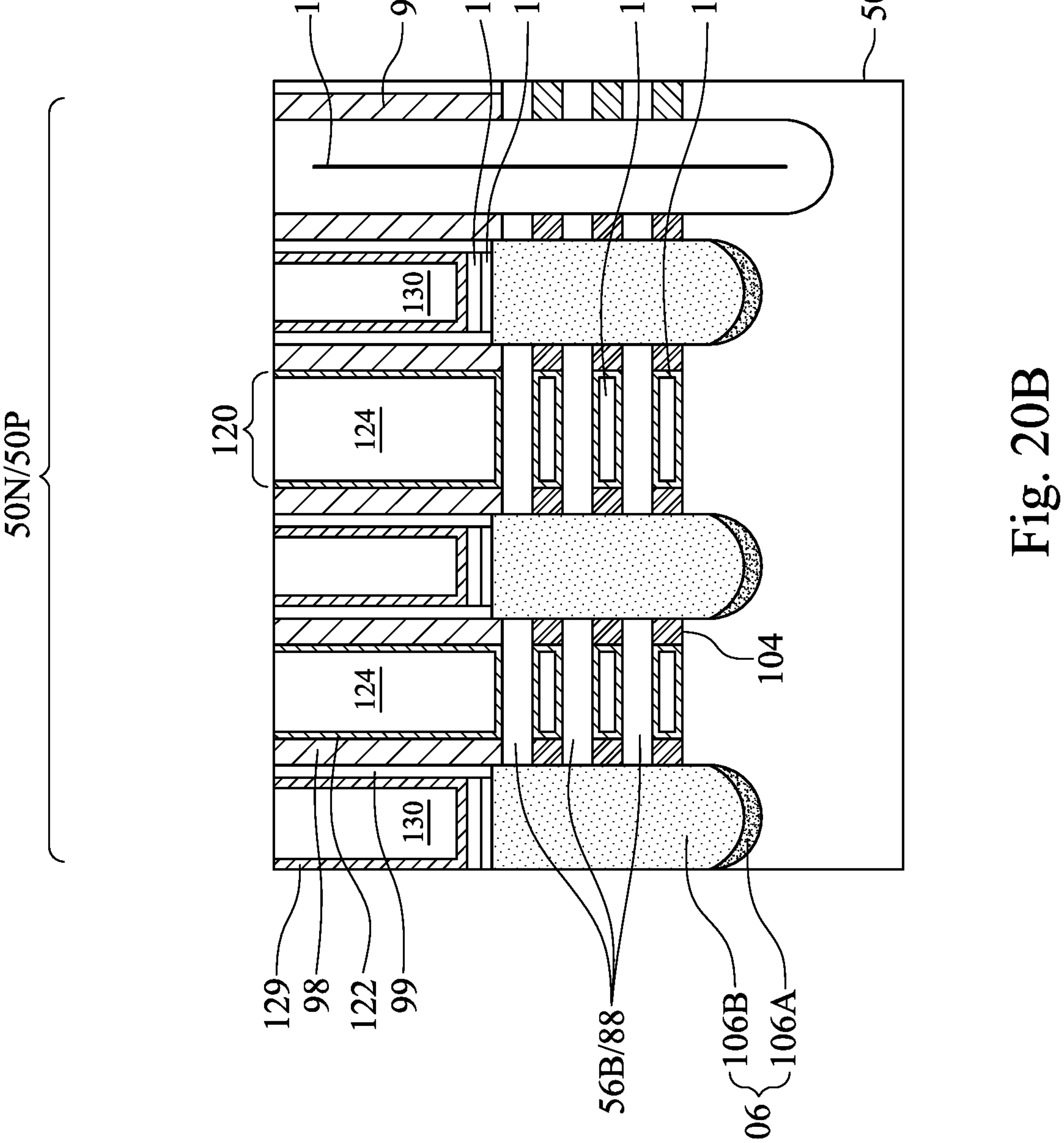

In FIGS. 20A-20B, a trench 143 is formed through a gate structure 120 (including a gate dielectric 122 and a gate electrode 124). The trench 143 may also be formed through the gate spacers 98, the gate spacers 99, the CESL 129, and the dielectric layer 130 that are adjacent to the gate structure 120. The trench 143 may extend completely through the gate structure 120 and partially into the isolation regions 78. In an embodiment, the trench 143 may extend completely through the isolation regions 78 and expose a top surface of the substrate 50. Although the trench 143 is illustrated in FIGS. 20A and 20B as being formed in the p-type region 50P, the trench 143 can be formed in any of the n-type region 50N or the p-type region 50P. To form the trench 143, a first hard mask layer and a second hard mask layer may be formed successively over the structure shown previously in FIGS. 19A-19C using processes such as CVD, ALD, or the like. In some embodiments, the first hard mask layer is a metal hard mask layer (e.g., comprising titanium nitride, or the like) and the second hard mask layer is a dielectric hard mask layer (e.g., comprising silicon nitride, or the like). In subsequent processing, a pattern is transferred onto the first hard mask layer and the second hard mask layer using various photolithography and etching techniques. An etching process is then performed using the first hard mask layer as an etching mask to etch the underlying structure (e.g., the gate structure 120, the gate spacers 98, the gate spacers 99, the CESL 129, and the dielectric layer 130) in order to form the trench 143. The etching process used to form the trench 143 may be anisotropic. For example, the etching process may be a dry etch such as a RIE, a NBE, or the like. Forming the trench 143 divides the gate structure 120 into at least two gate structures 120. For example, the trench 143 may divide the gate structure 120 into a gate structure 120A and a gate structure 120B (shown subsequently in FIG. 21D) on either side of the trench 143. The trench 143 may also be wider than the gate structure 120 in a top-down view, such that the trench 143 is formed in the gate spacers 98, the gate spacers 99, the CESL 129, and the dielectric layer 130. The trench 143 is formed to a size that is large enough to electrically isolate a first gate structure 120 from a second gate structure 120.

The shape and the depth of the trench 143 illustrated in FIG. 20A is a non-limiting example, other shapes and depths for the trench 143 are also possible, and are fully intended to be included within the scope of the present disclosure.

Figure 21A:
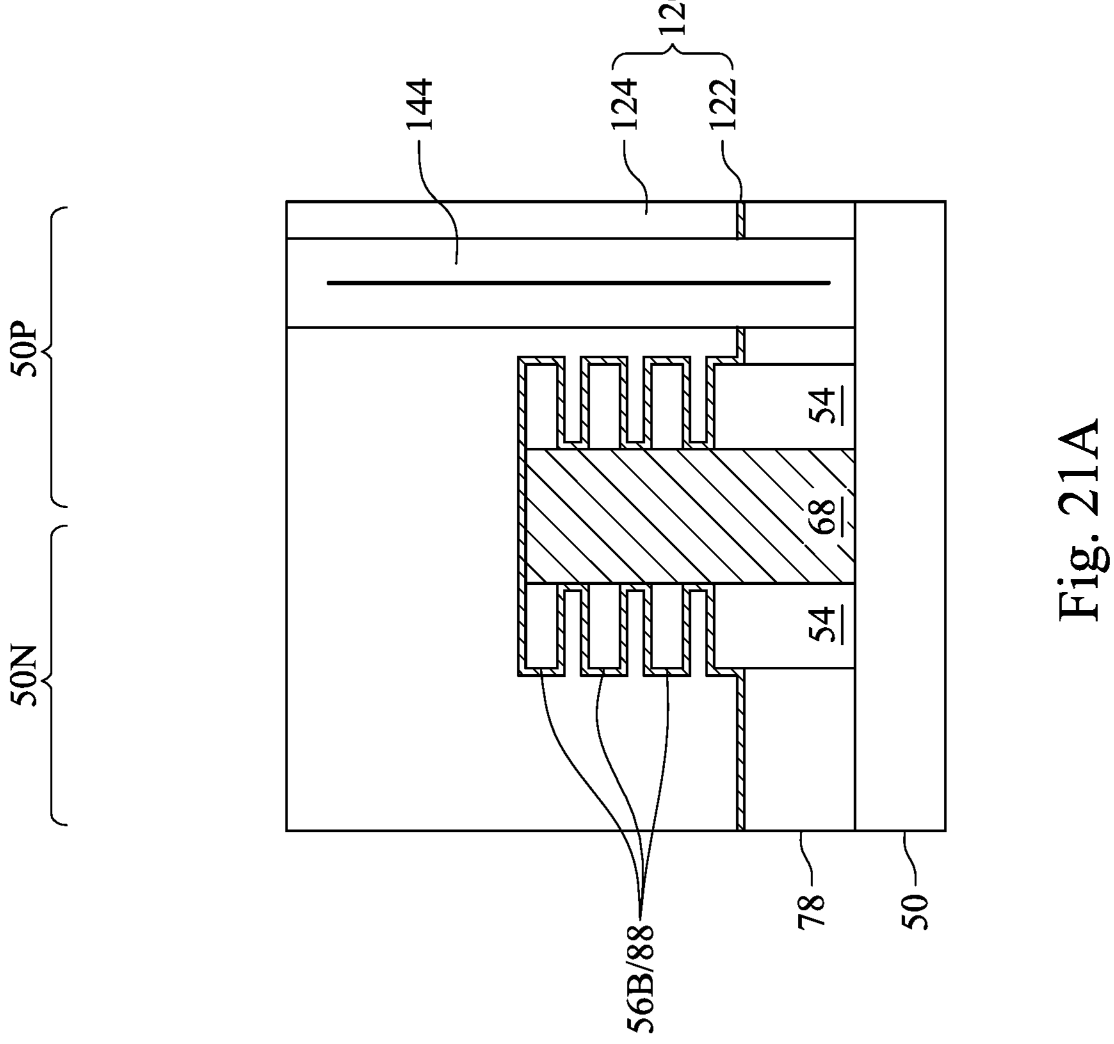
Figure 21B:
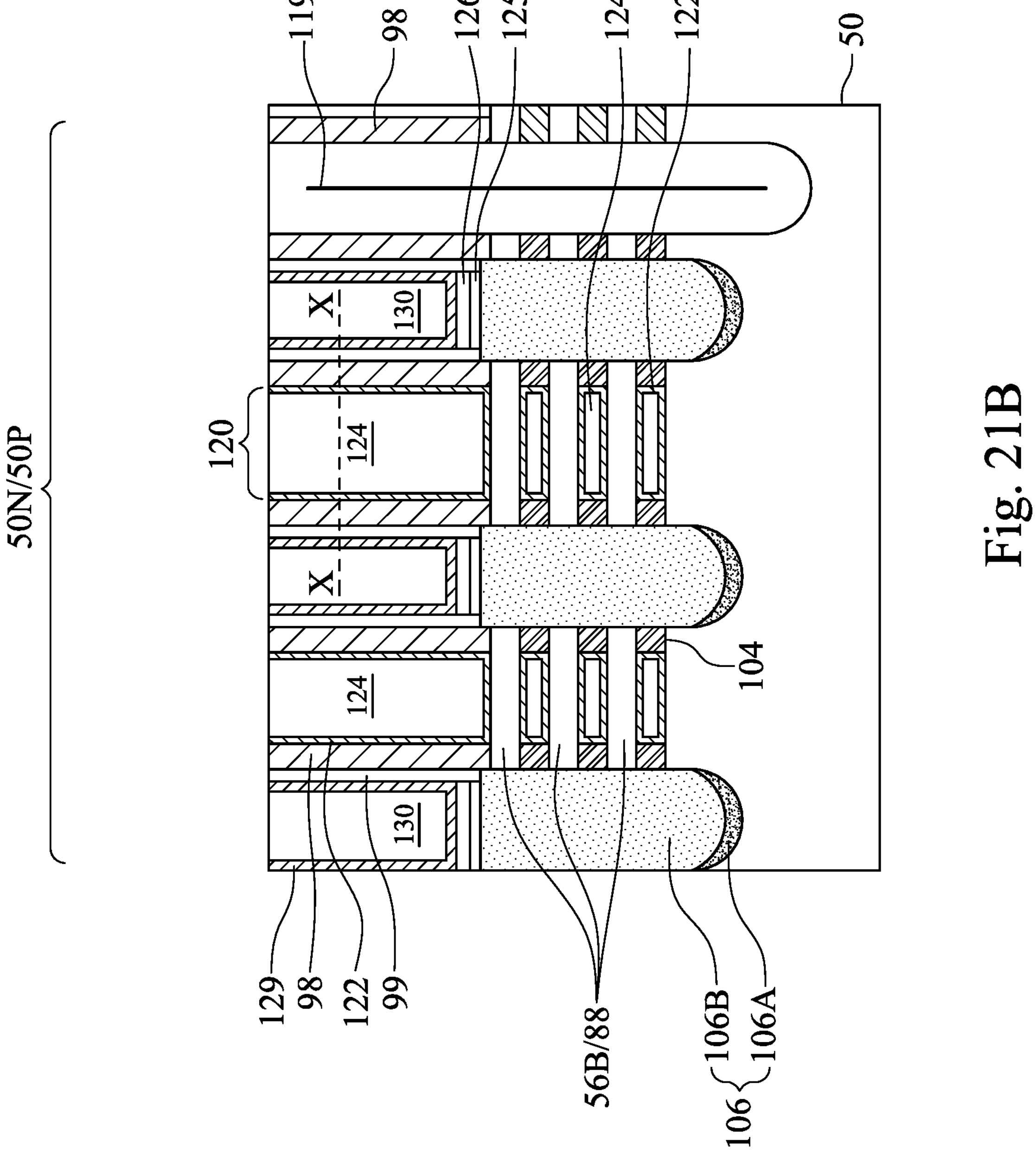
Figure 21C:
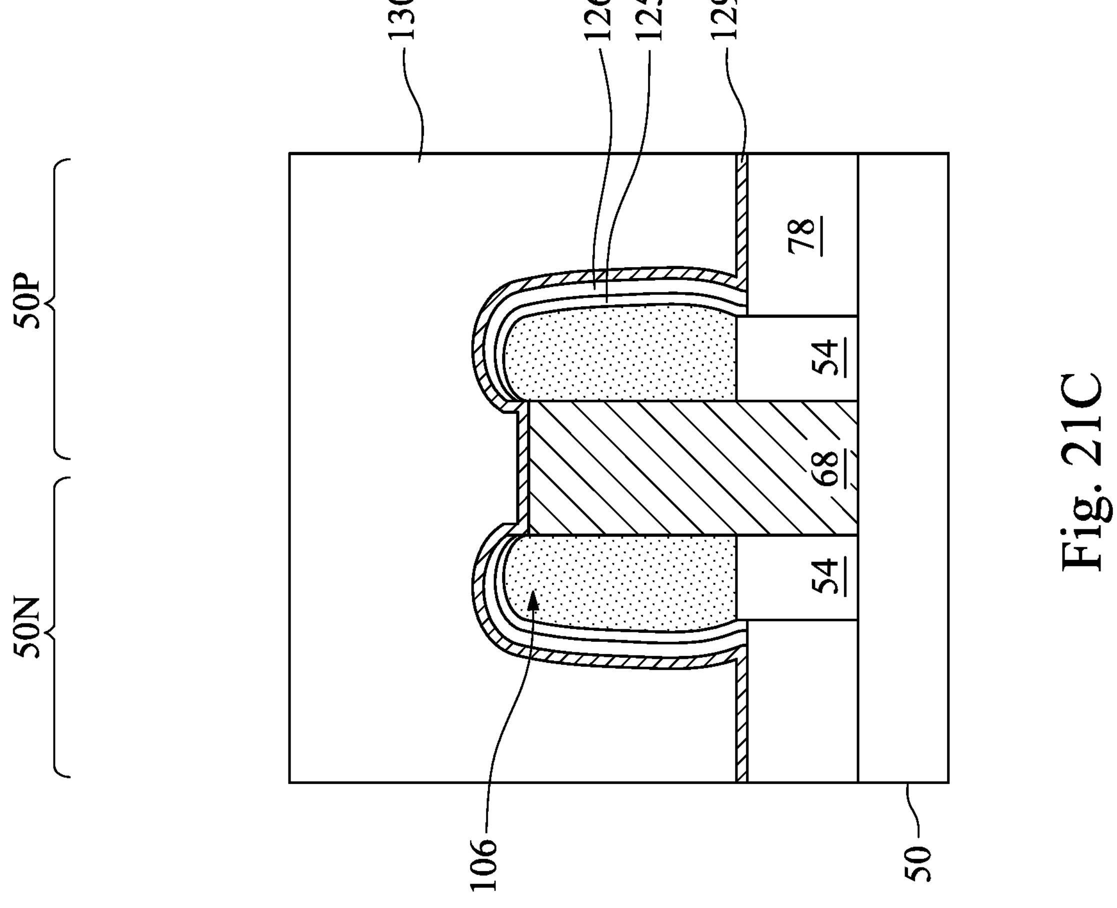
Figure 21D:
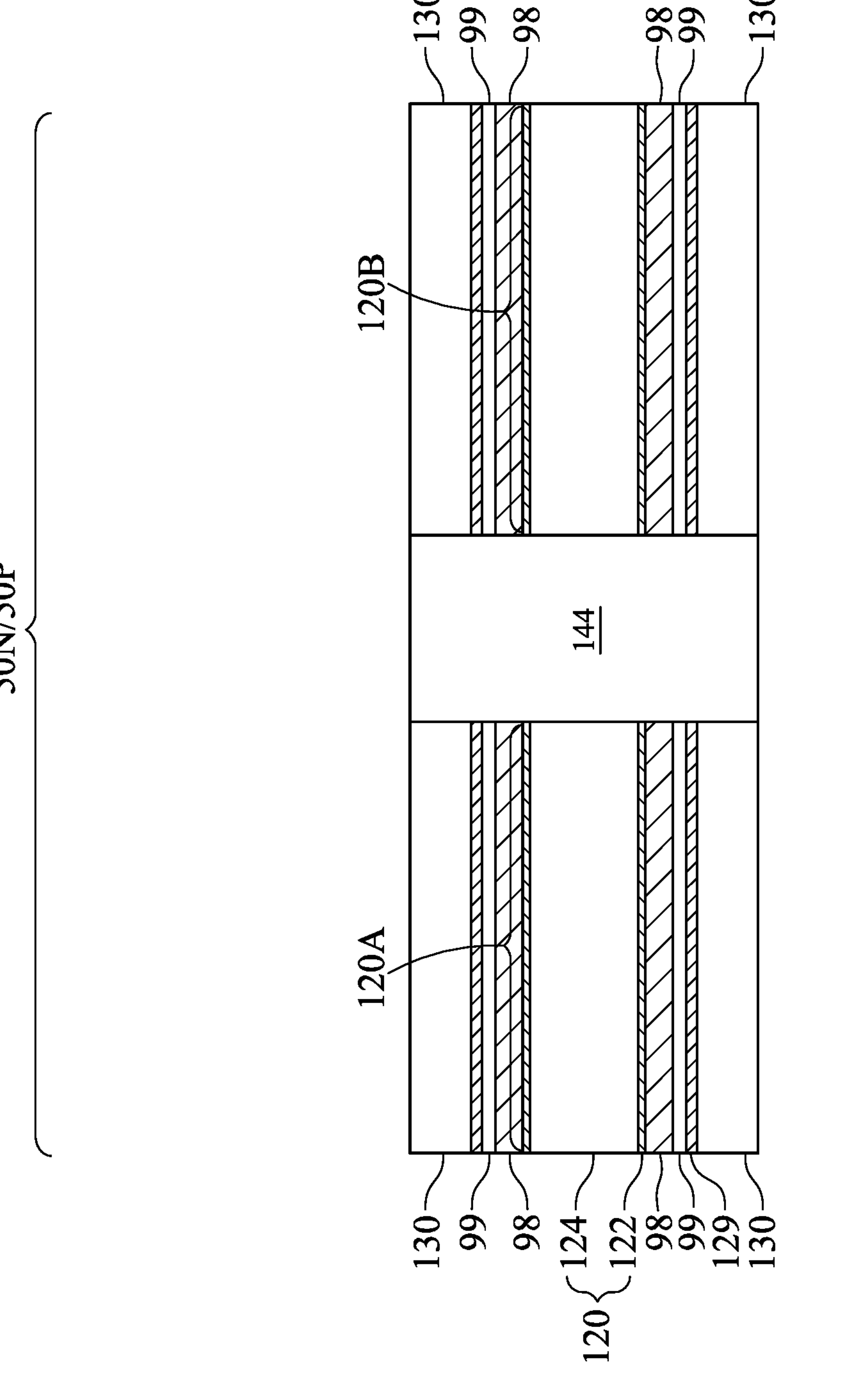

Next, in FIGS. 21A-21D, a dielectric layer 144 is formed over the structure shown previously in FIGS. 20A and 20B, such as over the gate dielectrics 122, the gate electrodes 124, the dielectric layer 119, the CESL 129, the dielectric layer 130, the gate spacers 98, the gate spacers 99, and in the trench 143 in order to fill the trench 143. FIG. 21D illustrates a top-down view along a cross-section X-X that is shown in FIG. 21B. In some embodiments, the dielectric layer 144 is formed to be a conformal layer, that is deposited on sidewalls and a bottom surface of the trench 143, till the trench 143 is filled.

In the illustrated embodiments, the dielectric layer 144 may comprise silicon nitride, silicon oxide, or the like, and may be formed using a plasma-enhanced atomic layer deposition (PEALD) process, an ALD process, a CVD process, or the like.

After the formation of the dielectric layer 144, a removal process is then applied to the dielectric layer 144 to remove excess material of the dielectric layer 144. In some embodiments, a planarization process such as a chemical mechanical polish (CMP), an etch-back process, combinations thereof, or the like may be utilized. After the planarization process, top surfaces of the gate dielectrics 122, the gate electrodes 124, the dielectric layer 119, the CESL 129, the dielectric layer 130, the gate spacers 98, the gate spacers 99, and the remaining portions of the dielectric layer 144 in the trench 143 are coplanar (within process variations). After the planarization process, the remaining portions of the dielectric layer 144 in the trench 143 may also be referred to subsequently as a gate isolation structure. FIG. 21D illustrates that the dielectric layer 144 divides the gate structure 120 into two gate structures 120. For example, the dielectric layer 144 may divide the gate structure 120 into a gate structure 120A and a gate structure 120B on either side of the dielectric layer 144.

In alternative embodiments, the processes for forming the dielectric layer 144 (e.g., the gate isolation structure) described above in FIGS. 20A through 21D can also be performed at the same time, before, or after the process for forming the dielectric layer 119 that was described previously in FIGS. 12A through 13B. For example, in an embodiment where the dielectric layer 144 is formed at the same time as the dielectric layer 119, or where the dielectric layer 144 is formed before the formation of the openings 134 (described previously in FIGS. 16A-16C), and the metal-semiconductor alloy regions 125 and coating layer 126 (described previously in FIGS. 17A-17C), the formation of the metal-semiconductor alloy regions 125 and coating layer 126 results in the formation of the residual layer 127 (comprising TiSiN) on top surfaces of the dielectric layer 144. During the wet clean process 128 (described previously in FIGS. 18A-18C) the residual layer 127 (comprising TiSiN) on the top surface of the dielectric layer 144, as well as the residual layer 127 on the top surfaces of the dielectric wall 68, the gate dielectrics 122, the gate electrodes 124, the dielectric layer 119, the isolation regions 78, the gate spacers 98, and the top surfaces and the sidewalls (e.g., sidewalls within the openings 134) of the gate spacers 99 is selectively removed while leaving the metal-semiconductor alloy regions 125 and the coating layer 126 on the epitaxial source/drain regions 106.

Figure 22A:
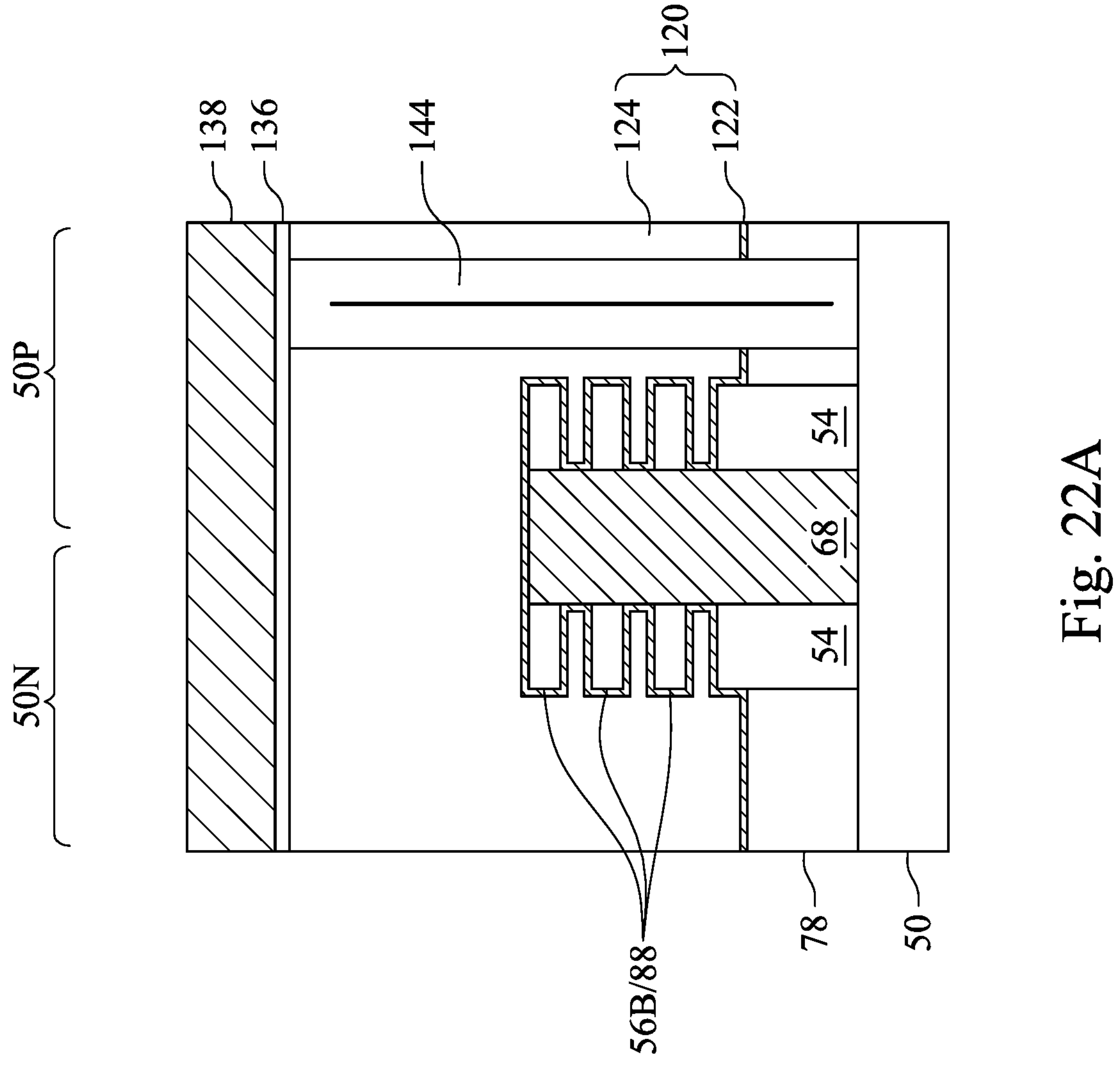
Figure 22B:
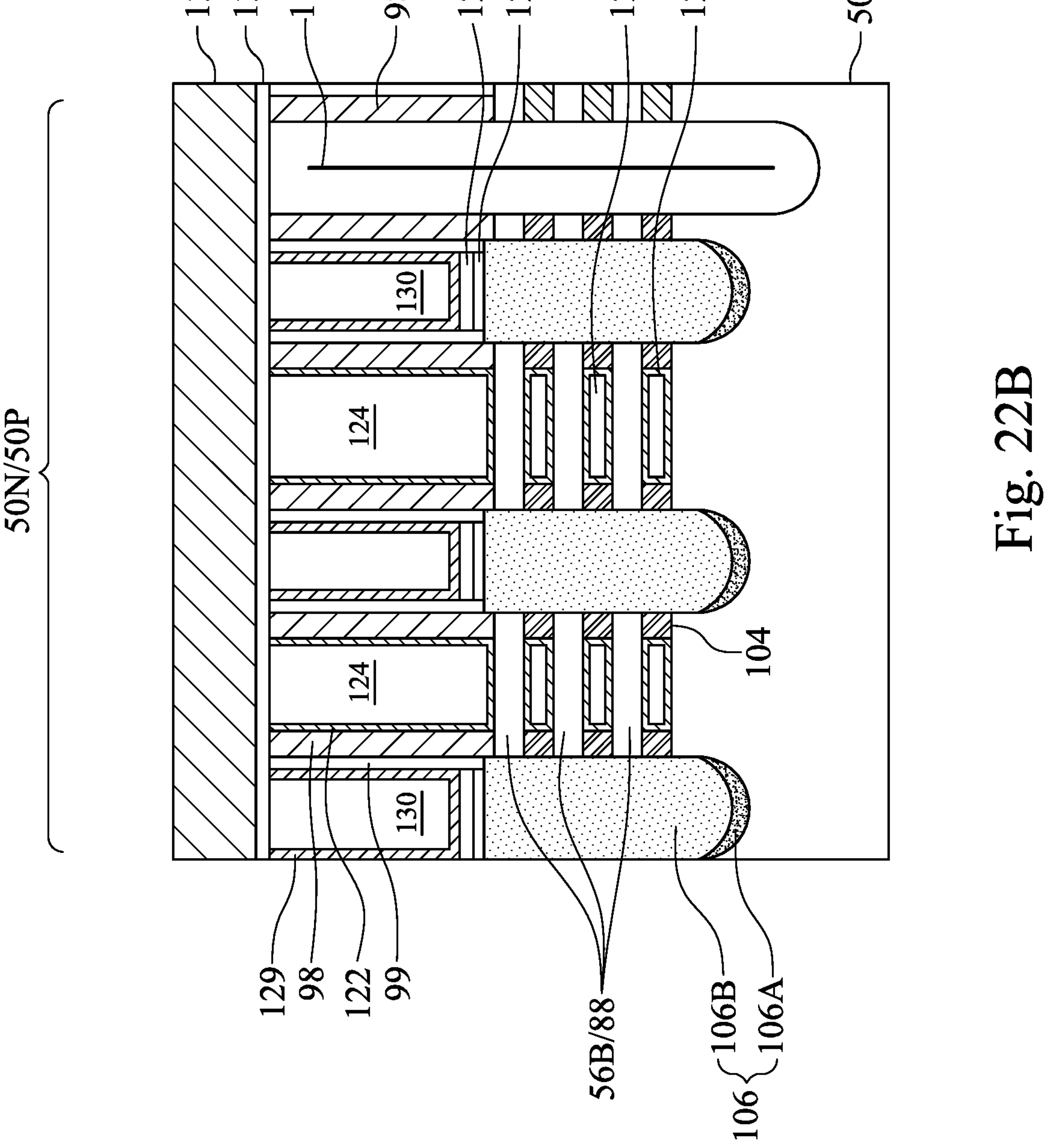
Figure 22C:
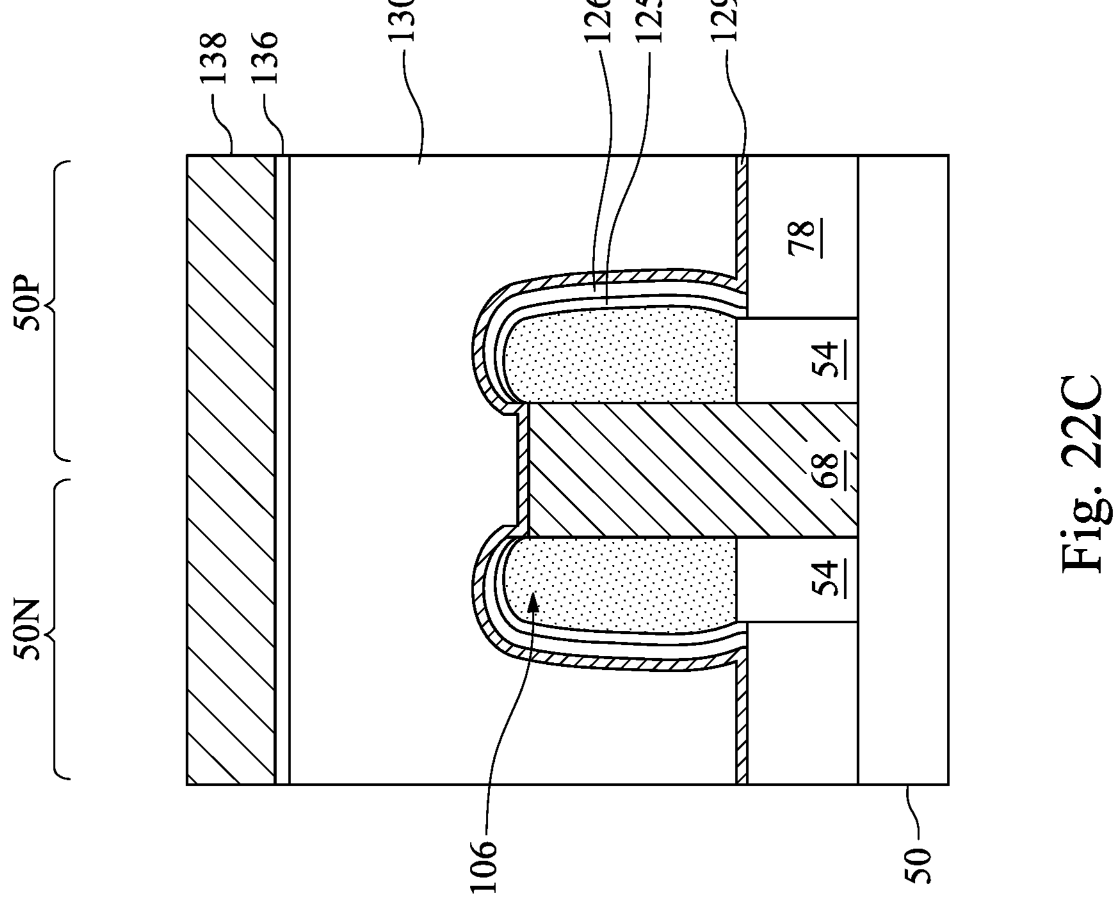

In FIGS. 22A-22C, a second ILD 138 is deposited over the gate dielectrics 122, the gate electrodes 124, the dielectric layer 119, the CESL 129, the dielectric layer 130, the gate spacers 98, the gate spacers 99, and the dielectric layer 144. In some embodiments, the second ILD 138 is a flowable film formed by a flowable CVD method. In some embodiments, the second ILD 138 is formed of a dielectric material such as PSG, BSG, BPSG, USG, or the like, which may be formed by any suitable deposition process, such as CVD, PECVD, FCVD, or the like.

In some embodiments, an etch stop layer (ESL) 136 is formed between the second ILD 138 and the gate dielectrics 122, the gate electrodes 124, the dielectric layer 119, the CESL 129, the dielectric layer 130, the gate spacers 98, the gate spacers 99, and the dielectric layer 144. The ESL 136 may be formed of a dielectric material having a high etching selectivity from the etching of the second ILD 138, such as silicon nitride, silicon oxide, silicon oxynitride, or the like, which may be formed by any suitable deposition process, such as CVD, ALD, or the like.

Figure 23A:
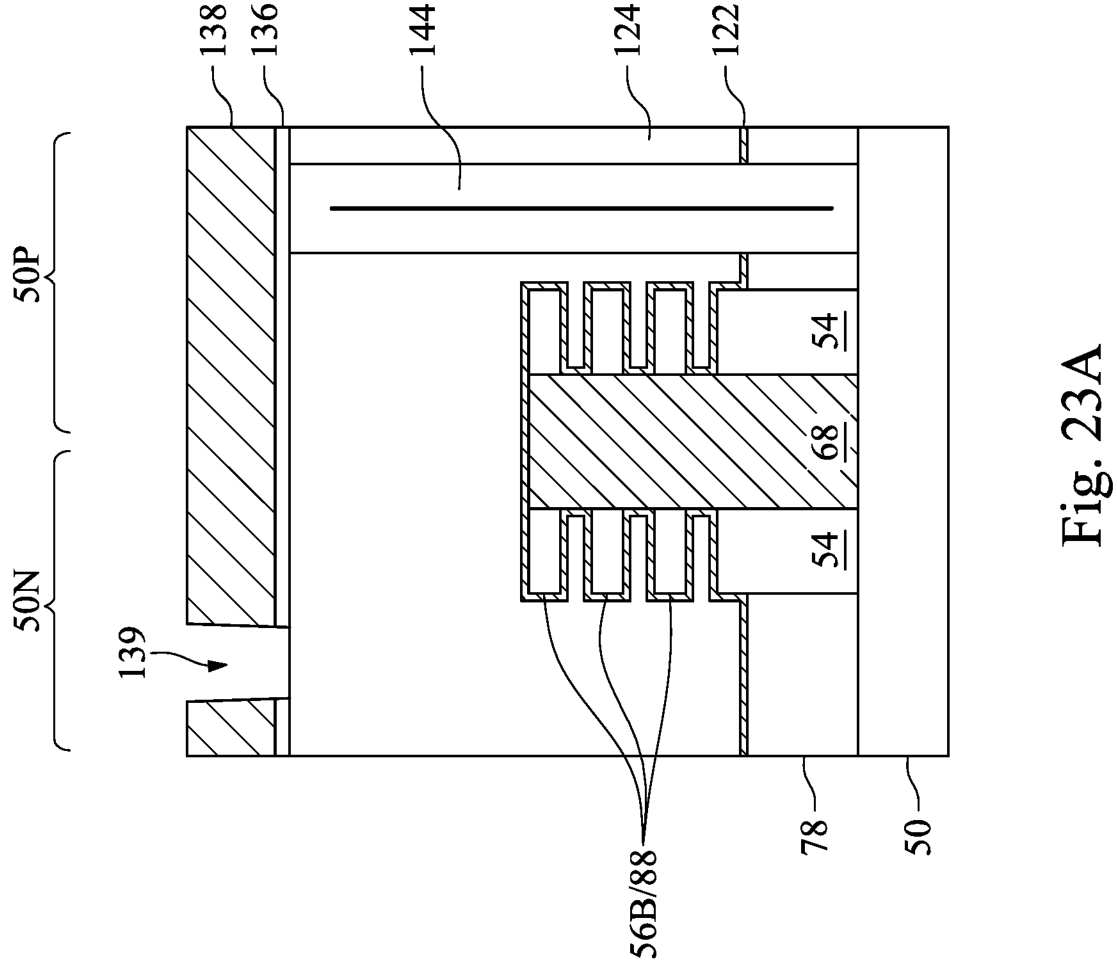
Figure 23B:
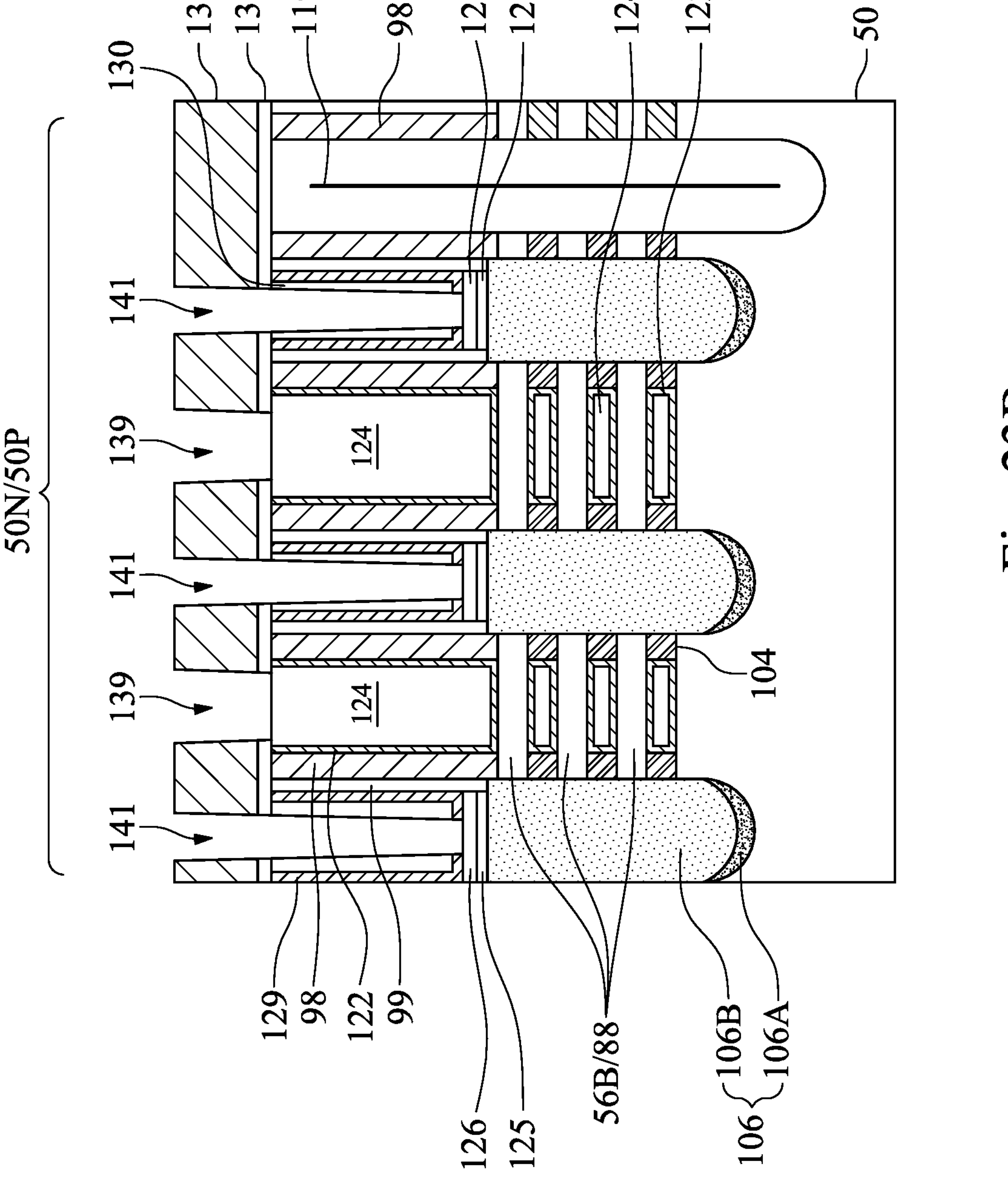
Figure 23C:
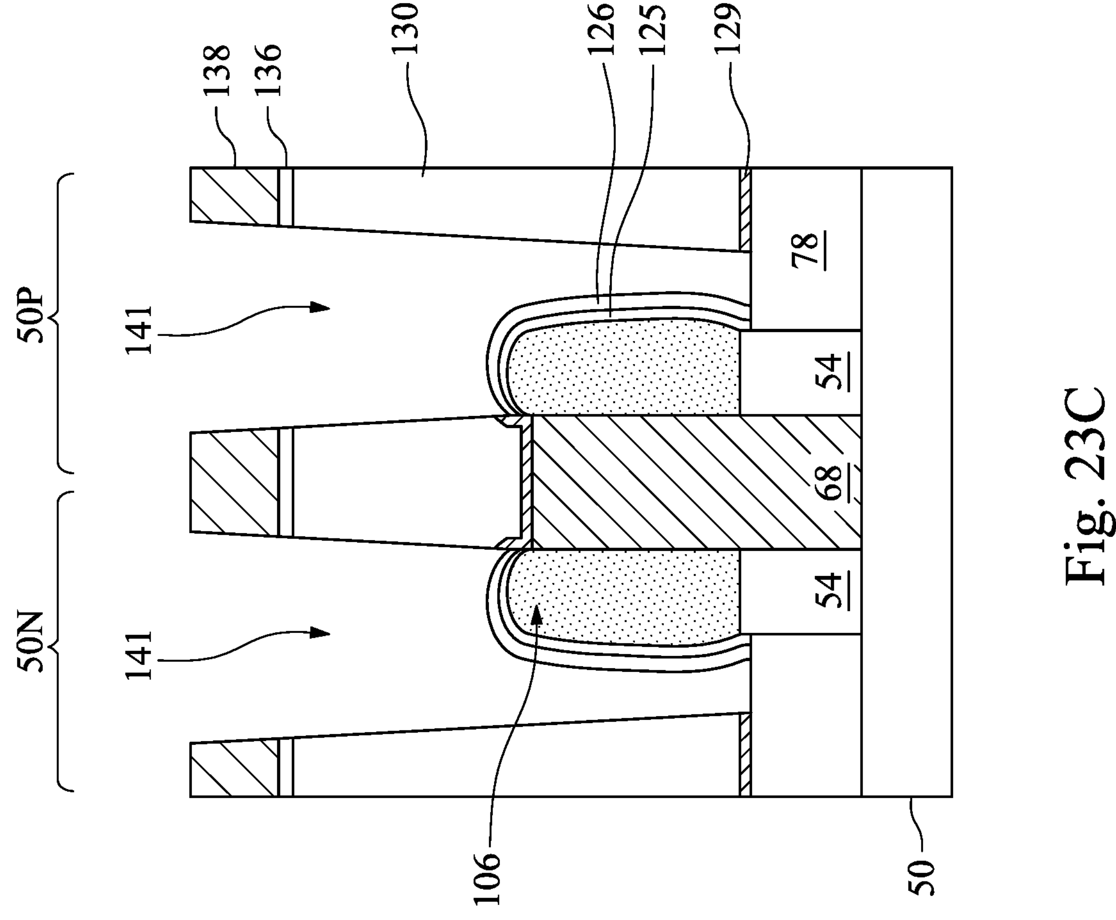

In FIGS. 23A-23C, source/drain contact openings 141 are formed in the second ILD 138, the ESL 136, the dielectric layer 130, and the CESL 129. The source/drain contact openings 141 exposes the coating layer 126 on the underlying metal-semiconductor alloy regions 125, wherein the coating layer 126 and the underlying metal-semiconductor alloy regions 125 are disposed on the faceted top and side surfaces of the epitaxial source/drain regions 106. For example, the source/drain contact openings 141 expose the coating layer 126, wherein the coating layer 126 and the underlying metal-semiconductor alloy regions 125 are disposed on an entirety of a sidewall of each of the epitaxial source/drain regions 106, wherein the sidewall extends from a bottommost surface of the epitaxial source/drain region 106 to a topmost point of the epitaxial source/drain region 106. In addition, the exposed coating layer 126 and underlying metal-semiconductor alloy regions 125 are also disposed on a sidewall of each of the epitaxial source/drain regions 106 that extends from the topmost point of the epitaxial source/drain regions 106 to a topmost point of an interface between the epitaxial source/drain region 106 and the dielectric wall 68.

The source/drain contact openings 141 may be formed using acceptable photolithography and etching techniques. Multiple etching steps may be used to form the source/drain contact openings 141. As noted above, the CESL 129 is formed of a material having a high etching selectivity from the etching of the dielectric layer 130. One of the etching steps used to form the source/drain contact openings 141 is an etching process that is selective to the dielectric layer 130 (e.g., etches the material(s) of the dielectric layer 130 at a faster rate than the material(s) of the CESL 129). The aspect ratio of the lower portions of the source/drain contact openings 141 may thus be improved, helping ensure sufficient area of the coating layer 126 that is disposed on the faceted top and side surfaces of the epitaxial source/drain regions 106 is exposed through the source/drain contact openings 141.

In the illustrated embodiment, patterning methods may be used so that some of the dielectric layer 130 remains in the cross-section of FIG. 23B. In another embodiment, the source/drain contact openings 141 are formed in a self-aligned patterning method so that all of the dielectric layer 130 is removed in the cross-section of FIG. 23B. In the embodiment illustrated in FIGS. 23B and 23C, the source/drain contact openings 141 do not extend into the coating layer 126. In another embodiment, etching of the coating layer 126 may occur so that the source/drain contact openings 141 extend partially into the coating layer 126.

Advantages are achieved by forming the source/drain contact openings 141 such that the coating layer 126 is exposed, and subsequently forming the source/drain contacts 142 (described in FIGS. 24A-24C) in the source/drain contact openings 141. The metal-semiconductor alloy regions 125 and the coating layer 126 are disposed over a larger surface area (e.g., an increase in the effective surface area that is in a range from 20 percent to 30 percent larger) of the epitaxial source/drain regions 106, which then come into contact with the subsequently formed source/drain contacts 142. These advantages include allowing for a decreased contact resistance between the subsequently formed source/drain contacts 142 (shown in FIGS. 24A-24C) and the epitaxial source/drain regions 106. As a result, there is more efficient current flow through the source/drain contacts 142, power dissipation at the source/drain contacts 142 is minimized, and the output resistance (RO) is improved, allowing the nano-FETs to drive or deliver power to a load without significant voltage or current loss.

Referring further to FIGS. 23A-23C, gate contact openings 139 are also formed extending through the second ILD 138 and the ESL 136. The gate contact openings 139 may be formed using acceptable photolithography and etching techniques, and may expose top surfaces of the gate electrodes 124.

Figure 24A:
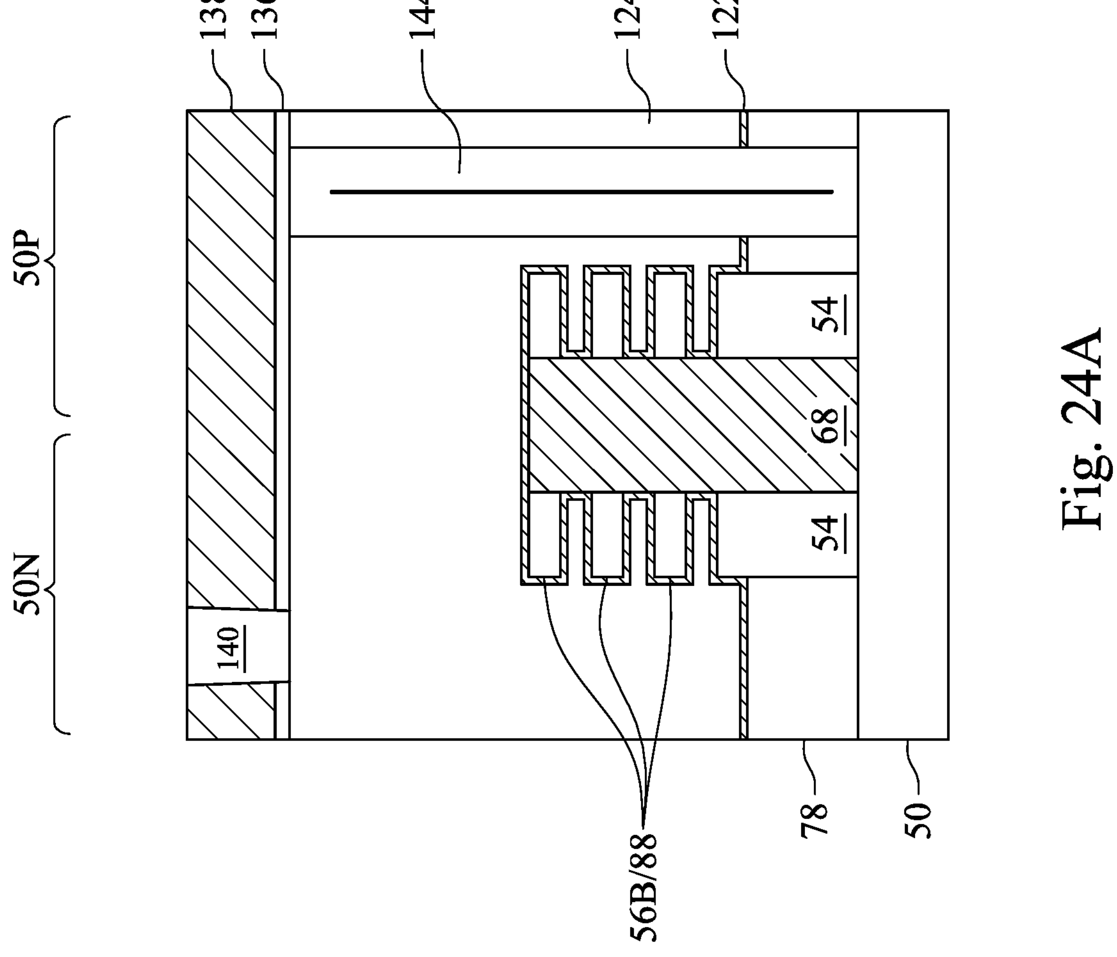
Figure 24B:
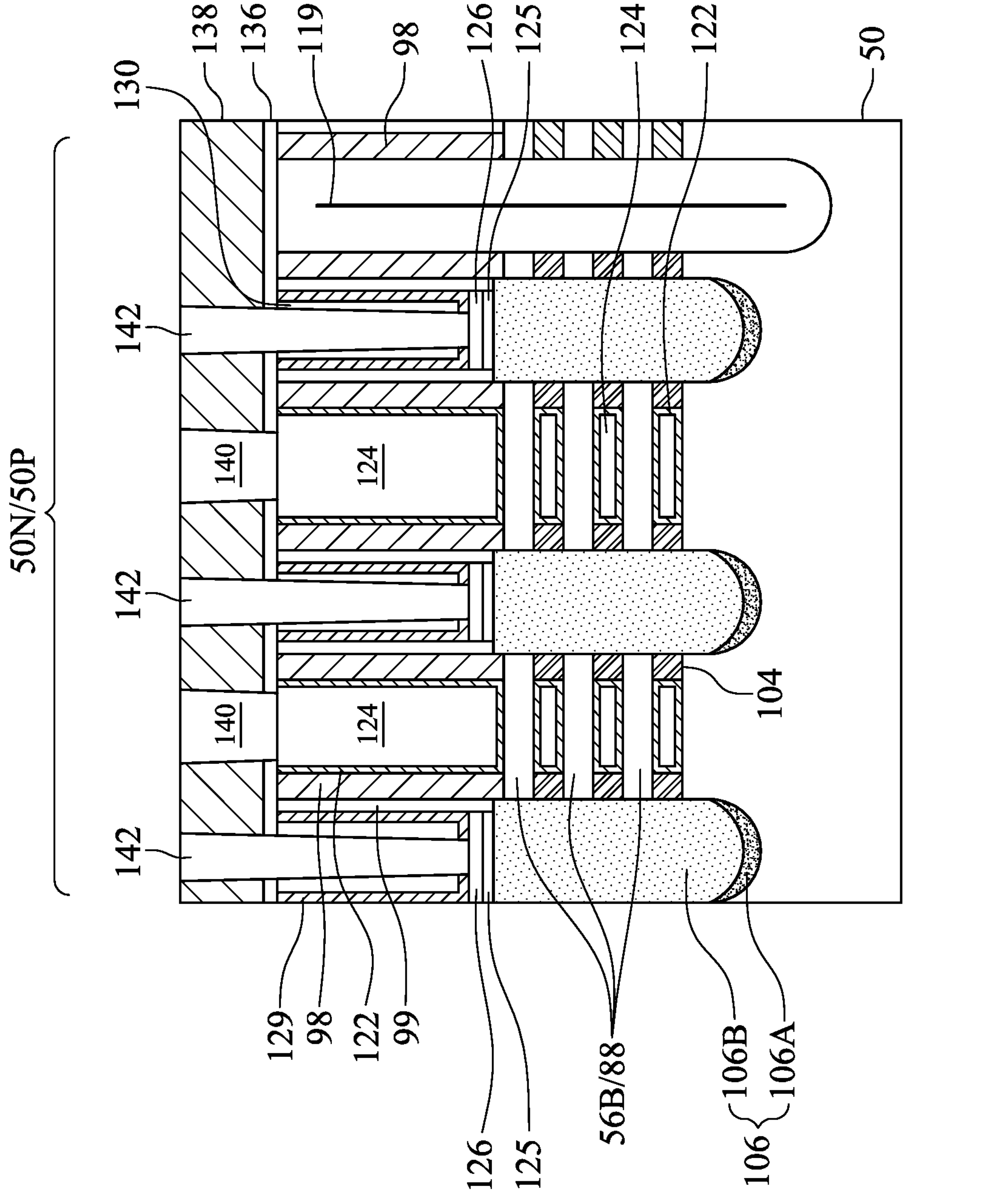
Figure 24C:
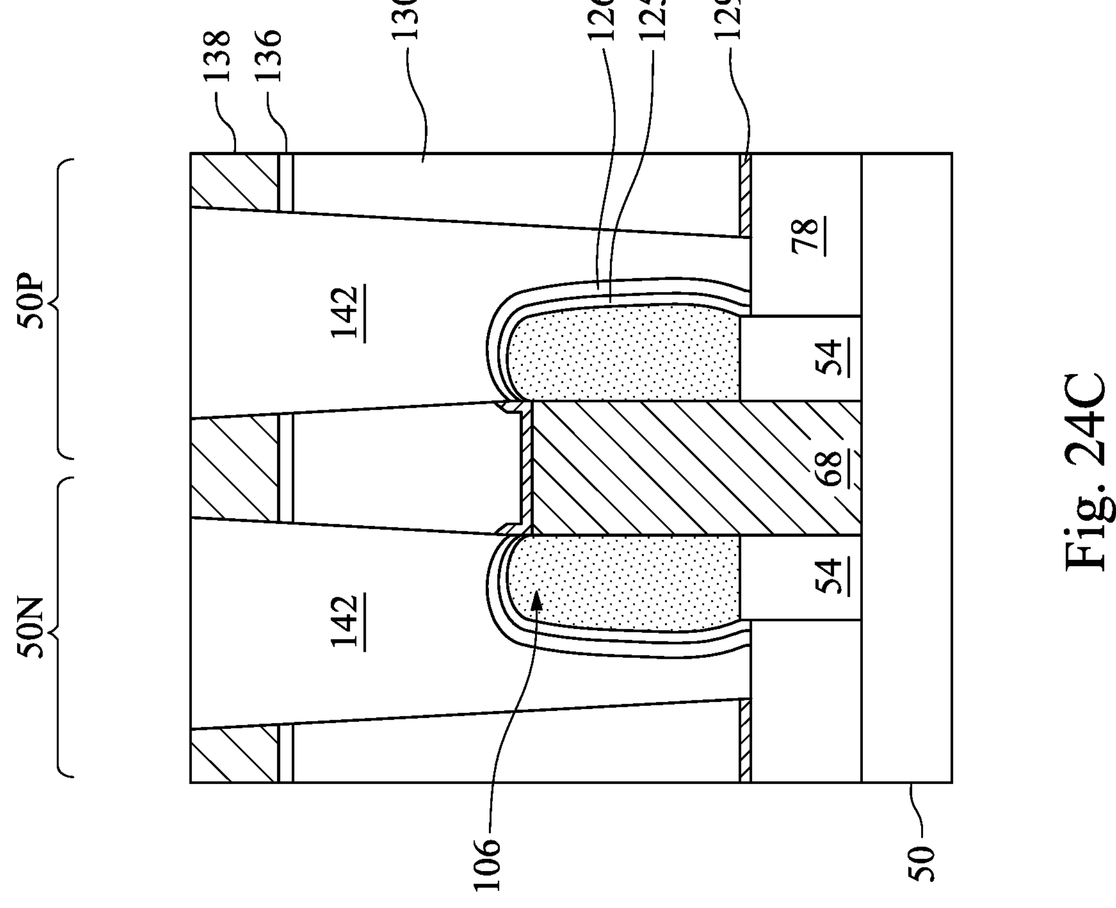

In FIGS. 24A-24C, source/drain contacts 142 are formed in the source/drain contact openings 141, and gate contacts 140 are formed in the gate contact openings 139. A liner, such as a diffusion barrier layer, an adhesion layer, or the like, and a conductive material are formed in the source/drain contact openings 141 and the gate contact openings 139. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, ruthenium, cobalt, copper, molybdenum, nickel, combinations thereof, or the like. The conductive material may be deposited by ALD, CVD, PVD, or the like. A planarization process, such as a CMP, may be performed to remove excess material from the top surface of the second ILD 138. The remaining liner and conductive material in the source/drain contact openings 141 and the gate contact openings 139 form the source/drain contacts 142 and the gate contacts 140, respectively. After formation is complete, the top surfaces of the second ILD 138, the source/drain contacts 142, and the gate contacts 140 are coplanar (within process variations). In other embodiments, the gate contact openings 139 and the gate contacts 140 may be formed before, with, or after the source/drain contact openings 141 and the source/drain contacts 142.

FIGS. 25A through 28D are views of intermediate stages in the manufacturing of nano-FETs, in accordance with alternate embodiments. The manufacturing of the nano-FETs is described in the context of nanosheet field-effect transistors (NSFETs). Unless specified otherwise, like reference numerals in this embodiment (and subsequently discussed embodiments) represent like components in the embodiment shown in FIGS. 1 through 24C formed by like processes. Accordingly, the process steps and applicable materials may not be repeated herein.

FIGS. 25A, 26A, 27A and 28A are cross-sectional views illustrated along reference cross-section A-A in FIG. 1. FIGS. 25B, 26B, 27B and 28B are cross-sectional views illustrated along reference cross-section B-B in FIG. 1. FIGS. 25C, 25D, 26C, 26D, 27C, 27D, 28C and 28D are cross-sectional views illustrated along reference cross-section C-C in FIG. 1.

FIGS. 25A-25D show an embodiment for which the initial steps are essentially the same as shown in FIGS. 1 through 15B, except that the process steps shown in FIGS. 4 and 5 that are used to form the dielectric wall 68 are omitted. In this way, the dielectric wall 68 used to separate the adjacent fin structures 62N, 62P of a pair of the fin structures 62 is not formed, and a trench is disposed between the adjacent fin structures 62. Isolation regions 78 and the gate structure 120 (e.g., comprising the gate dielectrics 122 and the gate electrodes 124 are then subsequently formed in this trench between the adjacent fin structures 62 instead of the dielectric wall 68. The gate dielectrics 122 are deposited conformally on top surfaces and sidewalls of the semiconductor fins 54 and on top surfaces, sidewalls, and bottom surfaces of the second nanostructures 56B. The gate electrodes 124 are also deposited over the gate dielectrics 122 such that the gate structure 120 wraps around each second nanostructure 56B.

In an embodiment, each of the second nanostructures 56B may have a width W6 that is in a range from 10 nm to 50 nm. In an embodiment, channel regions 88 disposed between adjacent epitaxial source/drain regions 106 may have a width W7 that is in a range from 10 to 80 nm.

Further referring to FIGS. 25A-25D, the first ILD 114 and the CESL 112 are removed to form openings 134 that expose the faceted top and side surfaces of the epitaxial source/drain regions 106, using similar processes and similar etchants to those that were described previously in FIGS. 16A-16C. The etching process used may be selective to the first ILD 114 and the CESL 112 (e.g., etches the material(s) of the first ILD 114 and the CESL 112 at a faster rate than the material(s) of the gate spacers 98, the gate spacers 99, isolation regions 78, the gate dielectrics 122, the gate electrodes 124, and the epitaxial source/drain regions 106. Each of the epitaxial source/drain regions 106 may have a bottom portion disposed between fin spacers 97. The fin spacers 97 may be formed at the same time the gate spacers 98 are formed, wherein an insulating material is deposited and subsequently etched to form the gate spacers 98 and the fin spacers 97, using similar processes and materials as were described previously in FIGS. 8A-8B.

Figure 25A:
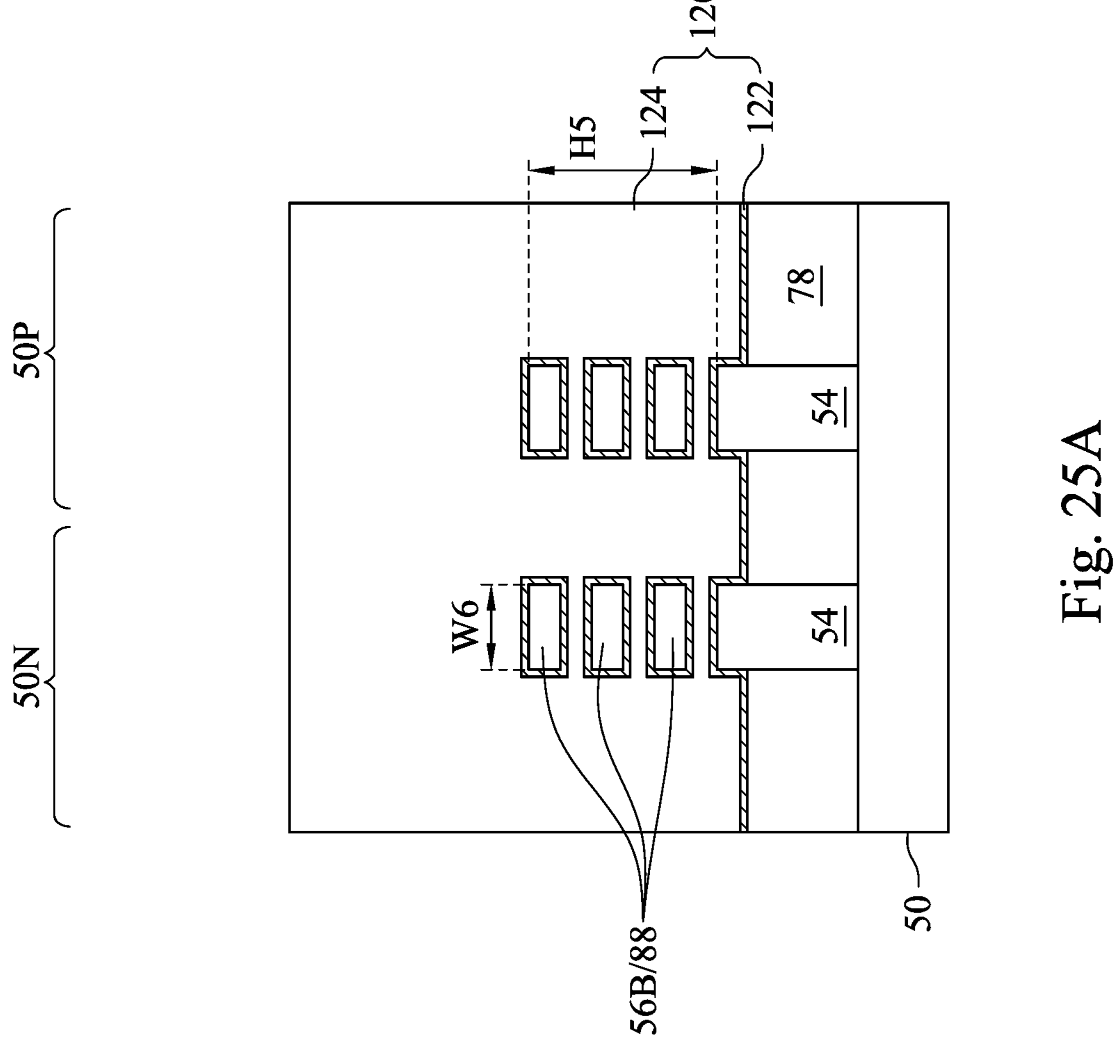
FIGS. 25A through 28D are cross-sectional views of further intermediate stages in the manufacturing of semiconductor devices, in accordance with some embodiments.
Figure 25B:
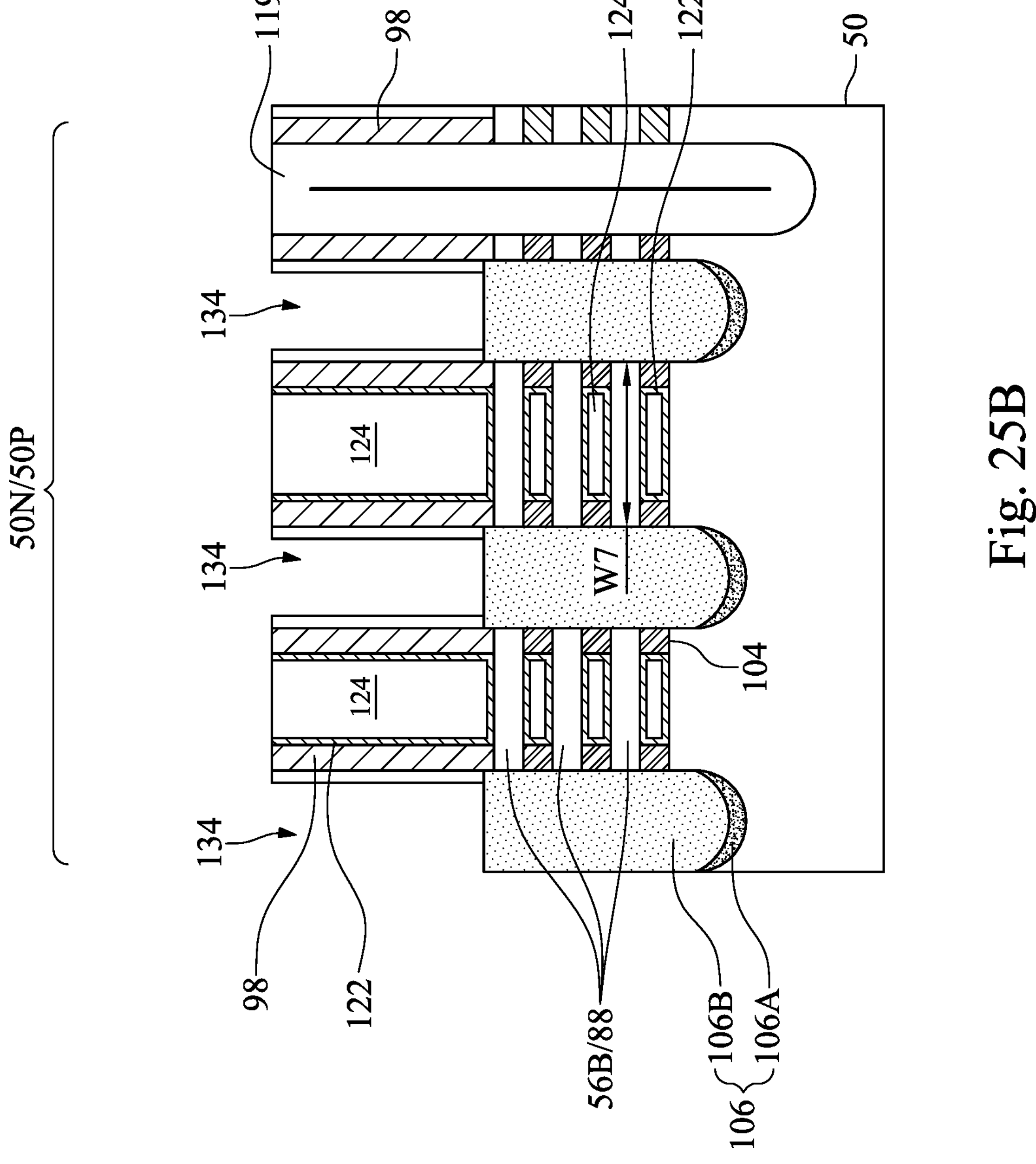
Figure 25D:
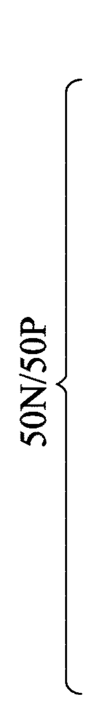
Figure 25D:
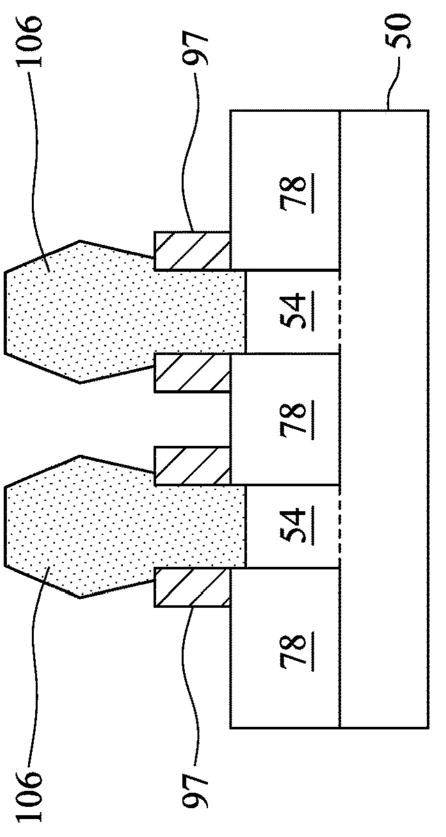
Figure 25C:
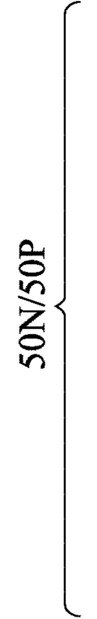
Figure 25C:
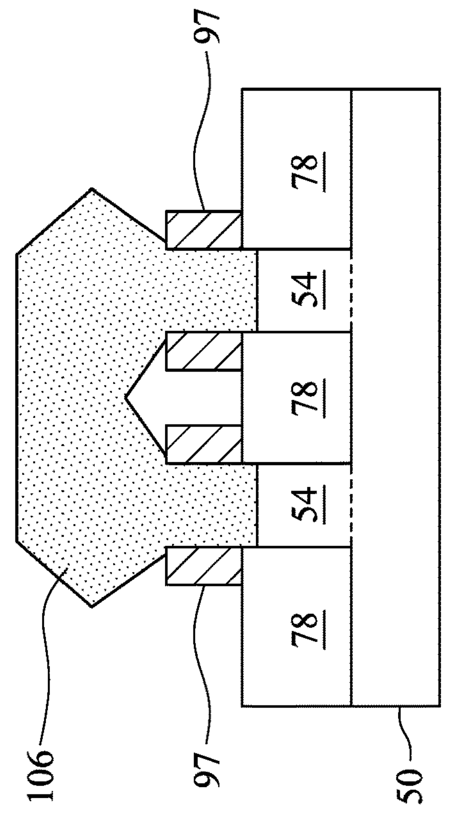
Figure 26A:
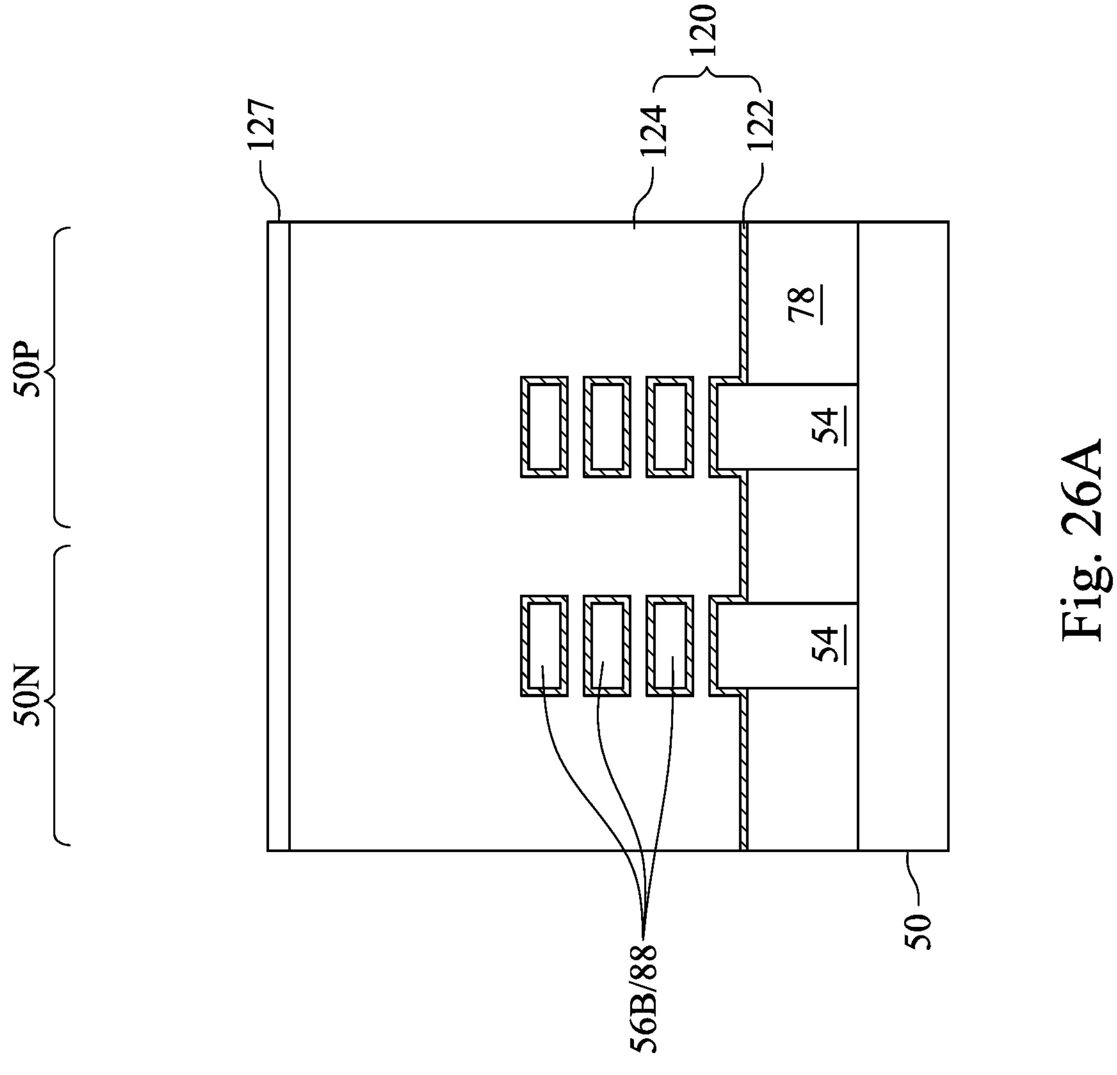
Figure 26B:
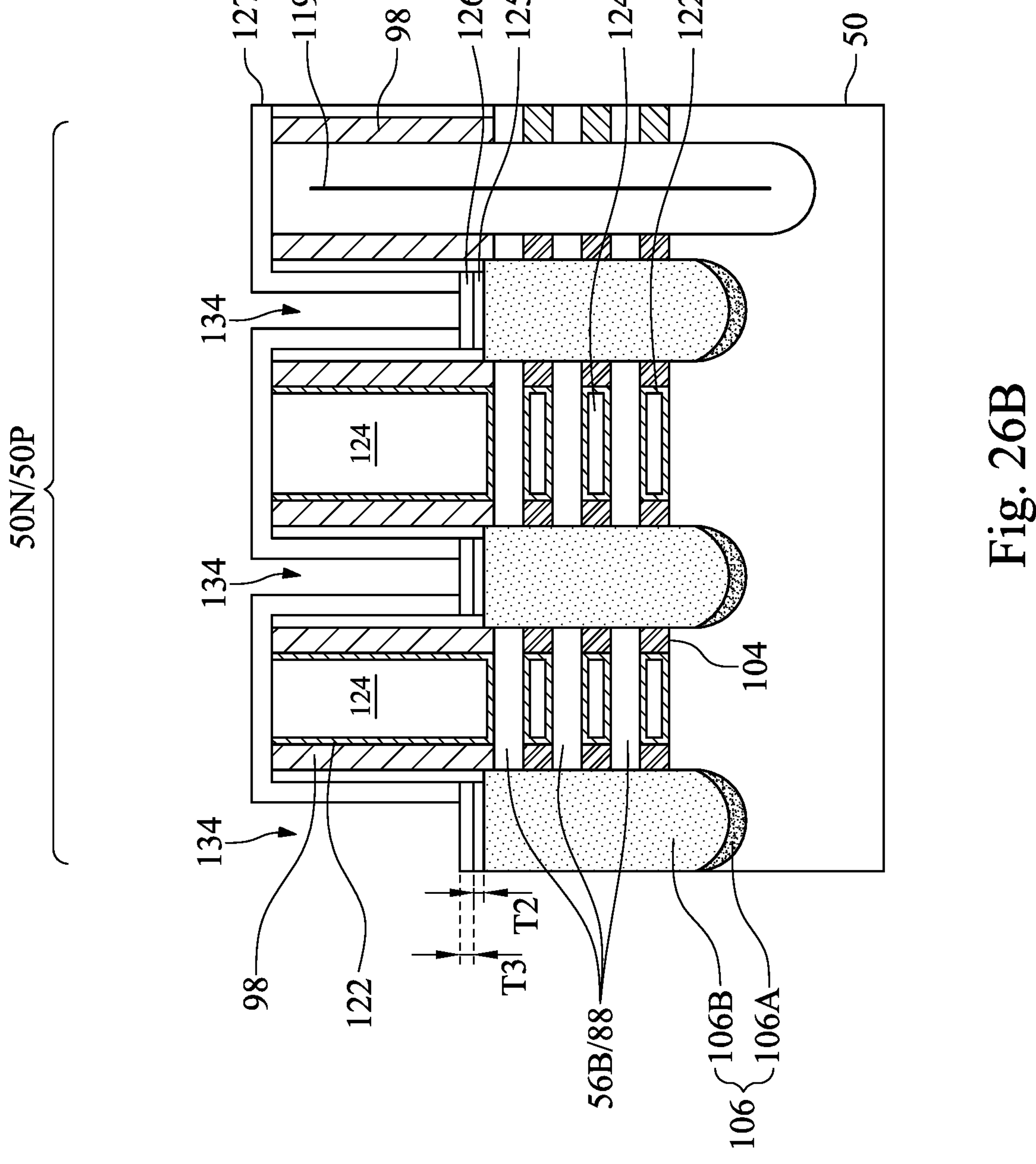
Figures 26C, 26D:
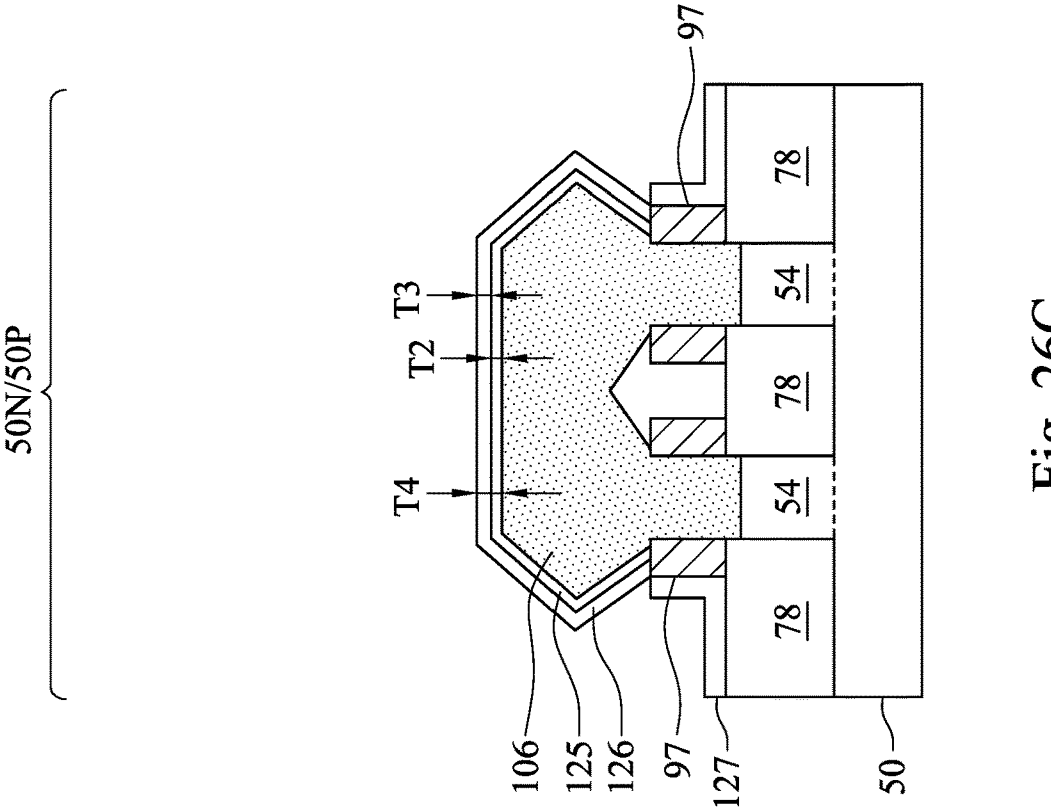
Figure 27A:
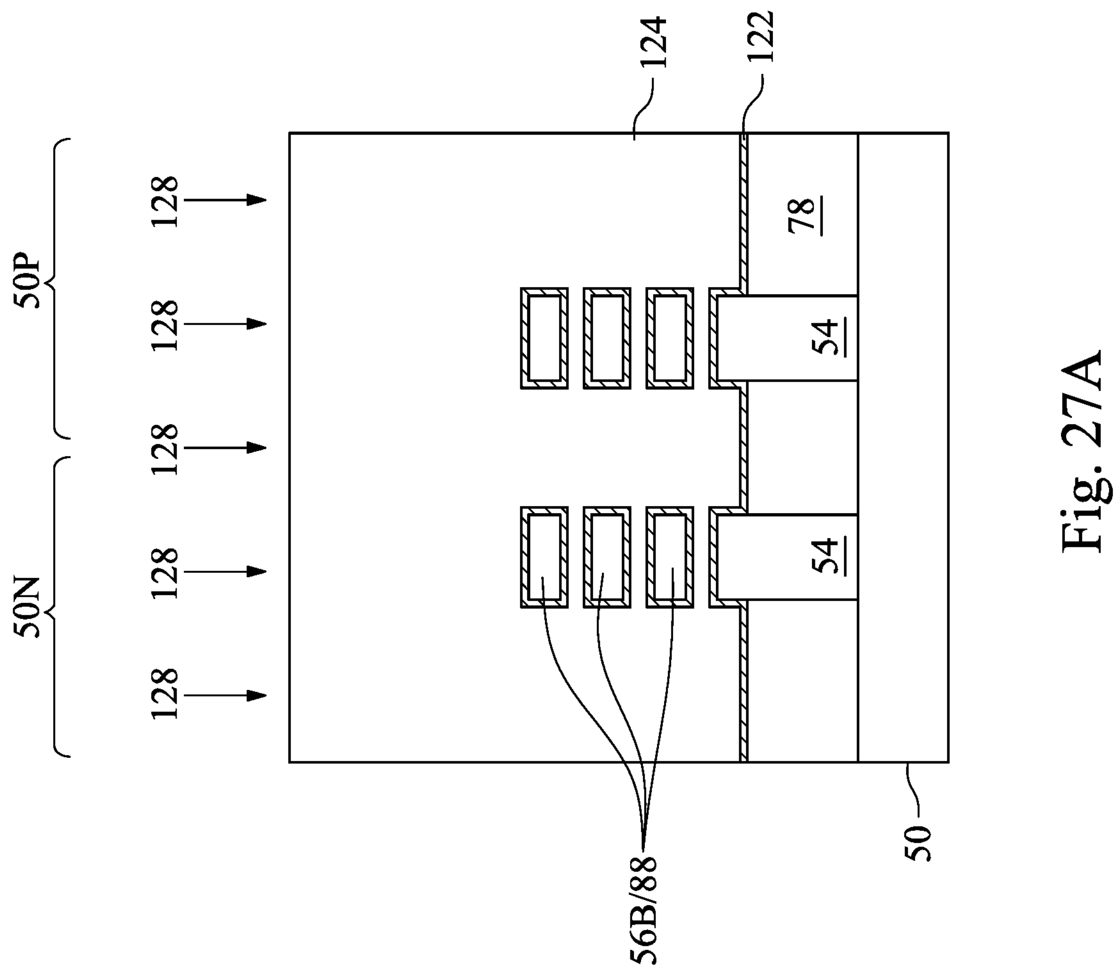
Figure 27B:
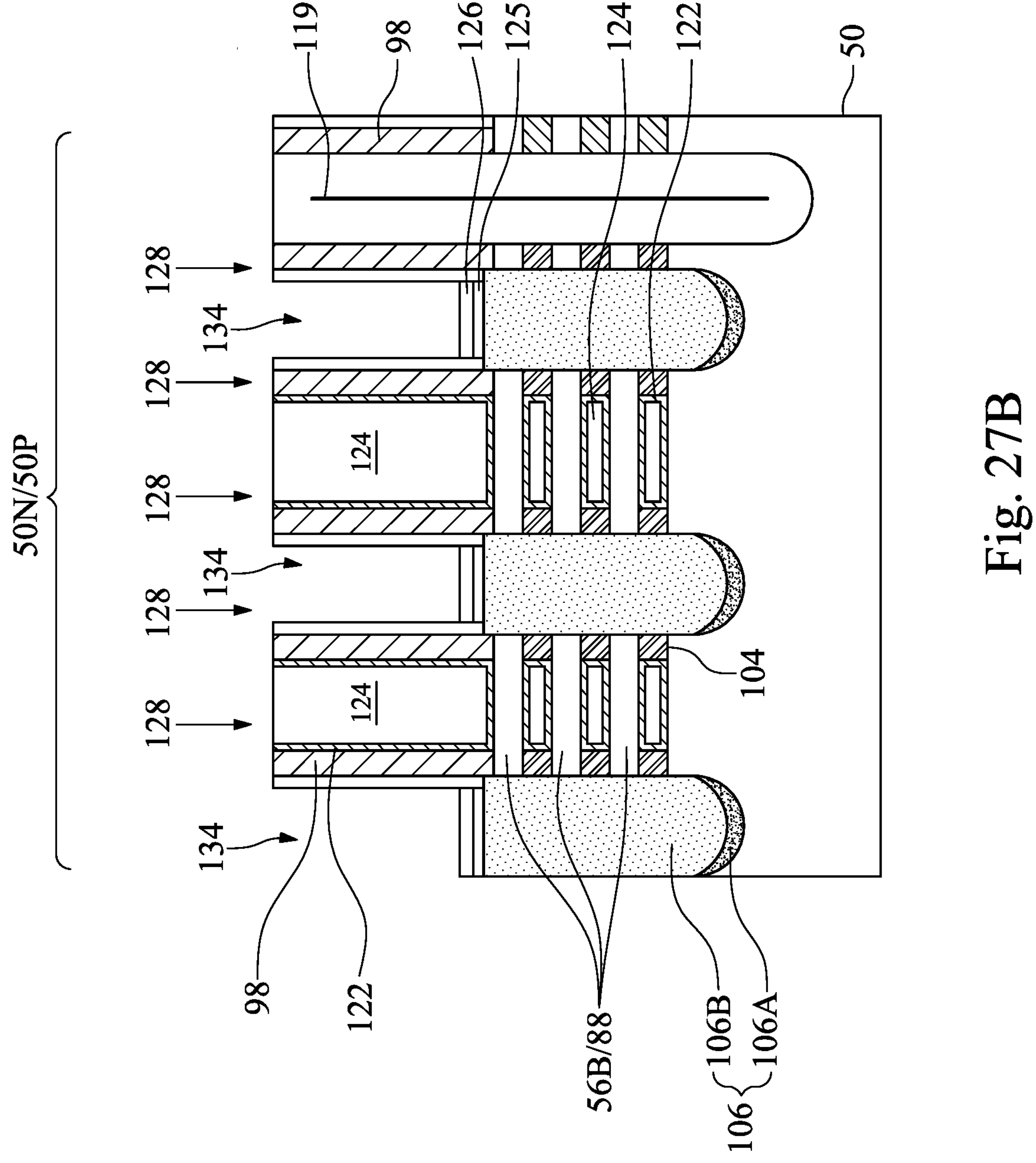
Figures 27C, 27D:
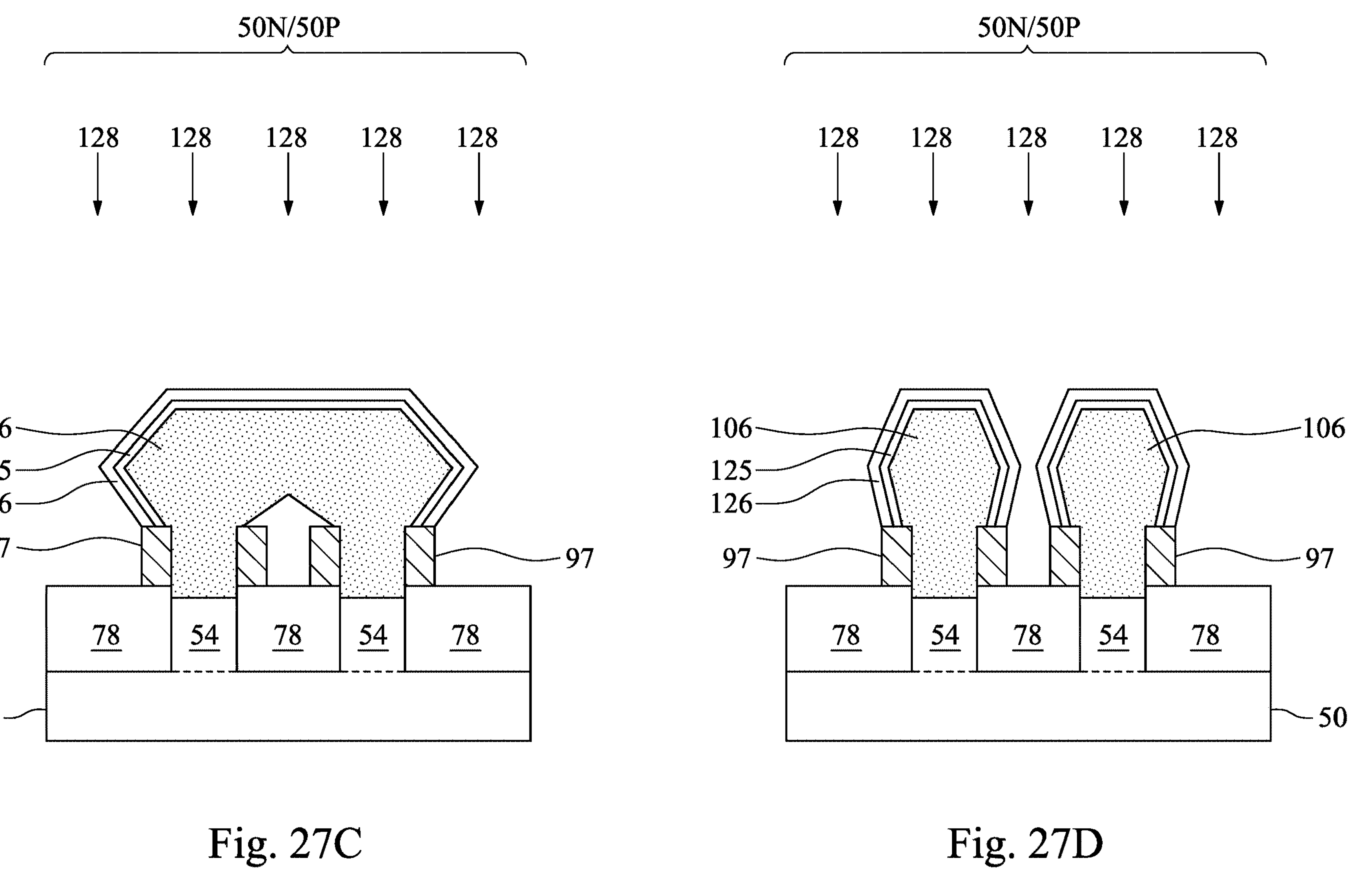

As a result of the epitaxy processes (described previously in FIGS. 9A-9C) used to form the epitaxial source/drain regions 106, upper surfaces of the epitaxial source/drain regions 106 have facets which expand laterally outward beyond sidewalls of the semiconductor fins 54 and the second nanostructures 56B. In some embodiments, these facets cause adjacent epitaxial source/drain regions 106 above adjacent semiconductor fins 54 to merge as illustrated by FIG. 25C. In other embodiments, adjacent epitaxial source/drain regions 106 remain separated after the epitaxy process is completed as illustrated by FIG. 25D. In the illustrated embodiments, the fin spacers 97 are formed on a top surface of the isolation regions 78, thereby blocking the epitaxial growth. In some other embodiments, the fin spacers 97 may not be formed. In an embodiment, a height H5 between a top surface of a topmost one of the second nanostructures 56B and a top surface of a semiconductor fin 54 is in a range from 40 nm to 80 nm, where the semiconductor fin 54 is vertically below the topmost one of the second nanostructures 56B.

After the removal of the first ILD 114 and the CESL 112 to form openings 134, the exposed portions of each of the epitaxial source/drain regions 106 includes a top surface and sidewalls of the epitaxial source/drain region 106, wherein each of the sidewalls extends from the top surface of the epitaxial source/drain region 106 to a bottom point of the sidewall that is just above a top surface of a corresponding fin spacer 97. Removing the first ILD 114 and the CESL 112 in the manner described above allows for the exposing of a larger surface area (e.g., an increase in the exposed surface area that is in a range from 20 percent to 30 percent larger) of the epitaxial source/drain regions 106.

Advantages can be achieved by forming the replacement gate structures 120 using similar processes and similar materials to those described previously in FIGS. 15A-15B. These processes include performing the planarization process to remove the excess portions of the materials of the gate dielectrics 122 and the gate electrodes 124, which excess portions are over the top surfaces of the first ILD 114, the gate spacers 98, the gate spacers 99, the CESL 112, and the dielectric layer 119, and then performing the etching process using HF gas, $NH_3$ gas, $CH_3F$, $C_4$, $F_6$, or the like as etchants to remove the first ILD 114 and the CESL 112, in order to form the openings 134 and expose the faceted top and side surfaces of the epitaxial source/drain regions 106. These advantages include allowing a larger surface area of the epitaxial source/drain regions 106 to be exposed through the opening 134, such that subsequently formed metal-semiconductor alloy regions 125 and coating layer 126 (shown in FIGS. 26A-26D) can be formed over a larger surface area (e.g., an increase in surface area that is in a range from 20 percent to 30 percent) of the epitaxial source/drain regions 106. These advantages include decreased contact resistance between subsequently formed source/drain contacts 142 (shown in FIGS. 28A-28D) and the epitaxial source/drain regions 106. As a result, there is more efficient current flow through the source/drain contacts 142, power dissipation at the source/drain contacts 142 is minimized, and the output resistance (RO) is improved, allowing the delivery of power to a load without significant voltage or current loss. This therefore results in improved device performance.

In FIGS. 26A-26D, metal-semiconductor alloy regions 125 are formed in the openings 134 on portions of the epitaxial source/drain regions 106 exposed by the openings 134. The metal-semiconductor alloy regions 125 are formed using similar processes and similar materials as those described previously in FIGS. 17A-17C. The metal-semiconductor alloy regions 125 may be formed on the exposed faceted top and side surfaces of the epitaxial source/drain regions 106, such that the metal-semiconductor alloy regions 125 are disposed on a top surface and sidewalls of each of the epitaxial source/drain regions 106, wherein each of the sidewalls extends from the top surface of the epitaxial source/drain region 106 to a bottom point of the sidewall that is just above a top surface of a corresponding fin spacer 97. In an embodiment, the metal-semiconductor alloy regions 125 may have the thickness T2 that is in a range from 2 nm to 4 nm.

After the formation of the metal-semiconductor alloy regions 125, the coating layer 126 is formed over the metal-semiconductor alloy regions in the openings 134 using similar processes and similar materials as those described previously in FIGS. 17A-17C. In an embodiment, the coating layer 126 may have the thickness T3 that is in a range from 1 nm to 4 nm.

Advantages can be achieved by forming the metal-semiconductor alloy regions 125 (comprising TiSi) and the coating layer 126 (comprising TiSiN) on portions of the epitaxial source/drain regions 106 exposed by the openings 134, wherein the thickness T2 of the metal-semiconductor alloy regions 125 is in a range from 2 nm to 4 nm, and the thickness T3 of the coating layer 126 is in a range from 1 nm to 4 nm. These include a lowering of the contact resistance between subsequently formed source/drain contacts 142 (shown in FIGS. 28A-28D) and the epitaxial source/drain regions 106. As a result, there is more efficient current flow through the source/drain contacts 142, power dissipation at the source/drain contacts 142 is minimized, and the output resistance (RO) is improved, allowing the nano-FETs to drive or deliver power to a load without significant voltage or current loss. For example, forming the metal-semiconductor alloy regions 125 having a thickness that is smaller than 2 nm will lead to an insufficient reduction in contact resistance between subsequently formed source/drain contacts 142 (shown in FIGS. 28A-28D) and the epitaxial source/drain regions 106, resulting in less efficient current flow through the source/drain contacts 142 and an insufficient improvement in device performance. Conversely, forming the metal-semiconductor alloy regions 125 having a thickness that is greater than 4 nm will not lead to any further significant reduction in contact resistance between subsequently formed source/drain contacts 142 (shown in FIGS. 28A-28D) and the epitaxial source/drain regions 106, resulting in increased manufacturing costs for no improvements in device performance.

Furthermore, forming the metal-semiconductor alloy regions 125 and the coating layer 126 over the larger exposed surface area (e.g., an increase in the exposed surface area that is in a range from 20 percent to 30 percent larger) of the epitaxial source/drain regions 106 has additional advantages. These include an increase in the effective area (e.g., an increase in area that is in a range from 20 to 30 percent) of the metal-semiconductor alloy regions 125 and the coating layer 126 on the epitaxial source/drain regions 106, which allows for an even greater reduction in contact resistance between the subsequently formed source/drain contacts 142 (shown in FIGS. 28A-28D) and the epitaxial source/drain regions 106. As a result, there is even more efficient current flow through the source/drain contacts 142, power dissipation at the source/drain contacts 142 is further minimized, and the output resistance (RO) is further improved, allowing the nano-FETs to drive or deliver power to a load with even lower voltage or current losses.

Further advantages can be achieved by forming the coating layer 126 over the metal-semiconductor alloy regions 125. These include the coating layer 126 preventing the oxidation of surfaces of the underlying metal-semiconductor alloy regions 125, which could result in degraded electrical performance and increase the contact resistance between subsequently formed source/drain contacts 142 (shown in FIGS. 28A-28D) and the epitaxial source/drain regions 106. As a result, device performance is enhanced and device yield is improved. For example, forming the coating layer 126 having a thickness that is smaller than 1 nm will lead to an insufficient protection to prevent the oxidation of the underlying metal-semiconductor alloy regions 125, and this will result in degraded electrical performance and an increase in the contact resistance between subsequently formed source/drain contacts 142 (shown in FIGS. 28A-28D) and the epitaxial source/drain regions 106. Conversely, forming the coating layer 126 having a thickness that is greater than 4 nm will not lead to any further improvement in preventing the oxidation of the underlying metal-semiconductor alloy regions 125, resulting in added manufacturing costs.

In an embodiment, the combined thickness T4 of the metal-semiconductor alloy regions 125 and the coating layer 126 may be in a range from 3 nm to 8 nm. The thicknesses T2, T3, and T4, can be varied by adjusting specific process parameters of the deposition process, the first plasma treatment, and the second plasma treatment, such as power, gas composition, pressure, and treatment time.

As a result of the processes used to form the metal-semiconductor alloy regions 125 and the coating layer 126, the residual layer 127 (described previously in FIGS. 17A-17C) is unintentionally formed on sidewalls of the fin spacers 97, the top surfaces of the gate dielectrics 122, the gate electrodes 124, the dielectric layer 119, the isolation regions 78, the gate spacers 98, and top surfaces and sidewalls of the gate spacers 99. For example, this residual layer 127 is also formed along sidewalls in the openings 134. The residual layer 127 may comprise titanium silicon nitride (TiSiN), titanium nitride (TiN), a combination thereof, or the like. In an embodiment, first portions of the residual layer 127 on top surfaces of the gate electrodes 124 may comprise TiN. In an embodiment, second portions of the residual layer 127 on top surfaces of the gate dielectrics 122, the dielectric layer 119, the isolation regions 78, the gate spacers 98, sidewalls of the fin spacers 97, and top surfaces and sidewalls (e.g., sidewalls in the openings 134) of the gate spacers 99 may comprise TiSiN.

In FIGS. 27A-27D, the wet clean process 128 is performed to selectively remove (e.g., by etching) the residual layer 127 from the top surfaces of the gate dielectrics 122, the gate electrodes 124, the dielectric layer 119, the isolation regions 78, the gate spacers 98, sidewalls of the fin spacers 97, and the top surfaces and the sidewalls (e.g., sidewalls within the openings 134) of the gate spacers 99, while leaving the metal-semiconductor alloy regions 125 and the coating layer 126 on the epitaxial source/drain regions 106. The metal-semiconductor alloy regions 125 and the coating layer 126 disposed over the epitaxial source/drain regions 106 are not removed (e.g., have much lower etch rates as compared to the residual layer 127) during the wet clean process 128. For example, a ratio of an etch rate of the residual layer 127 to an etch rate of the metal-semiconductor alloy regions 125 and the coating layer 126 is in a range from 4 to 8.7. In this way, the TiN and TiSiN of the residual layer 127 is preferentially removed using the wet clean process 128, while the metal-semiconductor alloy regions 125 (e.g., comprising TiSi) and the coating layer 126 (e.g., comprising TiSiN) that are disposed over the epitaxial source/drain regions 106 are left substantially intact, as a result of the wet clean process 128.

The wet clean process 128 may be a wet etch process that comprises exposing the structure shown previously in FIGS. 26A-26D (e.g., including the residual layer 127) to sulfuric acid ($H_2SO_4$) that is at a temperature that is in a range from 130° C. to 230° C. In an embodiment, the sulfuric acid may have a concentration that is in a range from 85 percent to 90 percent by weight. In other embodiments, the wet etch process comprises exposing the structure shown previously in FIGS. 26A-26D (e.g., including the residual layer 127) to sulfuric acid ($H_2SO_4$) that is at a temperature that is above 130° C., wherein the sulfuric acid has a concentration that is higher than 90 percent by weight. The wet clean process 128 may be performed for a duration of time that is in a range from 5 seconds to 60 seconds.

In alternate embodiments, the wet clean process 128 may comprise a wet etch process that comprises exposing the structure shown previously in FIGS. 26A-26D (e.g., including the residual layer 127) to a sulfonic acid (e.g., methanesulfonic acid ($CH_3SO_3H$), N-sulfonic acid (N—$SO_3H$), benzenesulfonic acid ($C_6H_5SO_3H$), chlorosulfonic acid ($HSO_3Cl$), or the like) or its derivatives (e.g., benzenesulfonyl chloride ($C_6H_5SO_2Cl$), a sulfonamide, or the like).

Advantages can be achieved by performing the wet clean process 128 to selectively remove the residual layer 127 from the top surfaces of the gate dielectrics 122, the gate electrodes 124, the dielectric layer 119, the isolation regions 78, the gate spacers 98, sidewalls of the fin spacers 97, and the top surfaces and the sidewalls (e.g., sidewalls within the openings 134) of the gate spacers 99, while leaving the metal-semiconductor alloy regions 125 and the coating layer 126 on the epitaxial source/drain regions 106. The wet clean process 128 is performed using sulfuric acid ($H_2SO_4$) as an etchant, and is performed while the sulfuric acid ($H_2SO_4$) is at a temperature that is in a range from 130° C. to 230° C. The sulfuric acid ($H_2SO_4$) may have a concentration that is in a range from 85 percent to 90 percent by weight. These advantages include the wet clean process 128 allowing for the selective etching of the titanium silicon nitride (TiSiN) and titanium nitride (TiN) of the residual layer 127 (e.g., on sidewalls in the openings 134) formed during the formation of the metal-semiconductor alloy regions 125 and the coating layer 126 on the epitaxial source/drain regions 106, while minimizing etch damage to the metal-semiconductor alloy regions 125 (comprising TiSi) and the coating layer 126 (comprising TiSiN). As a result, subsequently formed source/drain contact openings for source/drain contacts 142 (shown in FIGS. 28A-28D) can be formed having larger widths to ensure lower contact resistance, better electrical contact, and a larger contact surface area between the epitaxial source/drain regions 106 and the source/drain contacts 142. This is because there is no residual layer 127 present on the sidewalls of the opening 134 that could hinder the subsequent formation of the source/drain contact openings and the source/drain contacts 142, and which would impede electrical contact between the epitaxial source/drain regions 106 and the source/drain contacts 142. This therefore results in enhanced device performance and improved device yield. Furthermore, the removal of the residual layer 127 on the top surfaces of the gate dielectrics 122 and the gate electrodes 124 ensures better electrical contact between the gate electrodes 124 and subsequently formed gate contacts 140 (shown in FIGS. 28A-28D).

In FIGS. 28A-28D, a dielectric layer 130 is deposited over the structure shown previously in FIGS. 27A-27D, such as over the gate dielectrics 122, the gate electrodes 124, the dielectric layer 119, the isolation regions 78, the gate spacers 98, and the gate spacers 99. The dielectric layer 130 is also deposited over the metal-semiconductor alloy regions 125 and the coating layer 126 in the openings 134, and on sidewalls within the opening 134 in order to fill the openings 134. The dielectric layer 130 may be deposited using similar processes and similar materials to those described previously in FIGS. 19A-19C.

After the deposition of the dielectric layer 130, a planarization process is performed to level top surfaces of the dielectric layer 130 with top surfaces of the gate dielectrics 122, the gate electrodes 124, the dielectric layer 119, the gate spacers 98, and the gate spacers 99. The planarization process may be a CMP process, or the like.

In some embodiments, a contact etch stop layer (CESL) 129 is disposed between the dielectric layer 130 and the coating layer 126. In addition, the CESL 129 may be disposed between the dielectric layer 130 and the sidewalls of the gate spacers 99. The CESL 129 may be formed using similar processes and similar materials to those described previously in FIGS. 19A-19C.

After the planarization process described above is performed to level the top surfaces of the dielectric layer 130, a process for dividing the gate structure 120 (including the gate dielectrics 122 and the gate electrodes 124) into multiple gate structures 120 (or gate structure segments) is performed as described previously in FIGS. 20A through 21D. Dividing the gate structure 120 includes forming a dielectric layer 144 (also referred to subsequently as a gate isolation structure) extending through the gate structure 120, such that the dielectric layer 144 cuts the gate structure 120 into at least two gate structures 120. The dielectric layer 144 is formed by patterning a trench 143 using similar processes, similar materials, and similar etchants as described previously in FIGS. 20A and 20B. The dielectric layer 144 is then formed in the trench 143 using similar processes and similar materials as those described previously in FIGS. 21A-21D. In this way the dielectric layer 144 may be disposed between a first gate structure 120 and a second gate structure 120 on either side of the dielectric layer 144.

After the formation of the dielectric layer 144, a removal process is then applied to the dielectric layer 144 to remove excess material of the dielectric layer 144. In some embodiments, a planarization process such as a chemical mechanical polish (CMP), an etch-back process, combinations thereof, or the like may be utilized. After the planarization process, top surfaces of the gate dielectrics 122, the gate electrodes 124, the dielectric layer 119, the CESL 129, the dielectric layer 130, the gate spacers 98, the gate spacers 99, and the remaining portions of the dielectric layer 144 in the trench 143 are coplanar (within process variations).

After the formation of the dielectric layer 144 in the trench 143, and after performing the removal process described above to remove excess material of the dielectric layer 144, a second ILD 138 is deposited over the gate dielectrics 122, the gate electrodes 124, the dielectric layer 119, the CESL 129, the dielectric layer 130, the gate spacers 98, the gate spacers 99, and the dielectric layer 144. In some embodiments, the second ILD 138 is a flowable film formed by a flowable CVD method. In some embodiments, the second ILD 138 is formed of a dielectric material such as PSG, BSG, BPSG, USG, or the like, which may be formed by any suitable deposition process, such as CVD, PECVD, FCVD, or the like.

In some embodiments, an etch stop layer (ESL) 136 is formed between the second ILD 138 and the gate dielectrics 122, the gate electrodes 124, the dielectric layer 119, the CESL 129, the dielectric layer 130, the gate spacers 98, the gate spacers 99, and the dielectric layer 144. The ESL 136 may be formed of a dielectric material having a high etching selectivity from the etching of the second ILD 138, such as silicon nitride, silicon oxide, silicon oxynitride, or the like, which may be formed by any suitable deposition process, such as CVD, ALD, or the like.

After the formation of the ESL 136 and the second ILD 138, source/drain contact openings are formed in the second ILD 138, the ESL 136, the dielectric layer 130, and the CESL 129 using similar processes and similar etchants as those described previously in FIGS. 23A-23C for the formation of source/drain contact openings 141. The source/drain contact openings expose the coating layer 126 on the underlying metal-semiconductor alloy regions 125, wherein the coating layer 126 and the underlying metal-semiconductor alloy regions 125 are disposed on the faceted top and side surfaces of the epitaxial source/drain regions 106. For example, the source/drain contact openings expose the coating layer 126, wherein the coating layer 126 and the underlying metal-semiconductor alloy regions 125 are disposed on a top surface and sidewalls of each of the epitaxial source/drain regions 106, wherein each of the sidewalls extends from the top surface of the epitaxial source/drain region 106 to a bottom point of the sidewall that is just above a top surface of a corresponding fin spacer 97.

The source/drain contact openings may be formed using acceptable photolithography and etching techniques. Multiple etching steps may be used to form the source/drain contact openings. As noted above, the CESL 129 is formed of a material having a high etching selectivity from the etching of the dielectric layer 130. One of the etching steps used to form the source/drain contact openings is an etching process that is selective to the dielectric layer 130 (e.g., etches the material(s) of the dielectric layer 130 at a faster rate than the material(s) of the CESL 129). The aspect ratio of the lower portions of the source/drain contact openings may thus be improved, helping ensure sufficient area of the coating layer 126 that is disposed on the faceted top and side surfaces of the epitaxial source/drain regions 106 is exposed through the source/drain contact openings.

Figure 28A:
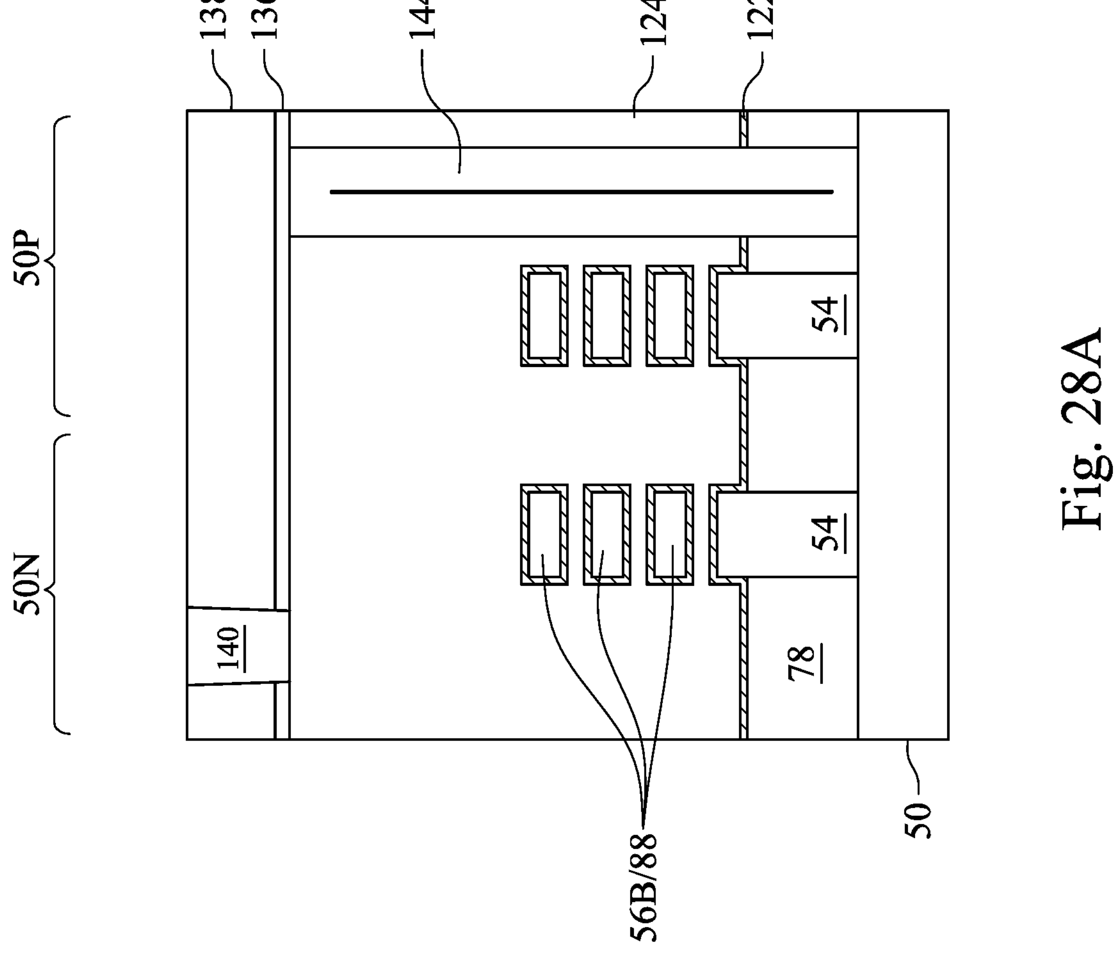
Figure 28B:
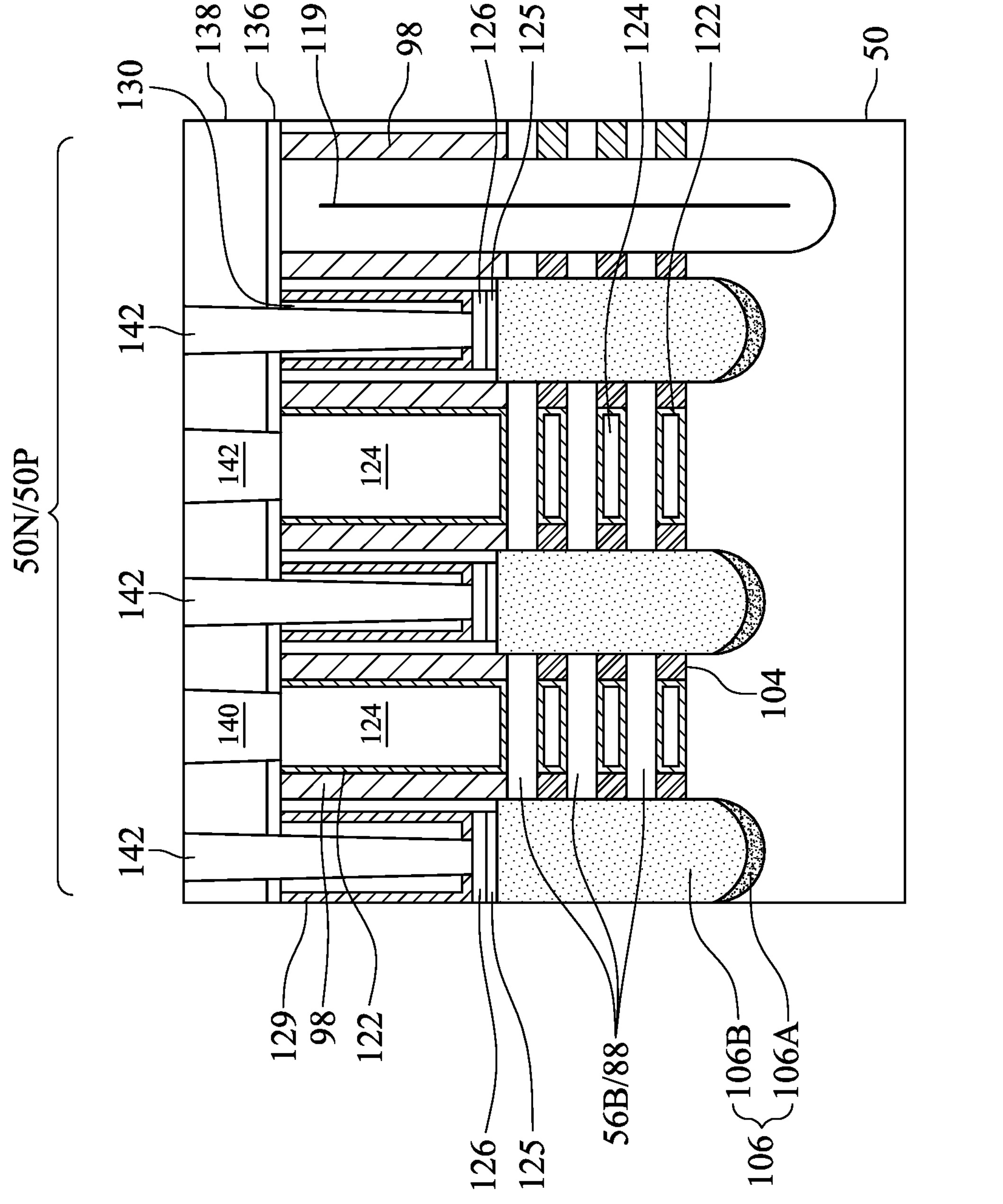
Figures 28C, 28D:
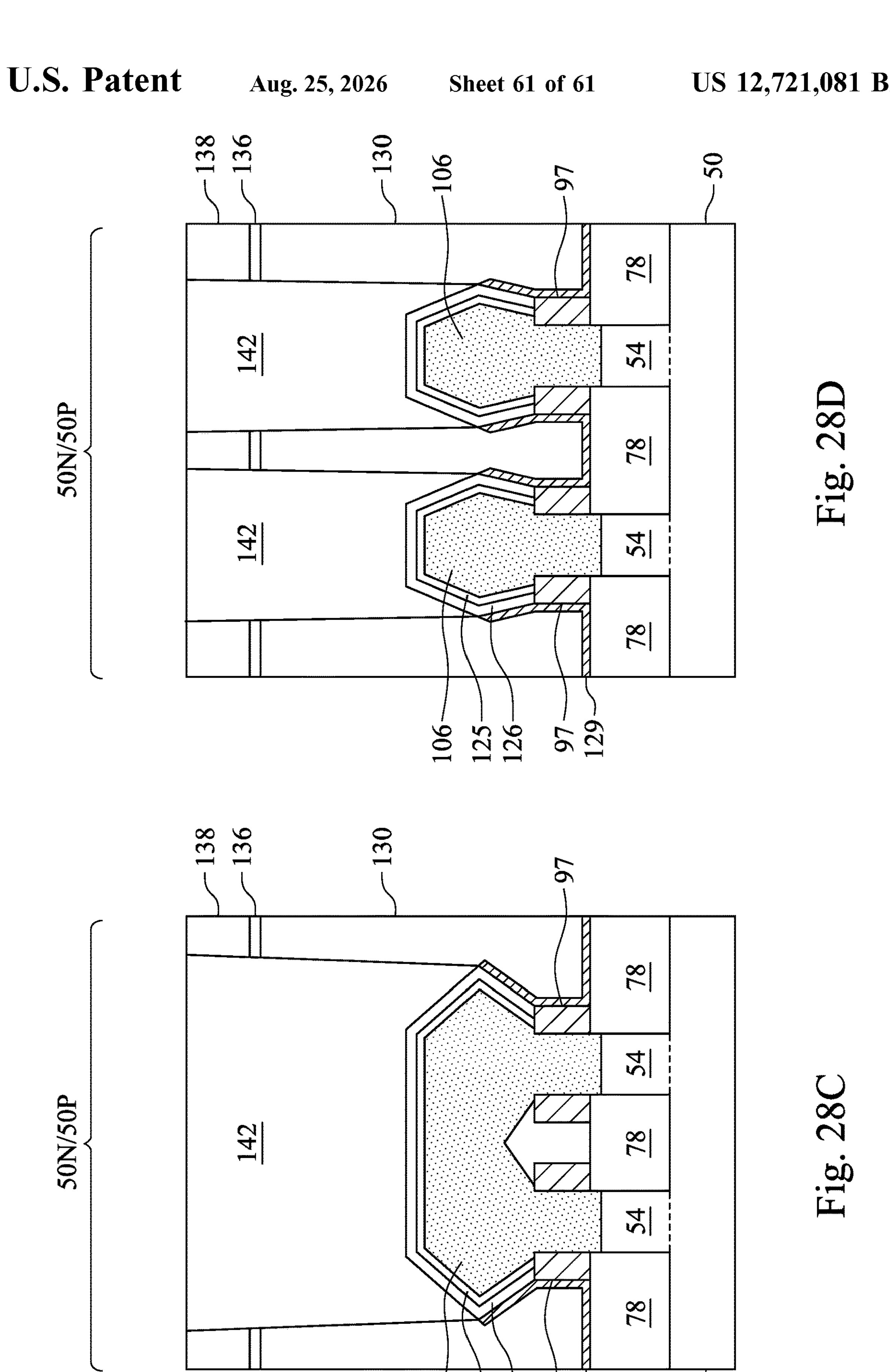

In the illustrated embodiment, patterning methods may be used so that some of the dielectric layer 130 remains in the cross-section of FIG. 28B. In another embodiment, the source/drain contact openings are formed in a self-aligned patterning method so that all of the dielectric layer 130 is removed in the cross-section of FIG. 28B. In an embodiment, the source/drain contact openings do not extend into the coating layer 126. In another embodiment, etching of the coating layer 126 may occur so that the source/drain contact openings extend partially into the coating layer 126.

Advantages are achieved by forming the source/drain contact openings such that the coating layer 126 is exposed, and subsequently forming the source/drain contacts 142 (described subsequently) in the source/drain contact openings. The metal-semiconductor alloy regions 125 and the coating layer 126 are disposed over a larger surface area (e.g., an increase in the effective surface area that is in a range from 20 percent to 30 percent larger) of the epitaxial source/drain regions 106, which then come into contact with the subsequently formed source/drain contacts 142. These advantages include allowing for a decreased contact resistance between the subsequently formed source/drain contacts 142 (described subsequently) and the epitaxial source/drain regions 106. As a result, there is more efficient current flow through the source/drain contacts 142, power dissipation at the source/drain contacts 142 is minimized, and the output resistance (RO) is improved, allowing the nano-FETs to drive or deliver power to a load without significant voltage or current loss.

Referring further to FIGS. 28A-28D, gate contact openings are also formed extending through the second ILD 138 and the ESL 136. The gate contact openings may be formed using acceptable photolithography and etching techniques, and may expose top surfaces of the gate electrodes 124.

After the formation of the source/drain contact openings and the gate openings, source/drain contacts 142 are formed in the source/drain contact openings, and gate contacts 140 are formed in the gate contact openings. A liner, such as a diffusion barrier layer, an adhesion layer, or the like, and a conductive material are formed in the source/drain contact openings and the gate contact openings. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, ruthenium, cobalt, copper, molybdenum, nickel, combinations thereof, or the like. The conductive material may be deposited by ALD, CVD, PVD, or the like. A planarization process, such as a CMP, may be performed to remove excess material from the top surface of the second ILD 138. The remaining liner and conductive material in the source/drain contact openings and the gate contact openings form the source/drain contacts 142 and the gate contacts 140, respectively. After formation is complete, the top surfaces of the second ILD 138, the source/drain contacts 142, and the gate contacts 140 are coplanar (within process variations). In other embodiments, the gate contact openings and the gate contacts 140 may be formed before, with, or after the source/drain contact openings and the source/drain contacts 142.

The embodiments of the present disclosure have some advantageous features. The embodiments include planarizing top surfaces of a gate stack and an adjacent inter-layer dielectric (ILD) layer, and removing the ILD to form first openings that expose top and side surfaces of underlying source/drain regions of a layer of nano-FETs. A plasma deposition process is then performed to form a titanium silicide (TiSi) layer and a titanium silicon nitride (TiSiN) layer sequentially over the exposed top and side surfaces of the source/drain regions. A wet etching process is then performed to selectively etch TiSiN and titanium nitride (TiN) formed during the plasma deposition process from surfaces of the gate stack and other structures, while leaving the TiSi layer and the TiSiN layer over the source/drain regions. The wet etching process is performed using sulfuric acid ($H_2SO_4$) as an etchant. One or more embodiments disclosed herein may allow for an increase in the effective area of the TiSi/TiSiN double layer on the source/drain regions which is in contact with subsequently formed source/drain contacts. This results in decreased contact resistance between the source/drain contacts and the source/drain regions. As a result, there is more efficient current flow through the source/drain contacts, power dissipation at the source/drain contacts is minimized, and the output resistance (RO) is improved, allowing semiconductor devices to drive or deliver power to a load without significant voltage or current loss. Further, the use of the wet etching process allows for the selective etching of the TiSiN and titanium nitride (TiN) formed during the plasma deposition process from surfaces of the gate stack and other structures (e.g., sidewalls of the first openings), while minimizing etch damage to the TiSi layer and the TiSiN layer over the source/drain regions. As a result, the source drain contacts can be subsequently formed with lower contact resistance, and having unhindered electrical contact with the source/drain regions, which further results in improved device performance and device yield.

In accordance with an embodiment, a method includes forming a multi-layer stack over a semiconductor substrate, the multi-layer stack including a plurality of sacrificial layers that alternate with a plurality of channel layers; forming a dummy gate stack over a top surface and sidewalls of the multi-layer stack; forming first spacers on sidewalls of the dummy gate stack; growing an epitaxial source/drain region that extends through the plurality of sacrificial layers and the plurality of channel layers, where the epitaxial source/drain region is adjacent to the dummy gate stack; forming a metal-semiconductor alloy region on first portions of the epitaxial source/drain region; forming a coating layer on the metal-semiconductor alloy region, where during the forming of the metal-semiconductor alloy region and the coating layer, a residual layer is formed on sidewalls of the first spacers; and performing a wet clean process to selectively etch the residual layer from the sidewalls of the first spacers while leaving the metal-semiconductor alloy region and the coating layer on the first portions of the epitaxial source/drain region. In an embodiment, the method further includes depositing a first inter layer dielectric (ILD) over the epitaxial source/drain region; and before forming the metal-semiconductor alloy region and the coating layer, removing the first ILD to form a first opening that exposes the first portions of the epitaxial source/drain region in the first opening. In an embodiment, the method further includes before removing the first ILD to form the first opening, removing the sacrificial layers and the dummy gate stack to form a first recess; forming a gate stack in the first recess; and performing a planarization process to level a top surface of the first ILD with a top surface of the gate stack. In an embodiment, during the forming of the metal-semiconductor alloy region and the coating layer, the residual layer is also formed on a top surface of the gate stack, and where during performing the wet clean process, the residual layer on the top surface of the gate stack is selectively etched. In an embodiment, the residual layer includes titanium silicon nitride (TiSiN) or titanium nitride (TiN). In an embodiment, performing the wet clean process includes exposing the residual layer to sulfuric acid ($H_2SO_4$). In an embodiment, during the wet clean process, a temperature of the sulfuric acid ($H_2SO_4$) is in a range from 130° C. to 230° C. In an embodiment, during the wet clean process, a concentration of the sulfuric acid ($H_2SO_4$) is in a range from 85 percent to 90 percent by weight. In an embodiment, the metal-semiconductor alloy region includes titanium silicide (TiSi), and the coating layer includes titanium silicon nitride (TiSiN).

In accordance with an embodiment, a method includes depositing a first sacrificial layer and a first channel layer sequentially over a semiconductor substrate; patterning the first sacrificial layer, the first channel layer, and the semiconductor substrate to form a fin structure that protrudes from the semiconductor substrate; forming isolation regions on opposite sides of the fin structure, where the fin structure protrudes above top surfaces of the isolation regions; forming a first source/drain region in the fin structure, the first source/drain region extending through the first sacrificial layer and the first channel layer; forming an insulating fin that extends into the fin structure and isolates a first portion of the fin structure from a second portion of the fin structure; forming a metal-semiconductor alloy region over the first source/drain region; forming a coating layer over the metal-semiconductor alloy region, where during forming the coating layer and the metal-semiconductor alloy region, a residual layer is formed on a top surface of the insulating fin, and top surfaces of the isolation regions; and performing a wet etching process to selectively etch the residual layer from the top surface of the insulating fin and the top surfaces of the isolation regions. In an embodiment, the method further includes forming a first portion of a gate stack adjacent to the first source/drain region, first spacers being disposed on sidewalls of the first portion of the gate stack, where the first portion of the gate stack is disposed above the first channel layer; and replacing the first sacrificial layer with a second portion of the gate stack, where during the forming of the metal-semiconductor alloy region and the coating layer, the residual layer is also formed on a top surface of the first portion of the gate stack, and sidewalls of the first spacers. In an embodiment, during the wet etching process, the residual layer on the top surface of the first portion of the gate stack, and the sidewalls of the first spacers is selectively etched, and where the wet etching process includes exposing the residual layer to an etchant that includes $H_2SO_4$. In an embodiment, the residual layer includes titanium silicon nitride (TiSiN) or titanium nitride (TiN). In an embodiment, forming the metal-semiconductor alloy region includes performing a deposition process to deposit a titanium layer over the first source/drain region; and during the deposition process, performing a first plasma treatment to expose the titanium layer to a nitrogen ($N_2$) or ammonia ($NH_3$) plasma. In an embodiment, a thickness of the metal-semiconductor alloy region is in a range from 2 nm to 4 nm, and a thickness of the coating layer is in a range from 1 nm to 4 nm.

In accordance with an embodiment, a semiconductor device includes a gate structure over a semiconductor substrate; source/drain regions over the semiconductor substrate and on opposing sides of the gate structure; a first channel layer disposed between the source/drain regions and over the semiconductor substrate; inner spacers between first end portions of the first channel layer and the semiconductor substrate, where the gate structure fills a space between the inner spacers; a metal-semiconductor alloy region over a top surface and sidewalls of each of the source/drain regions; and a coating layer over the metal-semiconductor alloy region, where a material of the metal-semiconductor alloy region and a material of the coating layer are different. In an embodiment, the metal-semiconductor alloy region includes titanium silicide (TiSi), and where the coating layer includes titanium silicon nitride (TiSiN). In an embodiment, a thickness of the metal-semiconductor alloy region is in a range from 2 nm to 4 nm. In an embodiment, a thickness of the coating layer is in a range from 1 nm to 4 nm. In an embodiment, the semiconductor device further includes source/drain contacts over and electrically connected to corresponding ones of the source/drain regions, where each source/drain contact extends partially into the coating layer that is disposed over a corresponding source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a multi-layer stack over a semiconductor substrate, the multi-layer stack comprising a plurality of sacrificial layers that alternate with a plurality of channel layers;

forming a dummy gate stack over a top surface and sidewalls of the multi-layer stack;

forming first spacers on sidewalls of the dummy gate stack;

growing an epitaxial source/drain region that extends through the plurality of sacrificial layers and the plurality of channel layers, wherein the epitaxial source/drain region is adjacent to the dummy gate stack;

forming a metal-semiconductor alloy region on first portions of the epitaxial source/drain region;

forming a coating layer on the metal-semiconductor alloy region, wherein during the forming of the metal-semiconductor alloy region and the coating layer, a residual layer is formed on sidewalls of the first spacers; and performing a wet clean process to selectively etch the residual layer from the sidewalls of the first spacers while leaving the metal-semiconductor alloy region and the coating layer on the first portions of the epitaxial source/drain region.

2. The method of claim 1, further comprising:

depositing a first inter layer dielectric (ILD) over the epitaxial source/drain region; and before forming the metal-semiconductor alloy region and the coating layer, removing the first ILD to form a first opening that exposes the first portions of the epitaxial source/drain region in the first opening.

3. The method of claim 2, further comprising:

before removing the first ILD to form the first opening, removing the sacrificial layers and the dummy gate stack to form a first recess;

forming a gate stack in the first recess; and performing a planarization process to level a top surface of the first ILD with a top surface of the gate stack.

4. The method of claim 3, wherein during the forming of the metal-semiconductor alloy region and the coating layer, the residual layer is also formed on a top surface of the gate stack, and wherein during performing the wet clean process, the residual layer on the top surface of the gate stack is selectively etched.

5. The method of claim 4, wherein the residual layer comprises titanium silicon nitride (TiSiN) or titanium nitride (TiN).

6. The method of claim 1, wherein performing the wet clean process comprises exposing the residual layer to sulfuric acid ($H_2SO_4$).

7. The method of claim 6, wherein during the wet clean process, a temperature of the sulfuric acid ($H_2SO_4$) is in a range from 130° C. to 230° C.

8. The method of claim 7, wherein during the wet clean process, a concentration of the sulfuric acid ($H_2SO_4$) is in a range from 85 percent to 90 percent by weight.

9. The method of claim 1, wherein the metal-semiconductor alloy region comprises titanium silicide (TiSi), and the coating layer comprises titanium silicon nitride (TiSiN).

10. A method comprising:

depositing a first sacrificial layer and a first channel layer sequentially over a semiconductor substrate;

patterning the first sacrificial layer, the first channel layer, and the semiconductor substrate to form a fin structure that protrudes from the semiconductor substrate;

forming isolation regions on opposite sides of the fin structure, wherein the fin structure protrudes above top surfaces of the isolation regions;

forming a first source/drain region in the fin structure, the first source/drain region extending through the first sacrificial layer and the first channel layer;

forming an insulating fin that extends into the fin structure and isolates a first portion of the fin structure from a second portion of the fin structure;

forming a metal-semiconductor alloy region over the first source/drain region;

forming a coating layer over the metal-semiconductor alloy region, wherein during forming the coating layer and the metal-semiconductor alloy region, a residual layer is formed on a top surface of the insulating fin, and top surfaces of the isolation regions; and performing a wet etching process to selectively etch the residual layer from the top surface of the insulating fin and the top surfaces of the isolation regions.

11. The method of claim 10, further comprising:

forming a first portion of a gate stack adjacent to the first source/drain region, first spacers being disposed on sidewalls of the first portion of the gate stack, wherein the first portion of the gate stack is disposed above the first channel layer; and replacing the first sacrificial layer with a second portion of the gate stack, wherein during the forming of the metal-semiconductor alloy region and the coating layer, the residual layer is also formed on a top surface of the first portion of the gate stack, and sidewalls of the first spacers.

12. The method of claim 11, wherein during the wet etching process, the residual layer on the top surface of the first portion of the gate stack, and the sidewalls of the first spacers is selectively etched, and wherein the wet etching process comprises exposing the residual layer to an etchant that comprises $H_2SO_4$.

13. The method of claim 12, wherein the residual layer comprises titanium silicon nitride (TiSiN) or titanium nitride (TiN).

14. The method of claim 10, wherein forming the metal-semiconductor alloy region comprises:

performing a deposition process to deposit a titanium layer over the first source/drain region; and during the deposition process, performing a first plasma treatment to expose the titanium layer to a nitrogen ($N_2$) or ammonia ($NH_3$) plasma.

15. The method of claim 10, wherein a thickness of the metal-semiconductor alloy region is in a range from 2 nm to 4 nm, and a thickness of the coating layer is in a range from 1 nm to 4 nm.

16. A method comprising:

forming a fin structure protruding from a semiconductor substrate, the fin structure comprising alternating semiconductor nanostructures and sacrificial nanostructures;

forming isolation regions on opposite sides of the fin structure, wherein the fin structure protrudes above top surfaces of the isolation regions;

forming a dummy gate stack over a top surface and sidewall of the fin structure;

forming a first source/drain region in the fin structure, the first source/drain region extending through the semiconductor nanostructures and the sacrificial nanostructures;

forming a first spacer adjacent to the dummy gate stack, wherein the first spacer is disposed over a top surface of the first source/drain region;

forming a metal-semiconductor alloy region over the first source/drain region; and forming a coating layer over the metal-semiconductor alloy region, wherein during forming the coating layer and the metal-semiconductor alloy region, a residual layer is formed on a sidewall of the first spacer, and the top surfaces of the isolation regions.

17. The method of claim 16, further comprising:

performing a wet clean process to selectively etch the residual layer from the sidewall of the first spacer while leaving the metal-semiconductor alloy region and the coating layer on the first source/drain region.

18. The method of claim 17, wherein the residual layer comprises titanium silicon nitride (TiSiN) or titanium nitride (TiN).

19. The method of claim 17, wherein performing the wet clean process comprises exposing the residual layer to sulfuric acid ($H_2SO_4$).

20. The method of claim 19, wherein during the wet clean process, a temperature of the sulfuric acid ($H_2SO_4$) is in a range from 130° C. to 230° C.

* * * * *